(12) United States Patent
Iwaki et al.

(10) Patent No.: US 9,224,968 B2
(45) Date of Patent: *Dec. 29, 2015

(54) LIGHT-EMITTING ELEMENT, LIGHT-EMITTING DEVICE, AND ELECTRONIC APPLIANCE

(75) Inventors: Yuji Iwaki, Isehara (JP); Junichiro Sakata, Atsugi (JP); Hisao Ikeda, Isehara (JP); Tomoya Aoyama, Atsugi (JP); Takaaki Nagata, Atsugi (JP); Takahiro Kawakami, Isehara (JP); Satoshi Seo, Kawasaki (JP); Ryoji Nomura, Yamato (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/552,899

(22) Filed: Jul. 19, 2012

(65) Prior Publication Data
US 2012/0286256 A1 Nov. 15, 2012

Related U.S. Application Data

(63) Continuation of application No. 11/989,324, filed as application No. PCT/JP2006/314710 on Jul. 19, 2006, now Pat. No. 8,227,982.

(30) Foreign Application Priority Data

Jul. 25, 2005 (JP) ................... 2005-213759
Aug. 9, 2005 (JP) ................... 2005-230272

(51) Int. Cl.
*H01L 51/50* (2006.01)
*H01L 51/00* (2006.01)

(52) U.S. Cl.
CPC ......... *H01L 51/5048* (2013.01); *H01L 51/0059* (2013.01); *H01L 51/0062* (2013.01); *H01L 51/0072* (2013.01); *H01L 51/0081* (2013.01)

(58) Field of Classification Search
CPC ............ H01L 51/0059; H01L 51/0062; H01L 51/0072; H01L 51/0081; H01L 51/5048

USPC .............. 313/504, 506; 252/301.16, 301.21, 252/301.26
See application file for complete search history.

(56) References Cited

U.S. PATENT DOCUMENTS

| 5,989,737 A | 11/1999 | Xie et al. |
| 6,013,384 A | 1/2000 | Kido et al. |

(Continued)

FOREIGN PATENT DOCUMENTS

| CN | 1362464 | 8/2002 |
| CN | 1583691 | 2/2005 |

(Continued)

OTHER PUBLICATIONS

Endo et al., *Organic Electroluminescent Devices with a Vacuum-Deposited Lewis-Acid-Doped Hole-Injecting Layer*, Japanese Journal of Applied Physics, vol. 41, Part 2, No. 3B, Mar. 15, 2002, pp. L358-L360.

(Continued)

*Primary Examiner* — Thomas A Hollweg
(74) *Attorney, Agent, or Firm* — Eric J. Robinson; Robinson Intellectual Property Law Office, P.C.

(57) ABSTRACT

An object of the present invention is to provide a light-emitting element with high luminous efficiency, and a light-emitting element of low-voltage driving. Another object is to provide a light-emitting device with low power consumption by using the light-emitting element. Another object is to provide an electronic appliance with low power consumption by using the light-emitting device in a display portion. A light-emitting element includes, between a pair of electrodes, a layer containing a composite material of a first organic compound and an inorganic compound and a layer containing a second organic compound being in contact with the layer containing the composite material, wherein the second organic compound does not have a peak of an absorption spectrum in a wavelength region of 450 to 800 nm if the second organic compound is compounded with the inorganic compound.

16 Claims, 24 Drawing Sheets

(56) References Cited

U.S. PATENT DOCUMENTS

| | | | |
|---|---|---|---|
| 6,361,886 B2 | 3/2002 | Shi et al. | |
| 6,423,429 B2 | 7/2002 | Kido et al. | |
| 6,465,115 B2 | 10/2002 | Shi et al. | |
| 6,486,601 B1 | 11/2002 | Sakai et al. | |
| 6,541,129 B1 | 4/2003 | Kawamura et al. | |
| 6,589,673 B1 | 7/2003 | Kido et al. | |
| 6,596,415 B2 | 7/2003 | Shi et al. | |
| 6,936,961 B2 | 8/2005 | Liao et al. | |
| 7,158,161 B2 | 1/2007 | Gyoutoku et al. | |
| 7,521,855 B2 | 4/2009 | Sakata et al. | |
| 7,646,010 B2 | 1/2010 | Kawakami et al. | |
| 7,732,808 B2 | 6/2010 | Ikeda et al. | |
| 7,772,596 B2 | 8/2010 | Nakamura et al. | |
| 7,777,232 B2 | 8/2010 | Hayakawa et al. | |
| 7,893,427 B2 | 2/2011 | Kumaki et al. | |
| 8,227,982 B2 | 7/2012 | Iwaki et al. | |
| 2001/0021478 A1 | 9/2001 | Shi et al. | |
| 2002/0180349 A1 | 12/2002 | Aziz et al. | |
| 2003/0127967 A1 | 7/2003 | Tsutsui et al. | |
| 2003/0143430 A1 | 7/2003 | Kawamura et al. | |
| 2003/0189401 A1 | 10/2003 | Kido et al. | |
| 2003/0218418 A9* | 11/2003 | Sato et al. | 313/504 |
| 2004/0227460 A1 | 11/2004 | Liao et al. | |
| 2004/0241493 A1 | 12/2004 | Inoue et al. | |
| 2004/0265253 A1 | 12/2004 | Seo et al. | |
| 2005/0074963 A1* | 4/2005 | Fujii et al. | 438/623 |
| 2005/0084712 A1* | 4/2005 | Kido et al. | 428/690 |
| 2005/0084713 A1 | 4/2005 | Kido et al. | |
| 2005/0095356 A1* | 5/2005 | Nakamura et al. | 427/58 |
| 2005/0098207 A1 | 5/2005 | Matsumoto et al. | |
| 2005/0106419 A1* | 5/2005 | Endoh et al. | 428/690 |
| 2005/0156197 A1 | 7/2005 | Tsutsui et al. | |
| 2005/0170208 A1 | 8/2005 | Yatsunami et al. | |
| 2005/0218396 A1 | 10/2005 | Tsuchiya et al. | |
| 2005/0264550 A1 | 12/2005 | Ohshima et al. | |
| 2006/0008740 A1 | 1/2006 | Kido et al. | |
| 2006/0082294 A1 | 4/2006 | Kawamura et al. | |
| 2006/0091797 A1 | 5/2006 | Tsutsui et al. | |
| 2006/0118166 A1 | 6/2006 | Iwaki | |
| 2006/0292394 A1 | 12/2006 | Iwaki et al. | |
| 2007/0007516 A1 | 1/2007 | Seo et al. | |
| 2007/0049778 A1 | 3/2007 | Nomura et al. | |
| 2007/0182317 A1 | 8/2007 | Kido et al. | |
| 2007/0200125 A1 | 8/2007 | Ikeda et al. | |
| 2009/0026922 A1 | 1/2009 | Iwaki et al. | |
| 2010/0096627 A1 | 4/2010 | Ikeda et al. | |
| 2010/0207518 A1 | 8/2010 | Ikeda et al. | |

FOREIGN PATENT DOCUMENTS

| | | |
|---|---|---|
| EP | 1009044 A | 6/2000 |
| EP | 1 029 909 | 8/2000 |
| EP | 1 318 553 A2 | 6/2003 |
| EP | 1 478 025 | 11/2004 |
| EP | 1 524 706 A | 4/2005 |
| EP | 1 530 245 A2 | 5/2005 |
| EP | 1531501 A | 5/2005 |
| EP | 1 617 493 A | 1/2006 |
| EP | 1 318 553 A3 | 3/2006 |
| EP | 1 530 245 A3 | 5/2006 |
| EP | 1 351 558 | 7/2006 |
| EP | 1 722 602 | 11/2006 |
| EP | 2270897 A | 1/2011 |
| JP | 02-288092 A | 11/1990 |
| JP | 03-274695 A | 12/1991 |
| JP | 09-063771 A | 3/1997 |
| JP | 10-092581 | 4/1998 |
| JP | 10-265773 | 10/1998 |
| JP | 11-307259 A | 11/1999 |
| JP | 11-307264 A | 11/1999 |
| JP | 2000-182776 A | 6/2000 |
| JP | 2000-191560 A | 7/2000 |
| JP | 2000-309566 | 11/2000 |
| JP | 2001-316338 | 11/2001 |
| JP | 2003-212799 A | 7/2003 |
| JP | 2003-238534 A | 8/2003 |
| JP | 2003-264085 | 9/2003 |
| JP | 2003-272860 | 9/2003 |
| JP | 2004-075580 A | 3/2004 |
| JP | 2004-091334 A | 3/2004 |
| JP | 2004-342614 | 12/2004 |
| JP | 2005-026121 A | 1/2005 |
| JP | 2005-123095 | 5/2005 |
| JP | 2005-166637 | 6/2005 |
| JP | 2005-166641 A | 6/2005 |
| JP | 2005-251587 A | 9/2005 |
| JP | 2005-251639 | 9/2005 |
| JP | 2005-330219 | 12/2005 |
| JP | 2006-024791 A | 1/2006 |
| JP | 2006-114477 A | 4/2006 |
| JP | 2006-114521 | 4/2006 |
| JP | 2007-073932 A | 3/2007 |
| JP | 2009-224804 A | 10/2009 |
| WO | WO 2005/031798 | 4/2005 |
| WO | WO-2007/013478 | 2/2007 |

OTHER PUBLICATIONS

International Search Report (Application No. PCT/JP2006/314710) dated Oct. 3, 2006.

Written Opinion (Application No. PCT/JP2006/314710) dated Oct. 3, 2006.

Tao et al., "Anthracene Derivative for a Non-Doped Blue-Emitting Organic Electroluminescence Device with Both Excellent Color Purity and High Efficiency," Chem. Phys. Lett. (Chemical Physics Letters), 2004, vol. 397, pp. 1-4.

Tokito et al., "Metal Oxides as a Hole-Injecting Layer for an Organic Electroluminescent Device," J. Phys. D: Appl. Phys. (Journal of Physics D: Applied Physics), 1996, vol. 29, pp. 2750-2753.

European Search Report (Application No. 06781622.3) dated Apr. 5, 2012.

Organic Charge Transport Materials,, Photographic Science and Photo Chemistry, Feb. 28, 1999, vol. 17, No. 1, pp. 73-84.

Changqi.M et al., "Progress in Hole-Transport Materials for Use in Organic Light-Emitting Diodes,", Progress in Chemistry, Nov. 1, 2003, vol. 15, No. 6, pp. 495-504.

Chinese Office Action (Application No. 201110064898.5) Dated Dec. 31, 2012.

European Office Action (Application No. 06781622.3) Dated Jan. 28, 2013.

Changqi.M et al., "Progress in Hole-Transport Materials for Use in Organic Light-Emitting Diodes", Progress in Chemistry, Nov. 1, 2003, vol. 15, No. 6, pp. 495-504.

* cited by examiner

LIGHT-EMITTING ELEMENT, LIGHT-EMITTING DEVICE, AND ELECTRONIC APPLIANCE

TECHNICAL FIELD

The present invention relates to a light-emitting element of a current excitation type. Moreover, the present invention relates to a light-emitting device and an electronic appliance which have the light-emitting elements.

BACKGROUND ART

In recent years, research and development have been extensively carried out on a light-emitting element which uses an organic compound having a light-emitting property. In a basic structure of such a light-emitting element, a layer which contains an organic compound having a light-emitting property is sandwiched between a pair of electrodes. By applying voltage to this element, electrons and holes are injected from the pair of electrodes respectively into the layer containing an organic compound having a light-emitting property; thus, current flows. Then, by recombination of those carries (electrons and holes), the organic compound having a light-emitting property forms an excited state and emits light when the excited state returns to a ground state. Because of such a mechanism, this light-emitting element is called a light-emitting element of a current excitation type.

The excited state of the organic compound includes a singlet-excited state and a triplet-excited state, and light emission from a singlet-excited state is called fluorescence and light emission from a triplet-excited state is called phosphorescence.

Such a light-emitting element can be manufactured generally by using an organic thin film with a thickness of about 0.1 µm; therefore, the light-emitting element has advantages of thinness and lightness in weight. Moreover, since it takes about 1 µs or shorter from carrier injection until light emission, very high-speed response is also one of its advantages. Because of these advantages, the light-emitting element is considered to be preferable as a flat-panel display element.

Since the light-emitting element is formed into a film shape, surface light emission can be easily obtained by forming a large-sized element. This is a feature which is difficult to be obtained in point light sources typified by an incandescent lamp and an LED or line light sources typified by a fluorescent lamp. Accordingly, the light-emitting element is also effectively used as a surface light source applicable to illumination and the like.

In display devices to be incorporated into various information processing appliances which have rapidly developed recently, there is a demand particularly for lower power consumption, and decrease in drive voltage for light-emitting elements has been attempted in order to fulfill this demand.

For example, according to Reference 1 (Japanese Patent Application Laid-Open No. 2005-123095), an effect of decreasing drive voltage is obtained by using a layer in which vanadium oxide and α-NPD are co-evaporated.

However, the layer in which vanadium oxide and α-NPD are co-evaporated has a peak of an absorption spectrum in 400 to 800 nm, which is a visible region. In particular, the layer has a high peak of absorption in about 150 to 500 nm, which is a blue region. Therefore, light emitted from a light-emitting substance is absorbed in the layer in which vanadium oxide and α-NPD are co-evaporated, which leads to a problem in that external extraction efficiency of light emission is lowered.

DISCLOSURE OF INVENTION

In view of the above problem, it is an object of the present invention to provide a light-emitting element having high luminous efficiency. Moreover, it is an object of the present invention to provide a light-emitting element with low drive voltage. In addition, it is an object of the present invention to provide a light-emitting device with low power consumption by manufacturing the light-emitting device using the light-emitting element. Furthermore, it is an object of the present invention to provide an electronic appliance with low power consumption by using the light-emitting device in a display portion.

As a result of concerted study, the present inventors have found that the objects can be achieved by applying a composite material of an organic compound and an inorganic compound.

A light-emitting element according to the present invention includes a layer containing a composite material of a first organic compound and an inorganic compound; and a layer containing a second organic compound, which is provided so as to be in contact with the layer containing the composite material, wherein the layer containing the composite material and the layer containing the second organic compound are provided between a pair of electrodes, and wherein the second organic compound does not have a peak of an absorption spectrum in a wavelength region of 450 to 800 nm if the second organic compound is compounded with an inorganic compound.

A light-emitting element according to the present invention includes a layer containing a composite material of a first organic compound and an inorganic compound; a layer containing a second organic compound, which is provided so as to be in contact with the layer containing the composite material; and a light-emitting layer containing a light-emitting substance, wherein the layer containing the composite material, the layer containing the second organic compound, and the light-emitting layer are provided between a first electrode and a second electrode, wherein the second organic compound does not have a peak of an absorption spectrum in a wavelength region of 450 to 800 nm if the second organic compound is compounded with the inorganic compound, and wherein the light-emitting substance emits light when voltage is applied so that the first electrode has a higher potential than the second electrode.

A light-emitting element according to the present invention includes a layer containing a composite material of a first organic compound and an inorganic compound; a layer containing a second organic compound, which is provided so as to be in contact with the layer containing the composite material; and a light-emitting layer containing a light-emitting substance, wherein the layer containing the composite material, the layer containing the second organic compound, and the light-emitting layer are provided between a first electrode and a second electrode, wherein the layer containing the composite material is provided so as to be in contact with the first electrode, wherein the second organic compound does not have a peak of an absorption spectrum in a wavelength region of 450 to 800 nm if the second organic compound is compounded with the inorganic compound, and wherein the light-emitting substance emits light when voltage is applied so that the first electrode has a higher potential than the second electrode.

A light-emitting element according to the present invention includes a multilayer body in which a layer containing a composite material of a first organic compound and an inorganic compound and a layer containing a second organic compound, which is provided so as to be in contact with the layer containing the composite material are stacked, wherein the multilayer body is provided between a pair of electrodes, and wherein the multilayer body does not have a peak of an absorption spectrum in a wavelength region of 450 to 800 nm.

A light-emitting element according to the present invention includes a multilayer body in which a layer containing a composite material of a first organic compound and an inorganic compound and a layer containing a second organic compound, which is provided so as to be in contact with the layer containing the composite material are stacked, wherein the multilayer body is provided between a pair of electrodes, wherein the composite material has a transmittance of 80% or higher in a wavelength region of 450 to 800 nm when the composite material has a thickness of 100 nm, and wherein a composite material of the second organic compound and the inorganic compound has a transmittance of 80% or higher in a wavelength region of 450 to 800 nm when the composite material of the second organic compound and the inorganic compound has a thickness of 100 nm.

A light-emitting element according to the present invention includes a multilayer body in which a layer containing a composite material of a first organic compound and an inorganic compound and a layer containing a second organic compound, which is provided so as to be in contact with the layer containing the composite material are stacked, wherein the multilayer body is provided between a pair of electrodes, wherein the composite material has an absorbance that satisfies the formula (1) in a wavelength region of 450 to 800 nm, and wherein a composite material of the second organic compound and the inorganic compound has an absorbance that satisfies the formula (1) in a wavelength region of 450 to 800 nm.

$$A \leq 9.7 \times 10^{-4} \times l \quad (1)$$

A: absorbance
l: thickness (nm)

A light-emitting element according to the present invention includes a layer containing a composite material of a first organic compound and an inorganic compound; a layer containing a second organic compound, which is provided so as to be in contact with the layer containing the composite material; and a light-emitting layer containing a light-emitting substance, wherein the layer containing the composite material, the layer containing the second organic compound, and the light-emitting layer are provided between a first electrode and a second electrode, wherein a multilayer body in which the layer containing the composite material and the layer containing the second organic compound are stacked does not have a peak of an absorption spectrum in a wavelength region of 450 to 800 nm, and wherein the light-emitting substance emits light when voltage is applied so that the first electrode has a higher potential than the second electrode.

A light-emitting element according to the present invention includes a layer containing a composite material of a first organic compound and an inorganic compound; a layer containing a second organic compound, which is provided so as to be in contact with the layer containing the composite material; and a light-emitting layer containing a light-emitting substance; wherein the layer containing the composite material, the layer containing the second organic compound, and the light-emitting layer are provided between a first electrode and a second electrode, wherein the composite material has a transmittance of 80% or higher in a wavelength region of 450 to 800 nm when the composite material has a thickness of 100 nm, wherein a composite material of the second organic compound and the inorganic compound has a transmittance of 80% or higher in a wavelength region of 450 to 800 nm when the composite material of the second organic compound and the inorganic compound has a thickness of 100 nm, and wherein the light-emitting substance emits light when voltage is applied so that the first electrode has a higher potential than the second electrode.

A light-emitting element according to the present invention includes a layer containing a composite material of a first organic compound and an inorganic compound; a layer containing a second organic compound, which is provided so as to be in contact with the layer containing the composite material; and a light-emitting layer containing a light-emitting substance; wherein the layer containing the composite material, the layer containing the second organic compound, and the light-emitting layer are provided between a first electrode and a second electrode, wherein the layer containing the composite material is provided so as to be in contact with the first electrode, wherein a multilayer body in which the layer containing the composite material and the layer containing the second organic compound are stacked does not have a peak of an absorption spectrum in a wavelength region of 450 to 800 nm, and wherein the light-emitting substance emits light when voltage is applied so that the first electrode has a higher potential than the second electrode.

A light-emitting element according to the present invention includes a layer containing a composite material of a first organic compound and an inorganic compound; a layer containing a second organic compound, which is provided so as to be in contact with the layer containing the composite material; and a light-emitting layer containing a light-emitting substance; wherein the layer containing the composite material, the layer containing the second organic compound, and the light-emitting layer are provided between a first electrode and a second electrode, wherein the layer containing the composite material is provided so as to be in contact with the first electrode, wherein the composite material has a transmittance of 80% or higher in a wavelength region of 450 to 800 nm when the composite material has a thickness of 100 nm, wherein a composite material of the second organic compound and the inorganic compound has a transmittance of 80% or higher in a wavelength region of 450 to 800 nm when the composite material of the second organic compound and the inorganic compound has a thickness of 100 nm, and wherein the light-emitting substance emits light when voltage is applied so that the first electrode has a higher potential than the second electrode.

A light-emitting element according to the present invention includes a layer containing a composite material of a first organic compound and an inorganic compound; a layer containing a second organic compound, which is provided so as to be in contact with the layer containing the composite material; and a light-emitting layer containing a light-emitting substance, wherein the layer containing the composite material, the layer containing the second organic compound, and the light-emitting layer are provided between a first electrode and a second electrode, wherein the layer containing the composite material is provided so as to be in contact with the first electrode, wherein the composite material has an absorbance that satisfies the formula (1) in a wavelength region of 450 to 800 nm, wherein a composite material of the second organic compound and the inorganic compound has an absorbance that satisfies the formula (1) in a wavelength region of 450 to 800 nm, and wherein the light-emitting substance emits light when voltage is applied so that the first electrode has a higher potential than the second electrode.

$$A \leq 9.7 \times 10^{-4} \times l \quad (1)$$

A: absorbance
l: thickness (nm)

In the above structure, the first organic compound is preferably aromatic hydrocarbon. In particular, the first organic compound is preferably an anthracene derivative.

A light-emitting element according to the present invention includes a multilayer body in which a layer containing a composite material of a first organic compound and an inorganic compound and a layer containing a second organic compound, which is provided so as to be in contact with the layer containing the composite material are stacked, wherein the multilayer body is provided between a pair of electrodes, and wherein the first organic compound is aromatic hydrocarbon.

A light-emitting element according to the present invention includes a multilayer body in which a layer containing a composite material of a first organic compound and an inorganic compound and a layer containing a second organic compound, which is provided so as to be in contact with the layer containing the composite material are stacked, wherein the multilayer body is provided between a pair of electrodes, and wherein the first organic compound is an anthracene derivative.

In the above structure, the second organic compound preferably has a higher ionization potential than the first organic compound by 0.5 eV or lower, more preferably 0.3 eV or lower, and much more preferably 0.1 eV or lower. In other words, the following formula is preferably satisfied where Ip (1) is the ionization potential of the first organic compound and Ip (2) is the ionization potential of the second organic compound.

$$Ip(2) \leq Ip(1) + 0.5 \text{ eV}$$

It is more preferable that the following formula be satisfied.

$$Ip(2) \leq Ip(1) + 0.3 \text{ eV}$$

It is much more preferable that the following formula be satisfied.

$$Ip(2) \leq Ip(1) + 0.1 \text{ eV}$$

In the above structure, the second organic compound is preferably aromatic hydrocarbon or a carbazole derivative. In particular, the second organic compound is preferably an anthracene derivative.

In the above structure, the layer containing the second organic compound preferably has a thickness of 1 to 20 nm.

In the above structure, the inorganic compound preferably has an electron-accepting property with respect to the first organic compound.

Moreover, the inorganic compound is preferably an oxide of a transition metal. In particular, the inorganic compound is preferably an oxide of a metal belonging to any of Group 4 to Group 8 in the periodic table. It is more preferable that the inorganic compound be any of vanadium oxide, niobium oxide, tantalum oxide, chromium oxide, molybdenum oxide, tungsten oxide, manganese oxide, and rhenium oxide.

A light-emitting element according to the present invention includes a layer containing a composite material of an organic compound and an inorganic compound; and a layer containing the organic compound, which is provided so as to be in contact with the layer containing the composite material, wherein the layer containing the composite material and the layer containing the organic compound are provided between a pair of electrodes, and wherein the composite material does not have a peak of an absorption spectrum in a wavelength region of 450 to 800 nm.

A light-emitting element according to the present invention includes a layer containing a composite material of an organic compound and an inorganic compound; and a layer containing the organic compound, which is provided so as to be in contact with the layer containing the composite material, wherein the layer containing the composite material and the layer containing the organic compound are provided between a pair of electrodes, and wherein the composite material has a transmittance of 80% or higher in a wavelength region of 450 to 800 nm when the composite material has a thickness of 100 nm.

A light-emitting element according to the present invention includes a layer containing a composite material of an organic compound and an inorganic compound; and a layer containing the organic compound, which is provided so as to be in contact with the layer containing the composite material, wherein the layer containing the composite material and the layer containing the organic compound are provided between a pair of electrodes, and wherein the composite material has an absorbance that satisfies the formula (1) in a wavelength region of 450 to 800 nm.

$$A \leq 9.7 \times 10^{-4} \times l \quad (1)$$

A: absorbance
l: thickness (nm)

A light-emitting element according to the present invention includes a layer containing a composite material of an organic compound and an inorganic compound; a layer containing the organic compound, which is provided so as to be in contact with the layer containing the composite material; and a light-emitting layer containing a light-emitting substance; wherein the layer containing the composite material, the layer containing the organic compound, and the light-emitting layer are provided between a first electrode and a second electrode, wherein the composite material does not have a peak of an absorption spectrum in a wavelength region of 450 to 800 nm, and wherein the light-emitting substance emits light when voltage is applied so that the first electrode has a higher potential than the second electrode.

A light-emitting element according to the present invention includes a layer containing a composite material of an organic compound and an inorganic compound; a layer containing the organic compound, which is provided so as to be in contact with the layer containing the composite material; and a light-emitting layer containing a light-emitting substance; wherein the layer containing the composite material, the layer containing the organic compound, and the light-emitting layer are provided between a first electrode and a second electrode, wherein the composite material has a transmittance of 80% or higher in a wavelength region of 450 to 800 nm when the composite material has a thickness of 100 nm, and wherein the light-emitting substance emits light when voltage is applied so that the first electrode has a higher potential than the second electrode.

A light-emitting element according to the present invention includes a layer containing a composite material of an organic compound and an inorganic compound; a layer containing the organic compound, which is provided so as to be in contact with the layer containing the composite material; and a light-emitting layer containing a light-emitting substance; wherein the layer containing the composite material, the layer containing the organic compound, and the light-emitting layer are provided between a first electrode and a second electrode, wherein the composite material does not have a peak of an absorption spectrum in a wavelength region of 450 to 800 nm, and wherein the light-emitting substance emits light when voltage is applied so that the first electrode has a higher potential than the second electrode.

A light-emitting element according to the present invention includes a layer containing a composite material of an organic compound and an inorganic compound; a layer containing the organic compound, which is provided so as to be in contact with the layer containing the composite material; and a light-emitting layer containing a light-emitting substance, wherein the layer containing the composite material, the layer containing the organic compound, and the light-emitting layer are provided between a first electrode and a second electrode, wherein the layer containing the composite material is provided so as to be in contact with the first electrode, wherein the composite material has a transmittance of 80% or higher in a wavelength region of 450 to 800 nm when the composite material has a thickness of 100 nm, and wherein the light-emitting substance emits light when voltage is applied so that the first electrode has a higher potential than the second electrode.

A light-emitting element according to the present invention includes a layer containing a composite material of an organic compound and an inorganic compound; a layer containing the organic compound, which is provided so as to be in contact with the layer containing the composite material; and a light-emitting layer containing a light-emitting substance, wherein the layer containing the composite material, the layer containing the organic compound, and the light-emitting layer are provided between a first electrode and a second electrode, wherein the layer containing the composite material is provided so as to be in contact with the first electrode, wherein the composite material has an absorbance that satisfies the formula (1) in a wavelength region of 450 to 800 nm, and wherein the light-emitting substance emits light when voltage is applied so that the first electrode has a higher potential than the second electrode.

$$A \leq 9.7 \times 10^{-4} \times l \quad (1)$$

A: absorbance l: thickness (nm)

In the above structure, the organic compound is preferably aromatic hydrocarbon. In particular, the organic compound is preferably an anthracene derivative.

A light-emitting element according to the present invention includes a layer containing a composite material of an organic compound and an inorganic compound; and a layer containing the organic compound, which is provided so as to be in contact with the layer containing the composite material, wherein the layer containing the composite material and the layer containing the organic compound are provided between a pair of electrodes, and wherein the organic compound is aromatic hydrocarbon.

A light-emitting element according to the present invention includes a layer containing a composite material of an organic compound and an inorganic compound; and a layer containing the organic compound, which is provided so as to be in contact with the layer containing the composite material, wherein the layer containing the composite material and the layer containing the organic compound are provided between a pair of electrodes, and wherein the organic compound is an anthracene derivative.

In the above structure, the layer containing the organic compound preferably has a thickness of 1 to 20 nm.

In the above structure, the inorganic compound preferably has an electron-accepting property with respect to the first organic compound.

Moreover, the inorganic compound is preferably an oxide of a transition metal. In particular, the inorganic compound is preferably an oxide of a metal belonging to any of Group 4 to Group 8 in the periodic table. It is more preferable that the inorganic compound be any of vanadium oxide, niobium oxide, tantalum oxide, chromium oxide, molybdenum oxide, tungsten oxide, manganese oxide, and rhenium oxide.

It is to be noted that the present invention includes in its category a light-emitting device having any of the aforementioned light-emitting elements. The light-emitting device in this specification includes an image display device, a light-emitting device, and a light source (including an illumination device). Further, the light-emitting device includes a module in which a connector such as an FPC (Flexible Printed Circuit), a TAB (Tape Automated Bonding) tape, or a TCP (Tape Carrier Package) is attached to a panel where the light-emitting element is formed, a module in which a print wiring board is provided at an end of a TAB tape or an TCP, and a module in which an IC (Integrated. Circuit) is directly mounted on the light-emitting element by a COG (Chip On Glass) method.

An electronic appliance using the light-emitting element of the present invention in its display portion is also included in the category of the present invention. Therefore, the electronic appliance of the present invention is equipped with the aforementioned light-emitting element and a controller for controlling light emission of the light-emitting element in its display portion.

By applying the present invention, a light-emitting element having high luminous efficiency can be obtained.

Moreover, by applying the present invention, a light-emitting element driven at low voltage can be obtained.

By applying the present invention, a light-emitting device with low power consumption can be obtained.

By applying the present invention, an electronic appliance with low power consumption can be obtained.

BEST MODE FOR CARRYING OUT THE INVENTION

Figure 1A:
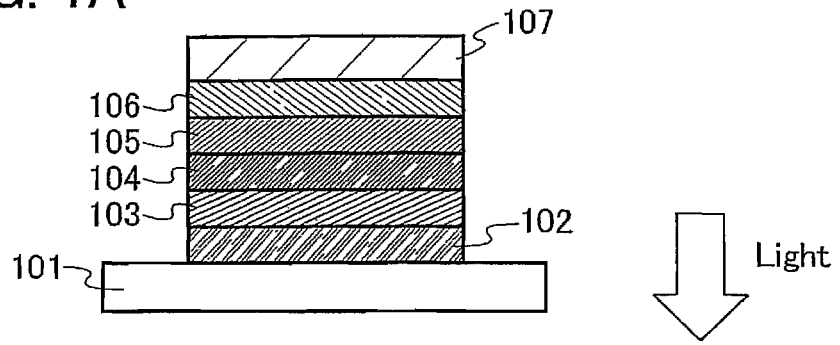
FIGS. 1A to 1C describe light-emitting elements of the present invention.

Embodiment modes and embodiments of the present invention will be hereinafter described with reference to the accompanying drawings. However, the present invention is not restricted to the following description and it is easily understood by those skilled in the art that the mode and detail can be variously changed without departing from the scope and spirit of the present invention. Therefore, the present invention is not construed as being restricted to the description of the embodiment modes and embodiments hereinafter shown.

Embodiment Mode 1

This embodiment mode will describe a composite material which is used for a light-emitting element of the present invention. In this specification, being composite means not only a simple mixture of two materials but also a change into such a state that charges are transported between two materials through a mixture of the materials at a molecular level.

The composite material used in the present invention is a composite material of a first organic compound and an inorganic compound. As the first organic compound for the composite material, various compounds such as an aromatic amine compound, a carbazole derivative, aromatic hydrocarbon, and a high-molecular compound (such as oligomer, dendrimer, or polymer) can be used. The first organic compound used for the composite material is preferably an organic compound having a high hole-transporting property. Specifically, a substance having a hole mobility of $10^{-6}$ cm$^2$/Vs or higher is preferably used. However, other substances than those may also be used as long as the substances have higher hole-transporting properties than electron-transporting properties. The first organic compound which can be used for the composite material is specifically shown below.

For example, the followings can be given as the aromatic amine compound: N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As the carbazole derivative which can be used for the composite material, the followings can be given specifically: 3-[N-(9-phenylcarbazole-3-yl)-N-phenylamino]-9-phenylcarbazole (abbreviation: PCzPCA1); 3,6-bis[N-(9-phenylcarbazole-3-yl)-N-phenylamino]-9-phenylcarbazole (abbreviation: PCzPCA2); 3-[N-(1-naphtyl)-N-(9-phenylcarbazole-3-yl)amino]-9-phenylcarbazole (abbreviation: PCzPCN1); and the like.

Moreover, 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 2,3,5,6-triphenyl-1,4-bis[4-(N-carbazolyl)phenyl]benzene; or the like can also be used.

As the aromatic hydrocarbon which can be used for the composite material, the followings can be given for example: an anthracene derivative such as 9,10-di(naphthalene-2-yl)-2-tert-butylanthracene (abbreviation: t-BuDNA); 9,10-di(naphthalene-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di(naphthalene-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalene-1-yl)anthracene (abbreviation: DMNA); 2-tert-butyl-9,10-bis[2-(naphthalene-1-yl)phenyl]anthracene; 9,10-bis[2-(naphthalene-1-yl)phenyl]anthracene; 2,3,6,7-tetramethyl-9,10-di(naphthalene-1-yl)anthracene; 2,3,6,7-tetramethyl-9,10-di(naphthalene-2-yl)anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene, and the like; tetracene; rubrene; perylene; 2,5,8,11-tetra(tert-butyl)perylene; and the like. Beside those, pentacene, coronene, or the like can also be used. In this way, the aromatic hydrocarbon which has a hole mobility of $1\times10^{-6}$ cm$^2$/Vs or higher and which has 14 to 42 carbon atoms is particularly preferable.

The aromatic hydrocarbon which can be used for the composite material may have a vinyl skeleton. As the aromatic hydrocarbon having a vinyl group, the followings are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbreviation: PVK) or poly(4-vinyltriphenylamine) (abbreviation: PVTPA) can also be used.

As the inorganic compound used for the composite material, an oxide of a transition metal is preferable. Moreover, an oxide of a metal belonging to any of Group 4 to Group 8 in the periodic table is preferable. Specifically, vanadium oxide, niobium oxide, tantalum oxide, chromium oxide, molybdenum oxide, tungsten oxide, manganese oxide, and rhenium oxide are preferable because of their high electron-accepting properties. Above all, molybdenum oxide is particularly preferable because it is stable in the air, easily treated, and has a low moisture-absorption property.

A method for manufacturing a layer containing the composite material may be either a wet method or a dry method, and any method may be used. For example, the layer containing the composite material can be manufactured by co-evaporating the aforementioned organic compound and inorganic compound. Moreover, the layer containing the composite material can also be obtained in such a way that a solution containing the aforementioned organic compound and a metal alkoxide is applied and baked. Since molybdenum oxide is easily evaporated in vacuum, molybdenum oxide is also preferable from the aspect of a manufacturing process.

The composite material used in the present invention does not have an absorption peak in a wavelength region of 450 to 800 nm. Moreover, the composite material has a transmittance of 80% or higher in a wavelength region of 450 to 800 nm when the film thickness is 100 nm. Therefore, light emission from a light-emitting region can be effectively extracted to the outside.

Embodiment Mode 2

This embodiment mode will describe a layer containing a second organic compound, which is provided so as to be in contact with the composite material of the first organic compound and the inorganic compound shown in Embodiment Mode 1.

The second organic compound in the layer containing the second organic compound, which is provided so as to be in contact with the layer containing the composite material, does not have an absorption peak in a wavelength region of 450 to 800 nm, in the case where the second organic compound is compounded with the inorganic compound in the composite material. A composite material containing the second organic compound and the inorganic compound with the same mixture ratio as the first organic compound and the inorganic compound of the layer containing the composite material has a transmittance of 80% or higher in a wavelength region of 450 to 800 nm when the film thickness is 100 nm.

As the second organic compound, various compounds such as an aromatic amine compound, a carbazole derivative, aromatic hydrocarbon, and a high molecular compound (such as oligomer, dendrimer, or polymer) can be used. As the second organic compound, an organic compound having a high hole-transporting property is preferable. Specifically, a substance having a hole mobility of $10^{-6}$ cm$^2$/Vs or higher is preferable. However, other substances than those may also be used as long as the substances have higher hole-transporting properties than electron-transporting properties. The second organic compound is hereinafter shown specifically.

For example, the followings can be given as the aromatic amine compound: N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As the carbazole derivative, the followings can be given specifically: 3-[N-(9-phenylcarbazole-3-yl)-N-phenylamino]-9-phenylcarbazole (abbreviation: PCzPCA1); 3,6-bis[N-(9-phenylcarbazole-3-yl)-N-phenylamino]-9-phenylcarbazole (abbreviation: PCzPCA2); 3-[N-(1-naphtyl)-N-(9-phenylcarbazole-3-yl)amino]-9-phenylcarbazole (abbreviation: PCzPCN1); and the like.

Moreover, 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 2,3,5,6-triphenyl-1,4-bis[4-(N-carbazolyl)phenyl]benzene; or the like can also be used.

The layer containing the second organic compound does not have a peak of an absorption spectrum in a wavelength region of 450 to 800 nm, if the second organic compound is compounded with the inorganic compound contained in the composite material. Moreover, if the second organic compound is compounded with the inorganic compound with the same mixture ratio as the first organic compound and the inorganic compound in the layer containing the composite material, the transmittance is 80% or higher in a wavelength region of 450 to 800 nm when the film thickness is 100 nm. Therefore, even if a composite material that is made from the second material and the inorganic compound exists at an interface between the layer containing the composite material and the layer containing the second organic compound, light emitted from the light-emitting substance is not absorbed by the composite material. Thus, external extraction efficiency can be improved. In other words, a light-emitting element having high luminous efficiency can be obtained.

The aromatic hydrocarbon may have a vinyl skeleton. As the aromatic hydrocarbon having a vinyl group, the followings are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbreviation: PVK) or poly(4-vinyltriphenylamine) (abbreviation: PVTPA) can also be used.

The layer containing the second organic compound does not have a peak of an absorption spectrum in a wavelength region of 450 to 800 nm, if the second organic compound is compounded with the inorganic compound contained in the composite material. Moreover, if the second organic compound is compounded with the inorganic compound with the same mixture ratio as the first organic compound and the inorganic compound in the layer containing the composite material, the transmittance is 80% or higher in a wavelength region of 450 to 800 nm when the film thickness is 100 nm. Therefore, even if the second organic compound and the inorganic compound in the layer containing the composite material exist as a composite material when the layer containing the composite material and the layer containing the second organic compound are in contact with each other and the inorganic compound in the layer containing the composite material and the second organic compound are in contact with each other at an interface between the layer containing the composite material and the layer containing the second organic compound, light emitted from the light-emitting substance is not absorbed and is transmitted through the composite material efficiently. Thus, external extraction efficiency can be improved. In other words, a light-emitting element having high luminous efficiency can be obtained.

Embodiment Mode 3

A light-emitting element of the present invention has a plurality of layers between a pair of electrodes. The plurality of layers are stacked by combining layers which contain a substance having a high carrier-injecting property and a substance having a high carrier-transporting property so that a light-emitting region is formed apart from the electrodes, i.e., so that carries are recombined at a portion away from the electrodes.

A mode of a light-emitting element of the present invention will be hereinafter described with reference to FIG. 1A.

In this embodiment mode, the light-emitting element includes a first electrode 102; a first layer 103, a second layer 104, a third layer 105, and a fourth layer 106 which are stacked sequentially over the first electrode 102; and a second electrode 107 provided over the fourth layer 106. In this embodiment mode, the first electrode 102 functions as an anode and the second electrode 107 functions as a cathode.

The substrate 101 is used to support the light-emitting element. The substrate 101 may be made of, for example, glass, plastic, or the like. Other materials than those may also be used as long as the light-emitting element can be supported during a manufacturing process.

As the first electrode 102, various metals, alloys, conductive compounds, or mixture thereof can be used. For example, indium tin oxide (ITO), indium tin oxide containing silicon, or indium zinc oxide (IZO) in which zinc oxide (ZnO) is mixed by 2 to 20 wt % into indium oxide can be used. In addition, gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), a nitride of a metal material (such as TiN), or the like can be used. If the first electrode is used as an anode, it is preferable to use, among those materials, a material having a high work function (work function of 4.0 eV or higher), or the like.

In a light-emitting element of the present invention, the first electrode 102 can be formed by using not only a material having a high work function but also a material having a low work function.

The first layer 103 contains the composite material shown in Embodiment Mode 1. That is, the first layer 103 contains, the composite material of the first organic compound and the inorganic compound.

The composite material in the first layer 103 does not have a peak of an absorption spectrum in a wavelength region of 450 to 800 nm. Moreover, the composite material in the first layer 103 has a transmittance of 80% or higher over the entire wavelength region of 450 to 800 nm when the first layer has a film thickness of 100 nm. Therefore, light emitted from the light-emitting substance can be transmitted efficiently to improve external extraction efficiency. That is, a light-emitting element with high luminous efficiency can be obtained.

A method for manufacturing the layer containing the composite material may be either a wet method or a dry method, and any method may be used. For example, the layer containing the composite material can be manufactured by co-evaporating the aforementioned organic compound and inorganic compound. Moreover, the layer containing the composite material can also be obtained in such a way that a solution containing the aforementioned organic compound and metal alkoxide is applied and baked. Since molybdenum oxide is easily evaporated in vacuum, molybdenum oxide is also preferable from the aspect of a manufacturing process.

The second layer 104 contains the second organic compound shown in Embodiment Mode 2. In other words, the second layer 104 contains the second organic compound which does not have a peak of an absorption spectrum in a wavelength region of 450 to 800 nm if the second organic compound is compounded with the inorganic compound in the composite material contained in the first layer 103.

The second organic compound preferably has a higher ionization potential than the first organic compound in the first layer 103 by 0.5 eV or lower, more preferably 0.3 eV or lower, and much more preferably 0.1 eV or lower. In other words, the following formula is preferably satisfied where Ip (1) is the ionization potential of the first organic compound and Ip (2) is the ionization potential of the second organic compound.

$Ip(2) \leq Ip(1)+0.5$ eV

It is more preferable that the following formula be satisfied.

$Ip(2) \leq Ip(1)+3$ eV

It is much more preferable that the following formula be satisfied.

$Ip(2) \leq Ip(1)+0.1$ eV

When the ionization potentials of the second organic compound and the first organic compound satisfy the above formulas, a carrier injection bather between the first layer 103 and the second layer 104 is lowered; thus, drive voltage can be decreased. Therefore, if an organic compound having a high ionization potential such as aromatic hydrocarbon is used for the first organic compound in the first layer 103, the range of the ionization potential of the second organic compound which can be used for the second layer 104 can be widened, allowing the selection range of the second organic compound to be wider. For example, aromatic hydrocarbon can be used for the first organic compound in the first layer 103 and the second organic compound in the second layer 104. In this way, a light-emitting element not including an amine compound can also be manufactured.

Measured values of specific ionization potentials of compounds that can be used as the first organic compound or the second organic compound are shown in Table 1.

TABLE 1

| Compound | Value of ionization potential (eV) |
| --- | --- |
| 9,10-bis(3,5-diphenylphenyl)anthracene (abbreviation: DPPA) | 5.83 |
| 9,10-di(naphthalene-2-yl)anthracene (abbreviation: DNA) | 5.81 |
| 9,10-di(naphthalene-2-yl)-2-tert-butylanthracene (abbreviation: t-BuDNA) | 5.55 |
| 9,10-di(naphthalene-1-yl)-2-tert-butylanthracene | 5.78 |
| 9,10-diphenylanthracene (abbreviation: DPAnth) | 5.74 |
| 9,10-bis[2-(naphthalene-1-yl)phenyl]anthracene | 5.67 |
| 2,3,6,7-tetramethyl-9,10-di(naphthalene-1-yl)anthracene | 5.70 |

TABLE 1-continued

| Compound | Value of ionization potential (eV) |
| --- | --- |
| 2,3,6,7-tetramethyl-9,10-di(naphthalene-2-yl)anthracene | 5.54 |
| 10,10'-di(2-phenylphenyl)-9,9'-bianthryl | 5.81 |

In this specification, the ionizing potential is measured by photoelectron spectroscopy in the air. For example, AC-2 manufactured by RIKEN KEIKI Co., Ltd. is used as a device for such measurement. An object to be measured was a thin film formed over a glass substrate by an evaporation method.

When aromatic hydrocarbon is used for the first organic compound in the first layer 103 and the second organic compound in the second layer 104, a light-emitting element having high heat resistance can be manufactured. In general, when a bond of carbon and a hetero atom such as oxygen, nitrogen, or sulfur exists in a molecule, flexibility of a molecular skeleton thereof improves; therefore a thermophysical property such as glass transition temperature or a melting point is degraded. Accordingly, in a similar molecular structure, aromatic hydrocarbon has a higher thermophysical property than an aromatic amine compound. Thus, a light-emitting element having high heat resistance can be obtained by using aromatic hydrocarbon, as compared with the case of using an aromatic amine compound having a similar molecular structure.

In order that an amine compound may have high glass transition temperature and a high melting point, it is necessary to increase the molecular weight. Therefore, a starburst amine compound and a linear oligoamine compound have been synthesized so far; however, such compounds need a number of steps for being synthesized and it takes long time and costs much to obtain a target material. Therefore, by using aromatic hydrocarbon, cost required for obtaining a light-emitting element having similar heat resistance can be reduced.

It is preferable that the organic compounds in the first layer 103 and the second layer 104 be formed with the same substance, i.e., the first organic compound and the second organic compound be formed with the same substance, because a carrier injection barrier between the first layer 103 and the second layer 104 becomes low. If the first layer 103 and the second layer 104 are formed by an evaporation method, they can be formed continuously; therefore, a manufacturing process can be simplified and the productivity can be improved.

The film thickness of the second layer 104 preferably ranges from 1 to 20 nm.

Figure 3:
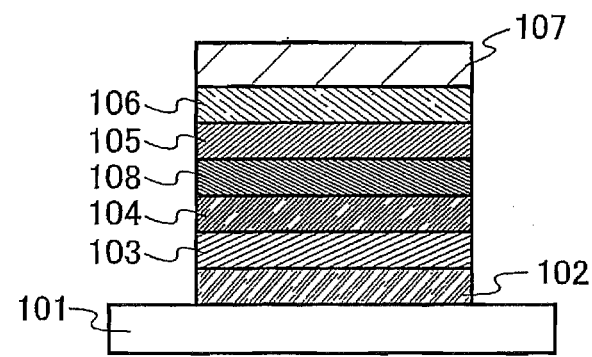
FIG. 3 describes a light-emitting element of the present invention.

As shown in FIG. 3, a layer 108 which contains a substance having a high hole-transporting property may be provided between the second layer 104 and the third layer 105. As the substance having a high hole-transporting property, for example, the following aromatic amine compounds (i.e., compounds having a bond of a benzene ring and nitrogen) are given: 4,4'-bis[N-(1-naphthyl)-N-phenylamino]biphenyl (abbreviation: NPB or α-NPD); N,N'-bis(3-methylphenyl)-N,N'-diphenyl-[1,1'-biphenyl]-4,4'-diamine (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation; MTDATA); 4,4'-bis[N-phenyl-N-(spirofluorene-2-yl)]biphenyl (abbreviation: BSPB); and the like. The substances mentioned here mainly have a hole mobility of $10^{-6}$ cm$^2$/Vs or higher. However, other substances than those may be used as long as the substances have a higher hole-transporting property than an electron-transporting property. Moreover, the layer which contains a substance having a high hole-transporting property may be a single layer or may be formed by stacking two or more layers containing the above substances.

The third layer 105 contains a substance having a high light-emitting property. For example, a substance having a high light-emitting property and a substance having a high carrier-transporting property and having high film quality (i.e., difficult to be crystallized) are freely combined to form the third layer 105. The substance having a high light-emitting property is N,N'-dimethylquinacridone (abbreviation: DMQd); N,N'-diphenylquinacridone (abbreviation: DPQd); 3-(2-benzothiazoyl)-7-diethylaminocoumarin (abbreviation: coumarin 6); or the like. The substance having a high carrier-transporting property and having high film quality is tris(8-quinolinolato)aluminum (abbreviation: Alq); 9,10-di(2-naphtyl)anthracene (abbreviation: DNA); or the like. However, since Alq and DNA have high light-emitting properties, the third layer 105 may be formed with any of these substances alone.

The fourth layer 106 contains a substance having a high electron-transporting property; for example, the following metal complex having a quinoline skeleton or a benzoquinoline skeleton, or the like is given: tris(8-quinolinolato)aluminum (abbreviation: Alq); tris(5-methyl-8-quinolinolato)aluminum (abbreviation: Almq$_3$); bis(10-hydroxybenzo[h]-quinolinato)beryllium (abbreviation: BeBq$_2$); bis(2-methyl-8-quinolinolato)-4-phenylphenolato-aluminum (abbreviation: BAlq); or the like. Beside those, a metal complex having an oxazole ligand or a thiazole ligand, such as bis[2-(2-hydroxyphenyl)-benzoxazolato]zinc (abbreviation: Zn(BOX)$_2$); or bis[2-(2-hydroxyphenyl)-benzothiazolato]zinc (abbreviation: Zn(BTZ)$_2$); or the like can also be used. In addition to the metal complex, 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); or the like can be used. The substances mentioned here mainly have an electron mobility of $10^{-6}$ cm$^2$/Vs or higher. Other substances than those may also be used for the fourth layer 106 as long as the substances have a higher electron-transporting property than a hole-transporting property. The fourth layer 106 may be a single layer or may be formed by stacking two or more layers containing the above substances.

The second electrode 107 can be formed with a metal, alloy, conductive compound, mixture of these, or the like each having a low work function (work function of 3.8 eV or lower). As a specific example of such a cathode material, an element belonging to Group 1 or Group 2 in the periodic table, i.e., an alkali metal such as lithium (Li) or cesium (Cs), an alkaline earth metal such as magnesium (Mg), calcium (Ca), or strontium (Sr), or an alloy containing any of these (such as Mg:Ag or Al:Li) can be given. However, when a layer having a function of promoting electron injection is provided between the second electrode 107 and the fourth layer 106 by being stacked over the second electrode 107, various conductive materials such as Al, Ag, ITO, or ITO containing silicon can be used for the second electrode 107 regardless of the work function.

For the layer having a function of promoting electron injection, a compound of an alkali metal or an alkaline earth metal, such as lithium fluoride (LiF), cesium fluoride (CsF), or calcium fluoride (CaF$_2$) can be used. In addition, a layer which contains a substance having an electron-transporting property in which an alkali metal or an alkaline earth metal is further contained, such as Alq containing magnesium (Mg), can be used.

The first layer 103, the second layer 104, the third layer 105, and the fourth layer 106 may be formed by other methods than the aforementioned evaporation method. For example, an ink jet method, a spin coating method, or the like may be used. Moreover, a different film-formation method may be used for each electrode or each layer.

In the light-emitting element of the present invention having the aforementioned structure, current flows by a potential difference generated between the first electrode 102 and the second electrode 107 and holes and electrons are recombined at the third layer 105 which contains the substance having a high light-emitting property, whereby light is emitted. That is, the structure is that a light-emitting region is formed in the third layer 105. However, it is not necessary that the entire third layer 105 functions as the light-emitting region but, for example, the light-emitting region may be formed only in a part of the third layer 105 that is on the second layer 104 side or the fourth layer 106 side.

Figure 1B:
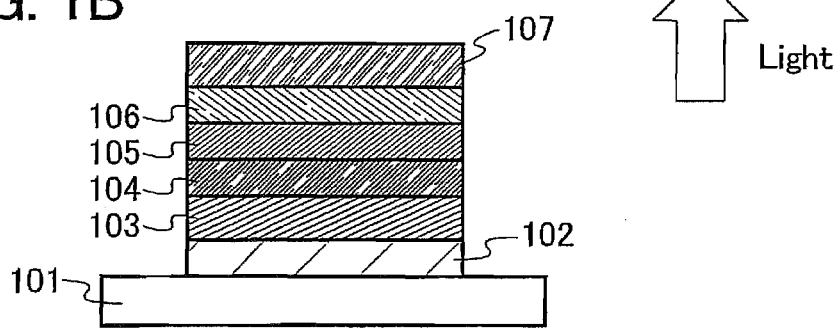
Figure 1C:
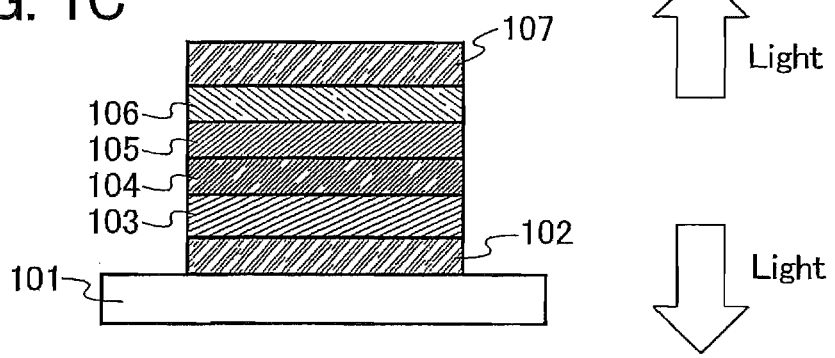

Light emission is extracted to the outside through one or both of the first electrode 102 and the second electrode 107. Therefore, one or both of the first electrode 102 and the second electrode 107 is/are formed with a substance having a light-transmitting property. If only the first electrode 102 is formed with a substance having a light-transmitting property, emitted light is extracted from the substrate side through the first electrode 102 as shown in FIG. 1A. If only the second electrode 107 is formed with a substance having a light-transmitting property, emitted light is extracted from a side opposite of the substrate side through the second electrode 107 as shown in FIG. 1B. If both the first electrode 102 and the second electrode 107 are formed with a substance having a light-transmitting property, emitted light is extracted from both the substrate side and the side opposite of the substrate side through the first electrode 102 and the second electrode 107 as shown in FIG. 1C.

The structure of the layers provided between the first electrode 102 and the second electrode 107 is not restricted to the aforementioned one. Other structures than the aforementioned one may be applied as long as the structures are as follows: a region where holes and electrons are recombined is provided apart from the first electrode 102 and the second electrode 107 so that optical quenching due to approximation of the light-emitting region and the metal is suppressed, and moreover, the layer containing the composite material of the first organic compound and the inorganic compound is in contact with the layer containing the second organic compound not having a peak of an absorption spectrum in a wavelength region of 450 to 800 nm if the second organic compound is compounded with the inorganic compound in the composite material.

In other words, the multilayer structure of the layers is not particularly restricted, and a layer which contains a substance having a high electron-transporting property, a substance having a high hole-transporting property, a substance having a high electron-injecting property, a substance having a high hole-injecting property, a substance having a bipolar property (a substance having a high electron-transporting property and a high hole-transporting property), or the like may be freely combined with the layer containing the composite material of the first organic compound and the inorganic compound and the layer containing the second organic compound not having a peak of an absorption spectrum in a wavelength region of 450 to 800 nm if the second organic compound is compounded with the inorganic compound in the composite material.

Figure 2:
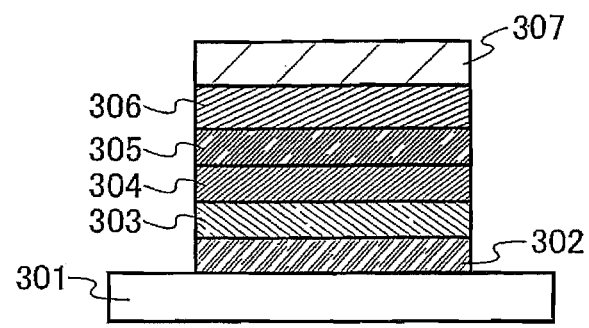
FIG. 2 describes a light-emitting element of the present invention.

A light-emitting element shown in FIG. 2 has a structure in which a first layer 303 which contains a substance having a high electron-transporting property, a second layer 304 which contains a substance having a high light-emitting property, a third layer 305 which contains a second organic compound not having a peak of an absorption spectrum in a wavelength region of 450 to 800 nm if the second organic compound is compounded with an inorganic compound contained in a composite material of a fourth layer 306, the fourth layer 306 containing the composite material, and a second electrode 307 functioning as an anode are stacked over a first electrode 302 functioning as a cathode. A reference numeral 301 denotes a substrate.

In this embodiment mode, the light-emitting element is manufactured over the substrate made of glass, plastic, or the like. By manufacturing a plurality of such light-emitting elements over one substrate, a passive type light-emitting device can be manufactured. The light-emitting elements may be manufactured over, for example, a thin film transistor (TFT) array substrate besides a substrate made of glass, plastic, or the like. Thus, an active matrix type light-emitting device in which the driving of the light-emitting element is controlled by a TFT can be manufactured. The structure of the TFT is not particularly restricted. Either a staggered TFT or an inverted staggered TFT is applicable. A driver circuit formed over the TFT array substrate may be formed by using either or both of N-type TFTs and P-type TFTs. The crystallinity of a semiconductor film used for the TFT is not particularly restricted. An amorphous semiconductor film or a crystalline semiconductor film may be used.

The light-emitting element of the present invention has the layer which contains the composite material of the first organic compound and the inorganic compound and the layer which contains the second organic compound not having a peak of an absorption spectrum in a wavelength region of 450 to 800 nm if the second organic compound is compounded with the inorganic compound in the composite material.

The layer containing the composite material does not have a peak of an absorption spectrum in a wavelength region of 450 to 800 nm. Therefore, light emitted from the light-emitting substance can be transmitted efficiently through the layer containing the composite material, and external extraction efficiency can be improved. That is, a light-emitting element having high luminous efficiency can be obtained.

The layer containing the second organic compound does not have a peak of an absorption spectrum in a wavelength region of 450 to 800 nm if the second organic compound is compounded with the inorganic compound in the composite material. Therefore, even if a composite material that is made from the second material and the inorganic compound exists at an interface between the layer containing the composite material and the layer containing the second organic compound, light emitted from the light-emitting substance is not absorbed by the composite material. Thus, external extraction efficiency can be improved. In other words, a light-emitting element having high luminous efficiency can be obtained.

The layer containing the composite material of the first organic compound and the inorganic compound has high conductivity. Therefore, lower-voltage driving of the light-emitting element can be achieved.

Since the layer containing the composite material of the organic compound and the inorganic compound has high conductivity, even in the case where the film containing the composite material has large film thickness, the increase in drive voltage can be suppressed. Therefore, it becomes possible to optimize the film thickness of the layer containing the composite material so that external light extraction efficiency is increased while suppressing the increase in drive voltage.

In addition, improvement of color purity by optical design without increasing drive voltage can be achieved.

Since short-circuiting due to depression and projection on the electrodes, shock, and the like can be prevented by increasing the film thickness of the layer containing the composite material, a light-emitting element with high reliability can be obtained. For example, in contrast with the total film thickness of a layer or layers between the electrodes of the light-emitting element which generally ranges from 100 to 150 nm, the total film thickness of the layer or the layers between the electrodes of the light-emitting element using the layer containing the composite material can be made-100 to 500 nm, and preferably 200 to 500 nm.

The layer containing the composite material used for the light-emitting element of the present invention can have an ohmic contact with the electrodes and has small contact resistance with the electrodes. Therefore, an electrode material can be selected without considering the work function and the like. In other words, selection range of the electrode material can be wider.

Embodiment Mode 4

This embodiment mode will describe a light-emitting device having a light-emitting element of the present invention.

Figure 33A:
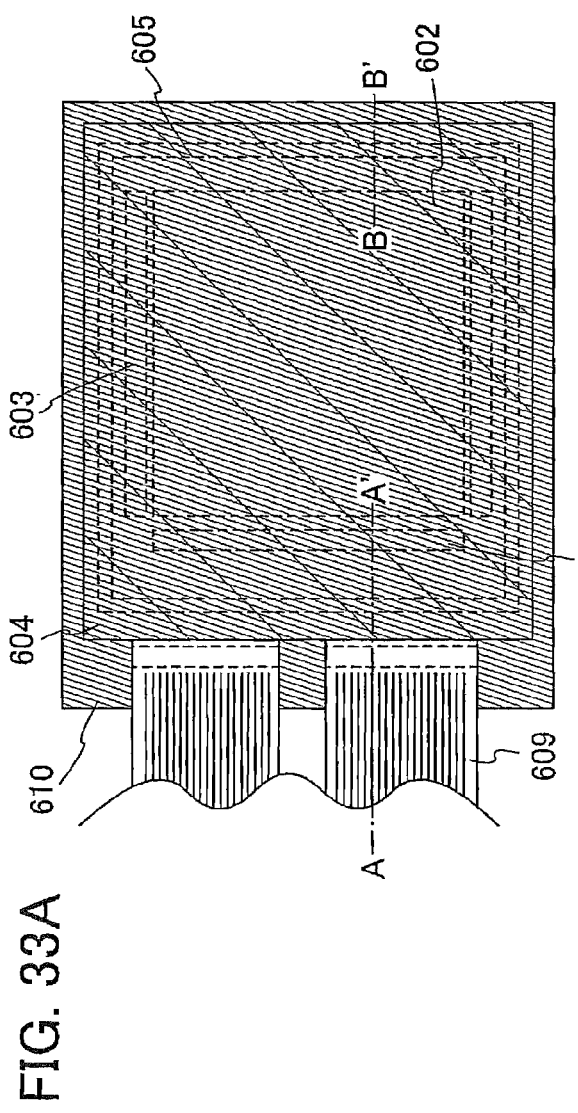
FIGS. 33A and 33B describe a light-emitting device of the present invention.
Figure 33B:
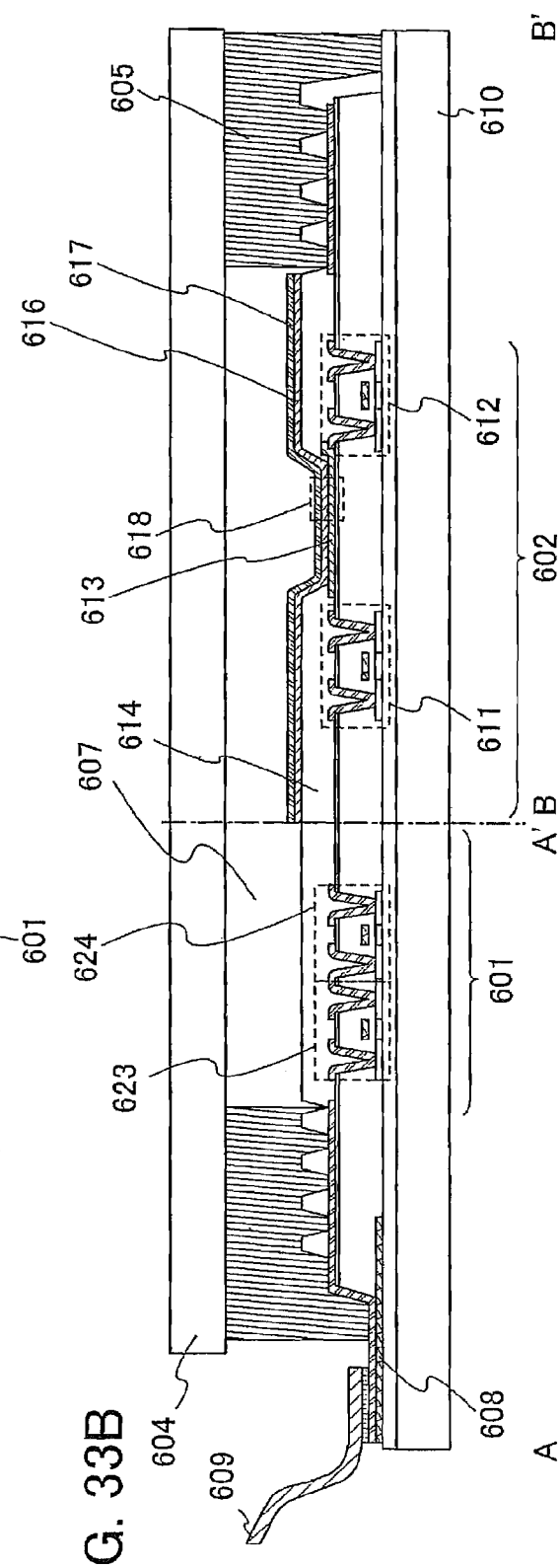

This embodiment mode will describe a light-emitting device having a light-emitting element of the present invention in a pixel portion, with reference to FIGS. 33A and 33B. FIG. 33A is a top view showing a light-emitting device while FIG. 33B is a cross-sectional view along lines A-A' and B-B' of FIG. 33A. A reference numeral 601 shown with a dotted line denotes a driver circuit portion (source side driver circuit); 602, a pixel portion; and 603, a driver circuit portion (gate side driver circuit). Moreover, a reference numeral 604 denotes a sealing substrate; 605, a sealing material; and 607, a space surrounded by the sealing material 605.

A leading wire 608 is to transmit a signal to be inputted to the source side driver circuit 601 and the gate side driver circuit 603, and receive a video signal, a clock signal, a start signal, a reset signal, and the like from an FPC (Flexible Printed Circuit) 609, which serves as an external input terminal. Although only the FPC is shown here, this FPC may be provided with a printed wiring board (PWB). The light-emitting device in this specification not only includes a light-emitting device itself but also a state where the light-emitting device has an FPC or a PWB attached thereto.

Next, a cross-sectional structure is described with reference to FIG. 33B. Over an element substrate 610 are formed the driver circuit portion and the pixel portion. Here, the source side driver circuit 601, which is the driver circuit portion, and one pixel in the pixel portion 602 are shown.

In the source side driver circuit 601, a CMOS circuit in which an n-channel TFT 623 and a p-channel TFT 624 are combined is formed. The TFT for forming the driver circuit may be formed by using various circuits such as a CMOS circuit, a PMOS circuit, or an NMOS circuit. Although this embodiment mode shows a driver-integrated type where the driver circuit is formed over the substrate, the present invention is not restricted to this, and the driver circuit may be formed outside the substrate, not over the substrate.

The pixel portion 602 is formed by a plurality of pixels each including a switching TFT 611, a current control TFT 612, and a first electrode 613 electrically connected to a drain of the current control TFT 612. An insulator 614 is formed so as to cover an end portion of the first electrode 613. Here, the insulator 614 is formed by using a positive photosensitive acrylic resin film.

In order to improve coverage, an upper end portion or a lower end portion of the insulator 614 is formed so as to have a curved surface with curvature. For example, in the case of using a positive photosensitive acrylic for the insulator 614, it is preferable that only the upper end portion of the insulator 614 have a curved surface with curvature (a radius of curvature of 0.2 to 3 μm). As the insulator 614, either a negative type which becomes insoluble in etchant by irradiation with light or a positive type which becomes soluble in etchant by irradiation with light can be used.

Over the first electrode 613, a layer 616 containing a light-emitting substance and a second electrode 617 are formed. Here, the first electrode 613 functioning as an anode can be formed with various metals, alloys, conductive compounds, or mixture thereof. If the first electrode is used as an anode, it is preferable to use, among those materials, a material having a high work function (work function of 4.0 eV or higher), or the like. For example, a single layer of indium tin oxide containing silicon, indium zinc oxide (IZO) in which zinc oxide (ZnO) is mixed by 2 to 20 wt % into indium oxide, a titanium nitride film, a chromium film, a tungsten film, a Zn film, a Pt film, or the like can be used. Moreover, a multilayer including a film containing titanium nitride and a film containing aluminum as its main component; a three-layer structure including a titanium nitride film, a film containing aluminum as its main component, and a titanium nitride film; or the like can be used. The multilayer structure achieves to have low wiring resistance, favorable ohmic contact, and a function as an anode.

The layer 616 containing a light-emitting substance is formed by various methods such as an evaporation method using an evaporation mask, an ink jet method, a spin coating method, and the like. The layer 616 containing a light-emitting substance has the layer containing the composite material shown in Embodiment Mode 1 and the layer containing the second organic compound shown in Embodiment Mode 2. As another material that constitutes a part of the layer 616 containing a light-emitting substance, a low molecular material, a medium molecular material (including oligomer and dendrimer), or a high molecular material may be used. As the material for the layer containing a light-emitting substance, generally an organic compound is often used as a single layer or a multilayer; however, in the present invention, a structure using an inorganic compound as a part of a film containing an organic compound is also acceptable.

As the material for the second electrode 617 functioning as a cathode, which is formed over the layer 616 containing a light-emitting substance, a metal, alloy, conductive compound, mixture of these, or the like each having a low work function (work function of 3.8 eV or lower) can be used. As a specific example of such a cathode material, an element belonging to Group 1 or Group 2 in the periodic table, i.e., an alkali metal such as lithium (Li) or cesium (Cs), an alkaline earth metal such as magnesium (Mg), calcium (Ca), or strontium (Sr), or an alloy containing any of these (such as Mg:Ag or Al:Li) can be given. In the case where light generated in the layer 616 containing a light-emitting substance is transmitted through the second electrode 617, the second electrode 617 is preferably formed by using a multilayer of a metal thin film and a transparent conductive film (ITO, indium oxide containing 2 to 20 wt % of zinc oxide, indium tin oxide containing silicon, zinc oxide (ZnO), or the like).

When the sealing substrate 604 and the element substrate 610 are attached to each other by the sealing material 605, the light-emitting element 618 is provided in the space 607 surrounded by the element substrate 610, the sealing substrate 604, and the sealing material 605. The space 607 may be filled with filler, and may be filled with an inert gas (such as nitrogen or argon), the sealing material 605, or the like.

An epoxy-based resin is preferable for the sealing material 605. The material preferably allows as little moisture and oxygen as possible to penetrate. As a material for the sealing substrate 604, a plastic substrate made of FRP (Fiberglass-Reinforced Plastics), PVF (polyvinyl fluoride), Mylar, polyester, acrylic, or the like can be used besides a glass substrate or a quartz substrate.

In this way, the light-emitting device having the light-emitting element of the present invention can be obtained.

The light-emitting device of the present invention has the layer containing the composite material shown in Embodiment Mode 1 and the layer containing the second organic compound shown in Embodiment Mode 2, which is provided so as to be in contact with the layer containing the composite material. Therefore, light emitted from the light-emitting region can be extracted to the outside efficiently, and the luminous efficiency is high. Moreover, the drive voltage can be decreased, thereby allowing lower power consumption.

Moreover, the light-emitting device of the present invention can suppress the increase in drive voltage even though the layer containing the composite material is made thicker. Therefore, the short-circuiting of the light-emitting element can be prevented by increasing the thickness of the layer containing the composite material. Moreover, improvement of external extraction efficiency of light emission can be achieved by optical design. Thus, a highly-reliable light-emitting device with low power consumption can be obtained.

Figure 34:
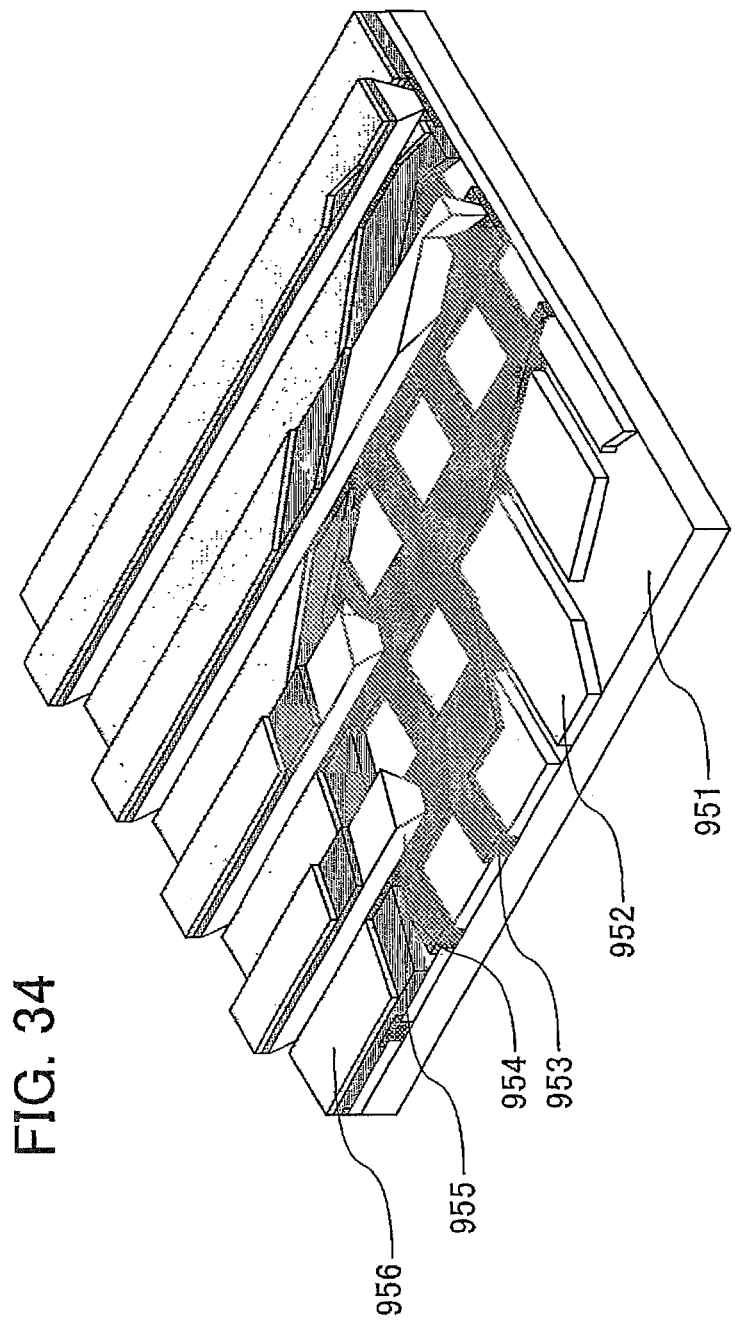
FIG. 34 describes a light-emitting device of the present invention.

Although this embodiment mode has described the active matrix type light-emitting device in which the driving of the light-emitting element is controlled by the transistor, the light-emitting device may be of a passive type in which the light-emitting element is driven without particularly providing the element for driving, such as the transistor. FIG. 34 is a perspective view of a passive type light-emitting device manufactured by applying the present invention. In FIG. 34, a layer 955 containing a light-emitting substance is provided between an electrode 952 and an electrode 956 over a substrate 951. An end portion of the electrode 952 is covered with an insulating layer 953. Then, over the insulating layer 953 is provided a partition wall layer 954. A side wall of the partition wall layer 954 has such a gradient that the distance between one side wall and the other side wall becomes shorter as approaching the substrate surface. That is to say, a cross section of the partition wall layer 954 in a short-side direction is trapezoid-like, in which a bottom side (a side in a similar direction to a surface direction of the insulating layer 953, which has contact with the insulating layer 953) is shorter than an upper side (a side in a similar direction to the surface direction of the insulating layer 953, which does not have contact with the insulating layer 953). In this way, by providing the partition wall layer 954, a problem of a light-emitting element due to electrostatic and the like can be prevented. Moreover, even a passive type light-emitting device can be driven with low power consumption by including a light-emitting element of the present invention that has high luminous efficiency and that is driven with low drive voltage.

Embodiment Mode 5

This embodiment mode will describe an electronic appliance of the present invention, which includes the light-emitting device shown in Embodiment Mode 4 as a part thereof. The electronic appliance of the present invention has a display portion of low power consumption, and has the layer containing the composite material shown in Embodiment Mode 1 and the layer containing the second organic compound shown in Embodiment Mode 2, which is provided so as to be in contact with the layer containing the composite material. By increasing the thickness of the layer containing the composite material shown in Embodiment Mode 1, it is also possible to provide an electronic appliance having a display portion with high reliability in which short-circuiting due to shock from the outside, a minute foreign particle, or the hie is suppressed.

Figure 35A:
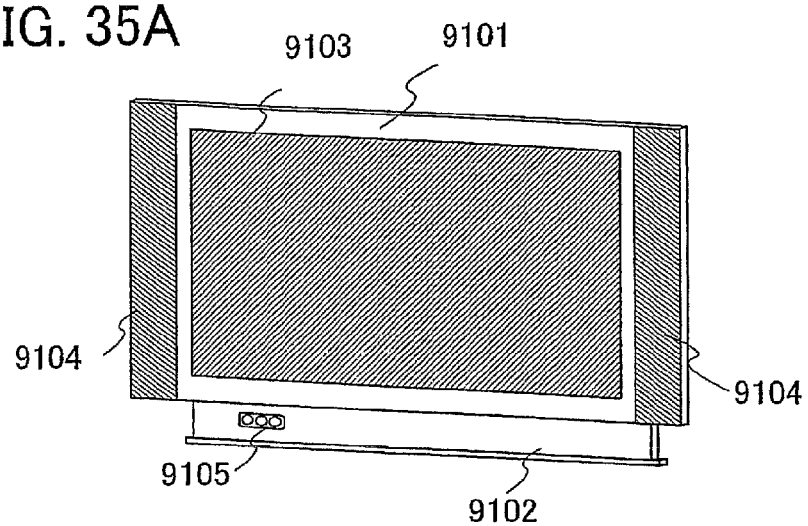
FIGS. 35A to 35D describe electronic appliances of the present invention.

As the electronic appliance manufactured by using the light-emitting device of the present invention, a camera such as a video camera or a digital camera, a goggle-type display, a navigation system, a sound reproducing device (such as a car audio component or an audio component), a computer, a game machine, a mobile information terminal (a mobile computer, a mobile phone, a mobile game machine, or an electronic book), an image reproducing device equipped with a recording medium (specifically, a device equipped with a display device for reproducing a recording medium such as digital versatile disk (DVD) and displaying the image), and the like are given. Specific examples of these electronic appliances are shown in FIGS. 35A to 35D. FIG. 35A shows a television device according to the present invention, which includes a housing 9101, a supporter 9102, a display portion 9103, a speaker portion 9104, a video input terminal 9105, and the like. In this television device, the display portion 9103 is formed by arranging similar light-emitting elements to those described in Embodiment Modes 2 to 6 in a matrix form. The light-emitting elements have advantages of their high luminous efficiency and low drive voltage. Moreover, it is possible to prevent short-circuiting due to minute foreign particles, shock from the outside, and the like. Since the display portion 9103 having such light-emitting elements also has similar advantages, this television does not deteriorate in its image quality and consumes less electric power. Since the number of circuits each having a deterioration-compensation function and power source circuits can be drastically decreased or the size of such circuits can be reduced in the television device because of such advantages, reduction in size and weight of the housing 9101 and the supporter 9102 can be achieved. Since reduction in size, weight, and power consumption, and moreover improvement of image quality can be achieved in the television device of the present invention, products suitable for dwelling environment can be provided.

Figure 35B:
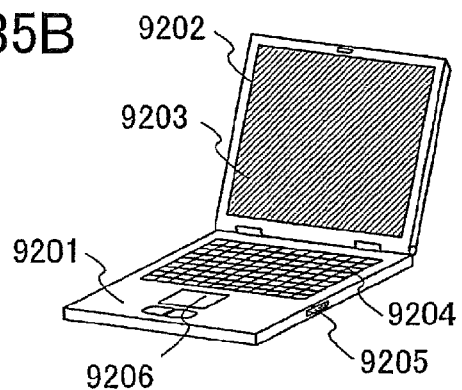

FIG. 35B shows a computer according to the present invention, which includes a main body 9201, a housing 9202, a display portion 9203, a keyboard 9204, an external connection port 9205, a pointing mouse 9206, and the like. In this computer, the display portion 9203 is formed by arranging similar light-emitting elements to those described in Embodiment Modes 2 to 6 in a matrix form. The light-emitting elements have advantages of their high luminous efficiency and low drive voltage. Moreover, it is possible to prevent short-circuiting due to minute foreign particles, shock from the outside, and the like. Since the display portion 9203 having such light-emitting elements also has similar advantages, this computer does not deteriorate in its image quality and consumes less electric power. Since the number of circuits each having a deterioration-compensation function and power source circuits can be drastically decreased or the size of such circuits can be reduced in the computer because of such advantages, reduction in size and weight of the main body 9201 and the housing 9202 can be achieved. Since reduction in size, weight, and power consumption, and moreover improvement of image quality can be achieved in the computer of the present invention, products suitable for dwelling environment can be provided. Furthermore, it becomes possible to carry around the computer, and the computer having a display portion which resists shock from the outside when carrying it around can be provided.

Figure 35C:
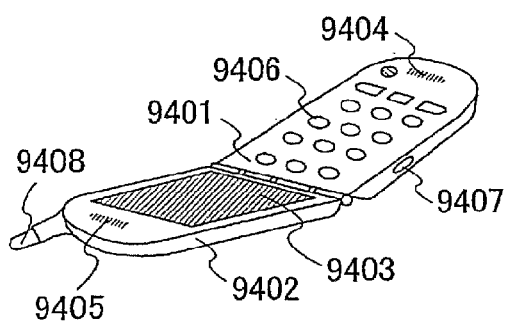

FIG. 35C shows a mobile phone of the present invention, which includes a main body 9401, a housing 9402, a display portion 9403, an audio input portion 9404, an audio output portion 9405, an operation key 9406, an external connection port 9407, an antenna 9408, and the like. This display portion 9403 is formed by arranging similar light-emitting elements to those described in Embodiment Modes 2 to 6 in a matrix form. The light-emitting elements have advantages of their high luminous efficiency and low drive voltage. Moreover, it is possible to prevent short-circuiting due to minute foreign particles, shock from the outside, and the like. Since the display portion 9403 having such light-emitting elements also has similar advantages, this mobile phone does not deteriorate in its image quality and consumes less electric power. Since the number of circuits each having a deterioration-compensation function and power source circuits can be drastically decreased or the size of such circuits can be reduced in the mobile phone because of such advantages, reduction in size and weight of the main body 9401 and the housing 9402 can be achieved. Since reduction in size, weight, and power consumption, and moreover improvement of image quality can be achieved in the mobile phone of the present invention, products suitable for being carried around can be provided. In addition, products having display portions which resist shock from the outside when being carried around can be provided.

Figure 35D:
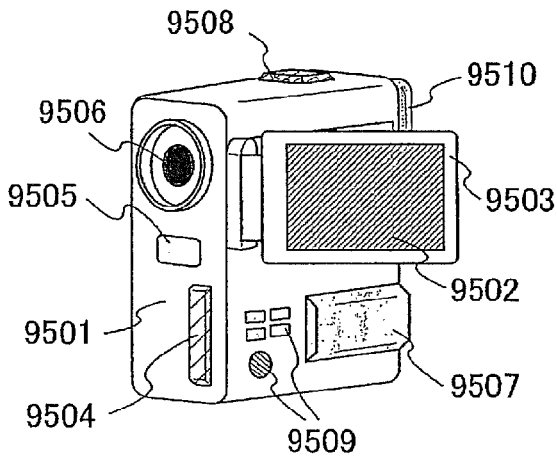

FIG. 35D shows a camera of the present invention, which includes a main body 9501, a display portion 9502, a housing 9503, an external connection port 9504, a remote control receiving portion 9505, an image receiving portion 9506, a battery 9507, an audio input portion 9508, an operation key 9509, an eyepiece portion 9510, and the like. In this camera, the display portion 9502 is formed by arranging similar light-emitting elements to those described in Embodiment Modes 2 to 6 in a matrix form. The light-emitting elements have advantages of their high luminous efficiency and low drive voltage. Moreover, it is possible to prevent short-circuiting due to minute foreign particles, shock from the outside, and the like. Since the display portion 9502 having such light-emitting elements also has similar advantages, this camera does not deteriorate in its image quality and consumes less electric power. Since the number of circuits each having a deterioration-compensation function and power source circuits can be drastically decreased or the size of such circuits can be reduced in the camera because of such advantages, reduction in size and weight of the main body 9501 can be achieved. Since reduction in size, weight, and power consumption, and moreover improvement of image quality can be achieved in the camera of the present invention, products suitable for being carried around can be provided. In addition, products having display portions which resist shock from the outside when carrying them around can be provided.

As thus described, application range of the light-emitting device of the present invention is quite wide, and this light-emitting device can be applied to electronic appliances of every field. By using the light-emitting device of the present invention, an electronic appliance having a highly-reliable display portion consuming less electric power can be provided.

Moreover, the light-emitting device of the present invention has the light-emitting element having high luminous efficiency, and the light-emitting device can be used as an illumination device. An example of using the light-emitting element of the present invention as an illumination device will be described with reference to FIG. 36.

Figure 36:
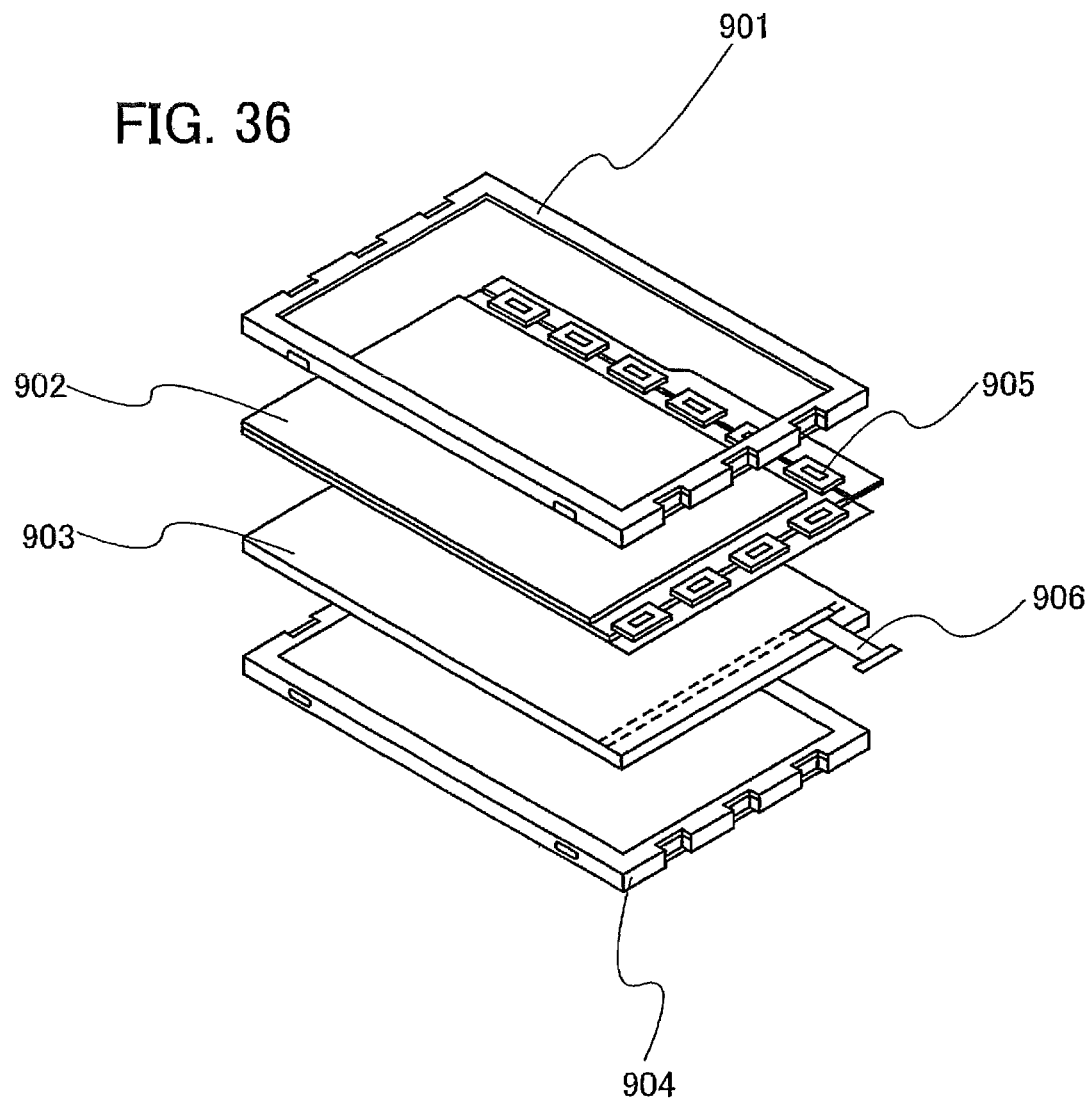
FIG. 36 describes an electronic appliance of the present invention.

FIG. 36 shows an example of a liquid crystal display device in which the light-emitting device of the present invention is used as a backlight. The liquid crystal display device shown in FIG. 36 includes a housing 901, a liquid crystal layer 902, a backlight 903, and a housing 904, in which the liquid crystal layer 902 is connected to a driver IC 905. The backlight 903 uses the light-emitting device of the present invention, and current is supplied to the backlight 903 by a terminal 906.

When the light-emitting device of the present invention is used as the backlight of the liquid crystal display device, the backlight consumes less electric power. Moreover, since the light-emitting device of the present invention is an illumination device of surface light emission and the enlargement of the light-emitting device is possible, the backlight can be made larger and the liquid crystal display device can also have a larger area. Moreover, since the light-emitting device is thin and consumes less electric power, reduction in thickness and power consumption of the display device is possible.

Embodiment 1

This embodiment will describe optical characteristics and a method for manufacturing an organic compound, an inorganic compound, and a layer containing a composite material which are used for a light-emitting element of the present invention.

Sample 1

First, a quartz substrate is fixed at a substrate holder in a vacuum evaporation apparatus. Then, DNTPD and molybdenum oxide (VI) were separately put in different resistance-heating evaporation sources, and the vacuum apparatus was evacuated to reduce pressure to be about $10^{-4}$ Pa. After that, a layer containing DNTPD and molybdenum oxide was formed by a co-evaporation method. At this time, the co-evaporation was carried out so that the weight ratio between DNTPD and molybdenum oxide was 2:1. The thickness of the layer was set to 100 nm.

Figure 4:
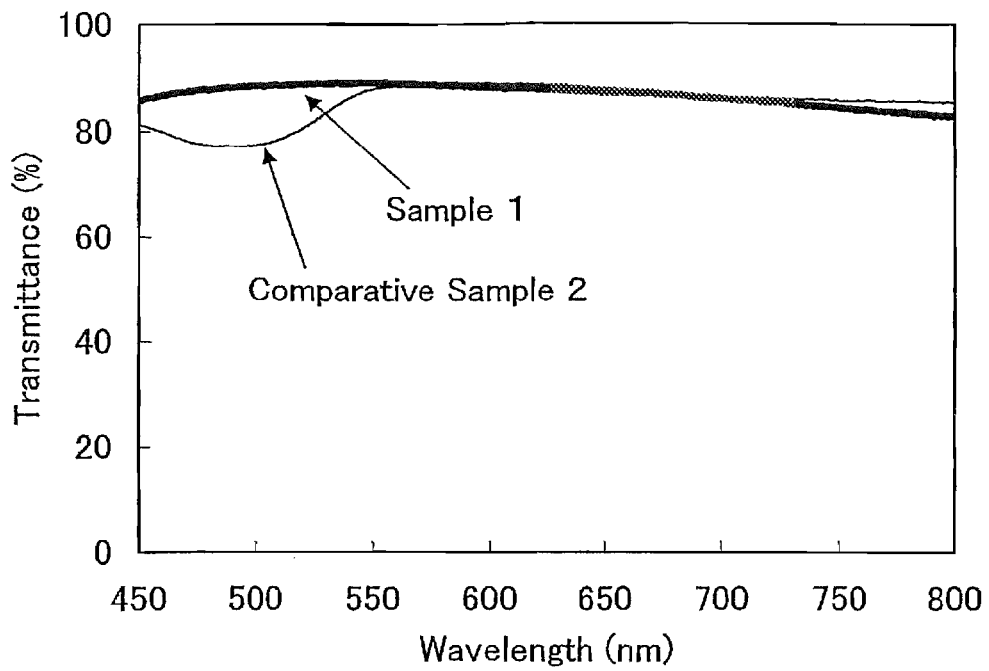
FIG. 4 shows transmittance of a composite material.
Figure 37:
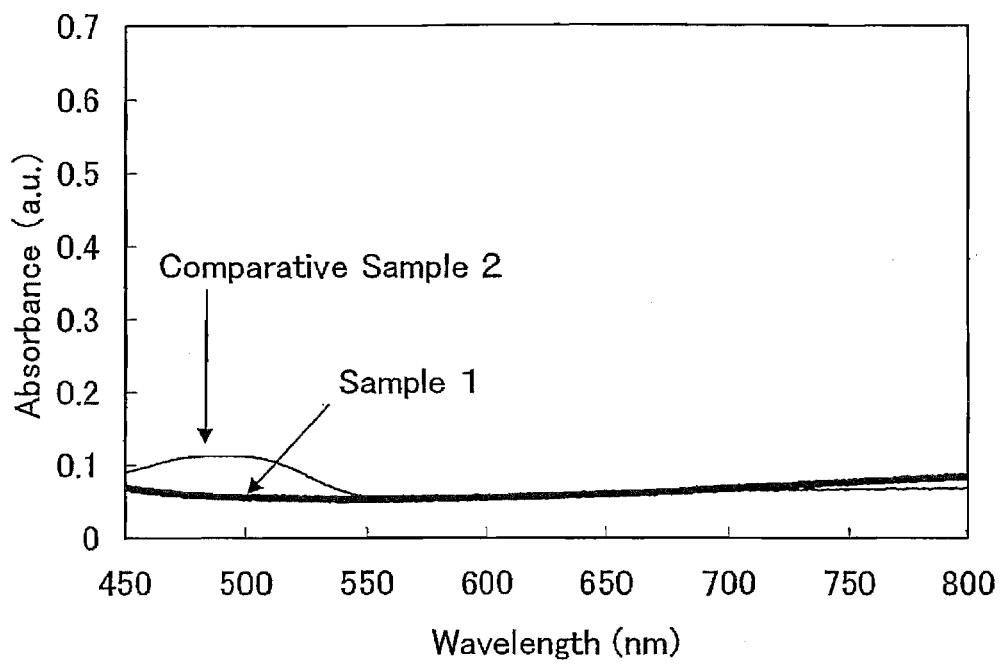
FIG. 37 shows an absorption spectrum of a composite material.

A measurement result of an absorption spectrum of a DNTPD-molybdenum oxide composite layer (Sample 1) formed in this way in a wavelength region of 450 to 800 nm is shown in FIG. 37. Further, the transmittance thereof is shown in FIG. 4.

Comparative Example 1

Comparative Sample 2

First, a quartz substrate is fixed at a substrate holder in a vacuum evaporation apparatus. Then, NPB and molybdenum oxide (VI) were separately put in different resistance-heating evaporation sources, and the vacuum apparatus was evacuated to reduce pressure to be about $10^{-4}$ Pa. After that, a layer containing NPB and molybdenum oxide was formed by a co-evaporation method. At this time, the co-evaporation was carried out so that the weight ratio between NPB and molybdenum oxide was 2:0.75. The thickness of the layer was set to 100 nm A measurement result of an absorption spectrum of a NPB-molybdenum oxide composite layer (Comparative Sample 2)

formed in this way in a wavelength region of 450 to 800 nm is shown in FIG. 37. Further, the transmittance thereof is shown in FIG. 4.

As can be seen from FIG. 4 and FIG. 37, the DNTPD-molybdenum oxide composite layer does not have an absorption peak but has a transmittance of 80% or higher in a wavelength region of 450 to 800 nm. In contrast, the NPB-molybdenum oxide composite layer as the comparative example has an absorption peak at a wavelength of about 500 nm and has a wavelength region in which the transmittance is less than 80%.

Therefore, it is understood that the composite material of the present invention and the layer containing the organic compound, which is provided so as to be in contact with the composite material do not have an absorption peak but have high transmittance in a wavelength region of 450 to 800 nm.

Embodiment 2

This embodiment will describe optical characteristics and a method for manufacturing an organic compound, an inorganic compound, and a layer containing a composite material which are used for a light-emitting element of the present invention.

Sample 3

First, a quartz substrate is fixed at a substrate holder in a vacuum evaporation apparatus. Then, t-BuDNA and molybdenum oxide (VI) were separately put in different resistance-heating evaporation sources, and the vacuum apparatus was evacuated to reduce pressure to be about $10^{-4}$ Pa. After that, a layer containing t-BuDNA and molybdenum oxide was formed by a co-evaporation method. At this time, the co-evaporation was carried out so that the weight ratio between t-BuDNA and molybdenum oxide was 2:1. The thickness of the layer was set to 100 nm.

Sample 4

Similarly to Sample 3, a quartz substrate is fixed at a substrate holder in a vacuum evaporation apparatus. Then, DPPA and molybdenum oxide (VI) were separately put in different resistance-heating evaporation sources, and the vacuum apparatus was evacuated to reduce pressure to be about $10^{-4}$ Pa. After that, a layer containing DPPA and molybdenum oxide was formed by a co-evaporation method. At this time, the co-evaporation was carried out so that the weight ratio between DPPA and molybdenum oxide was 2:1. The thickness of the layer was set to 100 nm.

Sample 5

Similarly to Sample 3, a quartz substrate is fixed at a substrate holder in a vacuum evaporation apparatus. Then, DNA and molybdenum oxide (VI) were separately put in different resistance-heating evaporation sources, and the vacuum apparatus was evacuated to reduce pressure to be about $10^{-4}$ Pa. After that, a layer containing DNA and molybdenum oxide was formed by a co-evaporation method. At this time, the co-evaporation was carried out so that the weight ratio between DNA and molybdenum oxide was 2:1. The thickness of the layer was set to 100 nm.

Sample 6

Similarly to Sample 3, a quartz substrate is fixed at a substrate holder in a vacuum evaporation apparatus. Then, DPAnth and molybdenum oxide (VI) were separately put in different resistance-heating evaporation sources, and the vacuum apparatus was evacuated to reduce pressure to be about $10^{-4}$ Pa. After that, a layer containing DPAnth and molybdenum oxide was formed by a co-evaporation method. At this time, the co-evaporation was carried out so that the weight ratio between DPAnth and molybdenum oxide was 2:1. The thickness of the layer was set to 100 nm.

Figure 38:
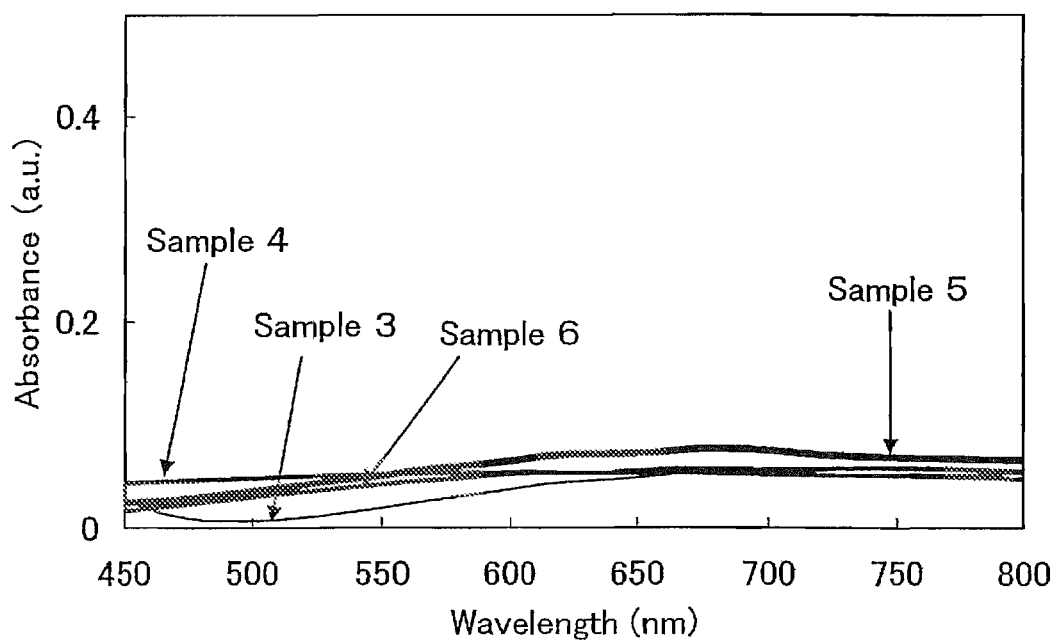
FIG. 38 shows an absorption spectrum of a composite material.

Measurement results of absorption spectra of the t-BuDNA-molybdenum oxide composite layer (Sample 3), the DPPA-molybdenum oxide composite layer (Sample 4), the DNA-molybdenum oxide composite layer (Sample 5), and the DPAnth-molybdenum oxide composite layer (Sample 6) formed in this way, in a wavelength region of 450 to 800 nm are shown in FIG. 38. Further, the transmittance of each layer is shown in FIG. 5.

Figure 5:
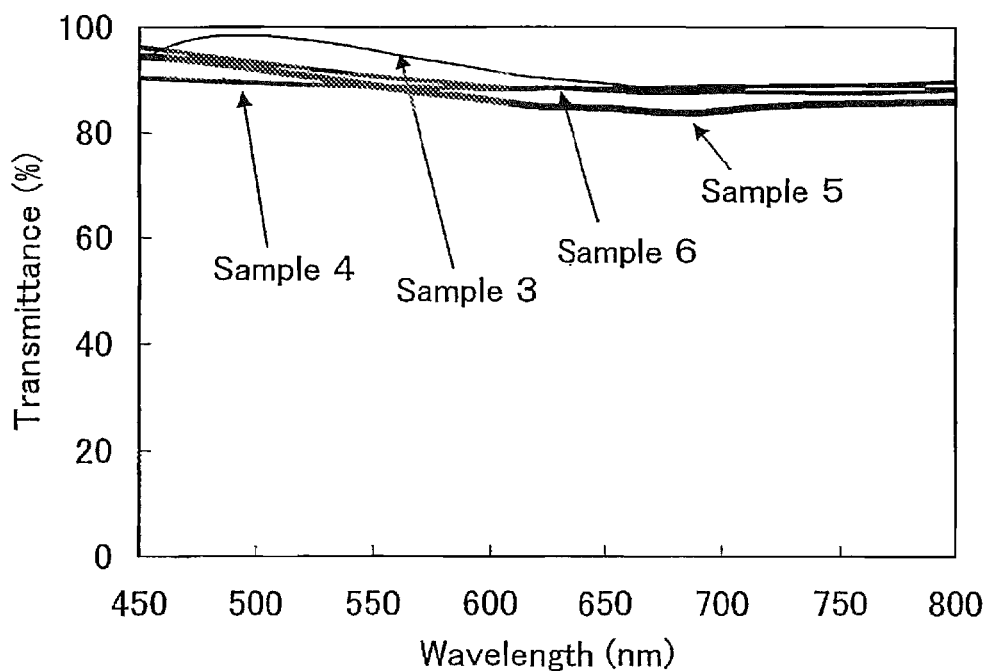
FIG. 5 shows transmittance of a composite material.

As can be seen from FIG. 5 and FIG. 38, the t-BuDNA-molybdenum oxide composite layer (Sample 3), the DPPA-molybdenum oxide composite layer (Sample 4), the DNA-molybdenum oxide composite layer (Sample 5), and the DPAnth-molybdenum oxide composite layer (Sample 6) do not have an absorption peak but have a transmittance of 80% or higher in a wavelength region of 450 to 800 nm.

Therefore, it is understood that the layer containing the composite material of the present invention and the layer containing the organic compound, which is provided so as to be in contact with the composite material do not have an absorption peak but have high transmittance in a wavelength region of 450 to 800 nm.

The layer containing the organic compound has higher transmittance than the layer containing the composite material. Therefore, it is understood that a multilayer body of the layer containing the composite material and the layer containing the organic compound, which is provided so as to be in contact with the composite material has a transmittance higher than 80%.

Moreover, the relation between the absorbance and the film thickness is represented by the following formula (2) according to Lambert-Beer's law.

$$A = \log\frac{I_0}{I} = \varepsilon L \qquad (2)$$

A: absorbance
$I_0$: incident light
I: transmitted light
$\varepsilon$: absorbance coefficient per unit of film thickness ($nm^{-1}$)
L: thickness (nm)

Moreover, the transmittance is represented by the following formula (3).

$$T = \frac{I}{I_0} \qquad (3)$$

T: transmittance
The absorbance is represented by the following formula (4) by assigning the formula (3) to the formula (2).

$$\log\frac{1}{T} = \varepsilon L \qquad (4)$$

-continued $$\varepsilon = \frac{1}{L} \cdot \log\frac{1}{T}$$

For example, the absorbance coefficient per unit of film thickness is represented by the formula (5) when the film thickness L is 100 nm and the transmittance T is 80%.

$$\varepsilon \leq \frac{1}{100} \cdot \log\frac{1}{0.8} \qquad (5)$$

$$\varepsilon \leq \frac{1}{100} \cdot 0.097 = 9.7 \times 10^{-4}$$

It is preferable that the composite material used for the light-emitting element of the present invention have a transmittance of 80% or higher in a wavelength region of 450 to 800 nm. That is, the following formula (6) is preferably satisfied.

$$A = \varepsilon l \leq 9.7 \times 10^{-4} \times l \qquad (6)$$

A: absorbance
l: thickness (nm)

If the transmittance is 0%, for example in the case of using a reflective material or the like, Lambert-Beer's law is not effective; therefore, the formula (6) is not satisfied.

Embodiment 3

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the volume ratio between t-BuDNA and molybdenum oxide (VI) was adjusted so that molybdenum oxide was contained by 10 vol %. A co-evaporation method is an evaporation method by which evaporation is carried out from a plurality of evaporation sources at the same time within one process chamber.

Next, t-BuDNA was formed by an evaporation method using resistance heating so as to be in contact with the layer containing the composite material in 10 nm thick. The ionization potential of t-BuDNA was 5.55 eV.

By co-evaporating Alq and DPQd, a 40-nm-thick light-emitting layer was formed over t-BuDNA. Here, the weight ratio between Alq and DPQd was adjusted so as to be 1:0.005 (=Alq:DPQd). Thus, DPQd exists in such a state that DPQd disperses in a layer containing Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 1 was manufactured.

Comparative Example 2

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the volume ratio between t-BuDNA and molybdenum oxide (VI) was adjusted so that molybdenum oxide was contained by 10 vol %. A co-evaporation method is an evaporation method by which evaporation is carried out from a plurality of evaporation sources at the same time within one process chamber.

Next, NPB was formed in 10 nm thick by an evaporation method using resistance heating.

Moreover, by co-evaporating Alq and DPQd, a 40-nm-thick light-emitting layer was formed over NPB. Here, the weight ratio between Alq and DPQd was adjusted so as to be 1:0.005 (=Alq:DPQd). Thus, DPQd exists in such a state that DPQd disperses in a layer including Alq.

After that, Alq was formed in 30 nm thick over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a comparative light-emitting element 1 was manufactured.

Figure 6:
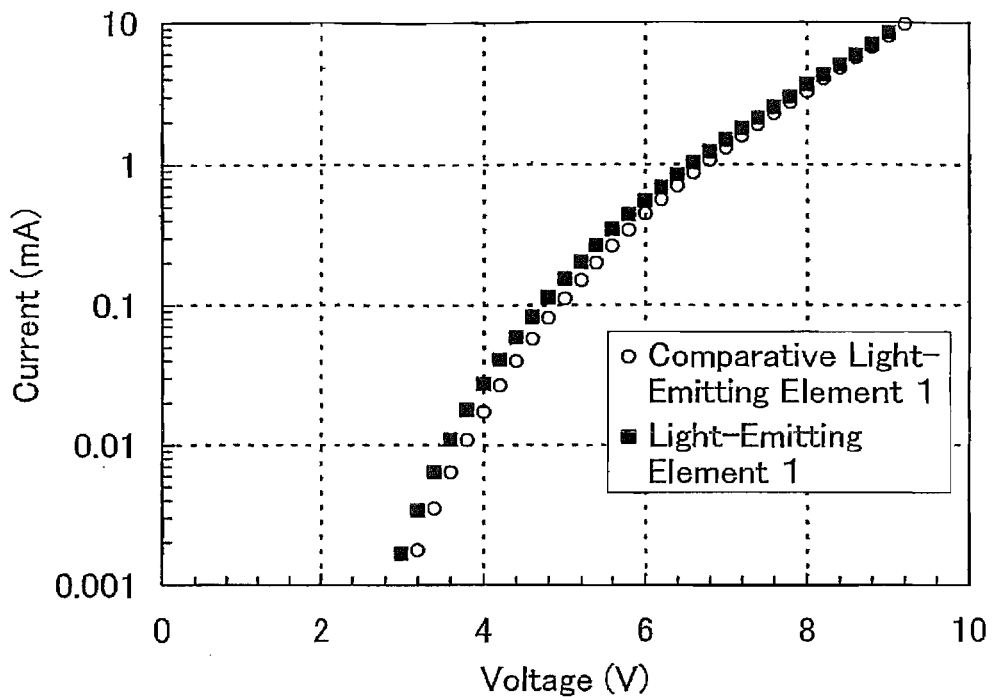
FIG. 6 shows a current-voltage characteristic of a light-emitting element.
Figure 7:
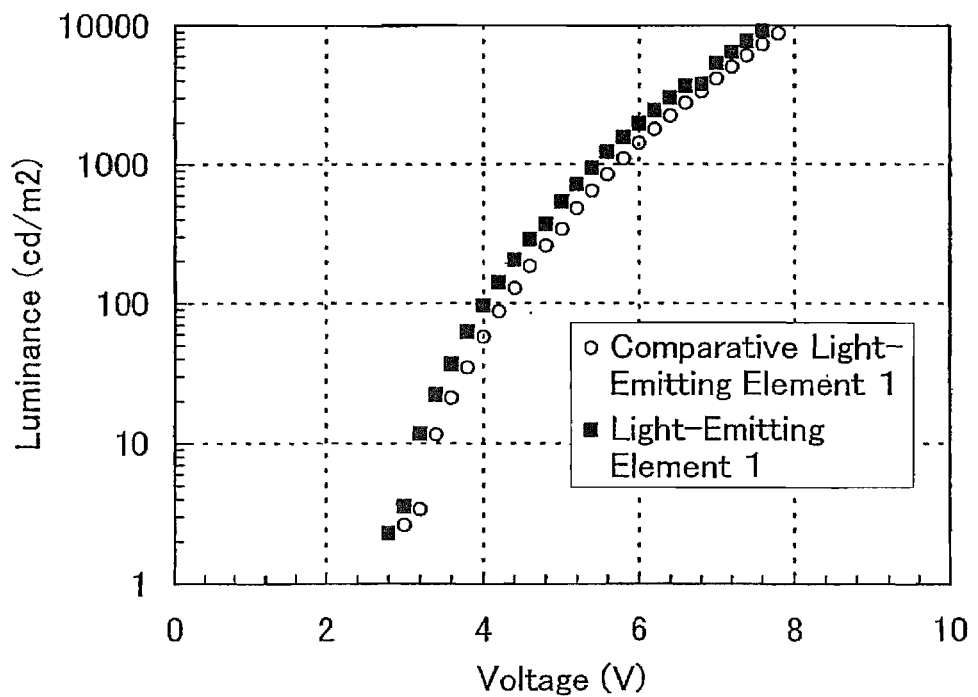
FIG. 7 shows a luminance-voltage characteristic of a light-emitting element.
Figure 8:
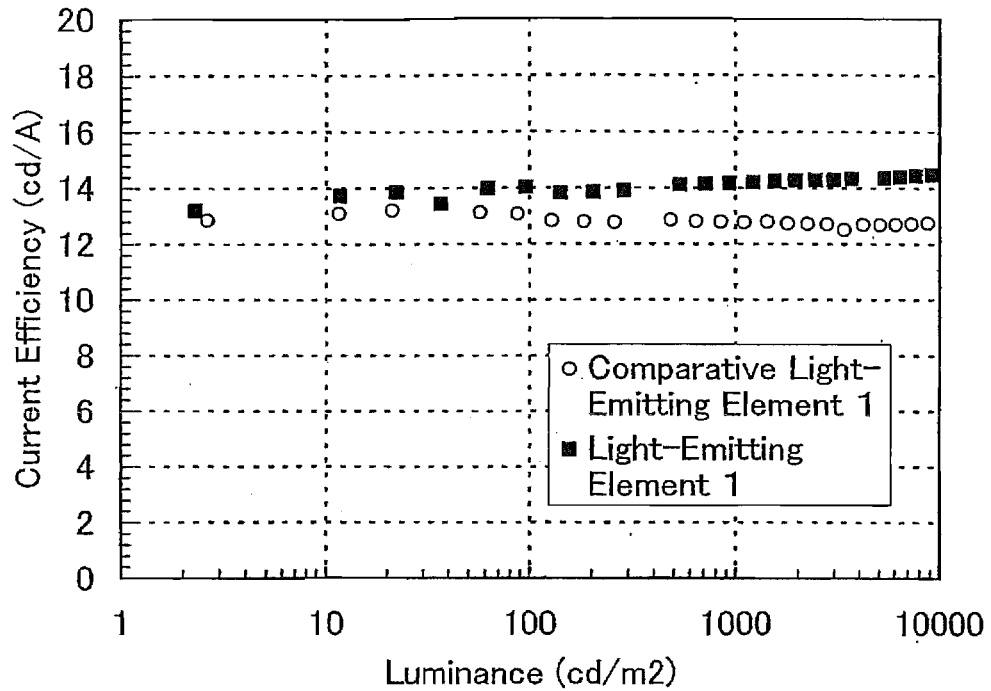
FIG. 8 shows a current efficiency-luminance characteristic of a light-emitting element.

Current-voltage characteristics of the light-emitting element 1 manufactured in Embodiment 3 and the comparative light-emitting element 1 manufactured in Comparative Example 2 are shown in FIG. 6. Moreover, luminance-voltage characteristics thereof are shown in FIG. 7. Further, current efficiency-luminance characteristics thereof are shown in FIG. 8.

In the light-emitting element 1, the voltage required to obtain a luminance of 1226 cd/m² was 5.6 V, at which current flowed for 0.35 mA (with a current density of 8.63 mA/cm²). Moreover, the current efficiency at this time was 14.2 cd/A. Meanwhile, in the comparative light-emitting element 1, the voltage required to obtain a luminance of 1096 cd/m² was 5.8 V, at which current flowed for 0.34 mA (with a current density of 8.57 mA/cm²). The current efficiency at this time was 12.8 cd/A.

The light-emitting element 1 and the comparative light-emitting element 1 have almost the same current-voltage characteristics. However, since the current efficiency-luminance characteristics of the light-emitting element 1 have improved, it is understood that the luminance-voltage characteristics have also improved. In other words, it is understood that the voltage required to obtain a certain luminance has decreased.

From the above results, it has been confirmed that luminous efficiency is improved by applying the present invention.

Embodiment 4

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the volume ratio between t-BuDNA and molybdenum oxide (VI) was adjusted so that molybdenum oxide was contained by 10 vol %. A co-evaporation method is an evaporation method by which evaporation is carried out from a plurality of evaporation sources at the same time within one process chamber.

Next, t-BuDNA was formed in 10 nm thick by an evaporation method using resistance heating so as to be in contact with the layer containing the composite material. The ionization potential of t-BuDNA was 5.55 eV.

By co-evaporating Alq and DPQd, a 40-nm-thick light-emitting layer was formed over t-BuDNA. Here, the weight ratio between Alq and DPQd was adjusted so as to be 1:0.005 Alq:DPQd). Thus, DPQd exists in such a state that DPQd disperses in a layer including Alq.

After that, BPhen was formed in 30 nm thick over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 2 was manufactured.

Comparative Example 3

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the volume ratio between t-BuDNA and molybdenum oxide (VI) was adjusted so that molybdenum oxide was contained by 10 vol %. A co-evaporation method is an evaporation method by which evaporation is carried out from a plurality of evaporation sources at the same time within one process chamber.

Next, NPB was formed in 10 nm thick by an evaporation method using resistance heating.

By co-evaporating Alq and DPQd, a 40-nm-thick light-emitting layer was formed over NPB. Here, the weight ratio between Alq and DPQd was adjusted so as to be 1:0.005 (=Alq:DPQd). Thus, DPQd exists in such a state that DPQd disperses in a layer including Alq.

After that, BPhen was formed in 30 nm thick over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a comparative light-emitting element 2 was manufactured.

Figure 9:
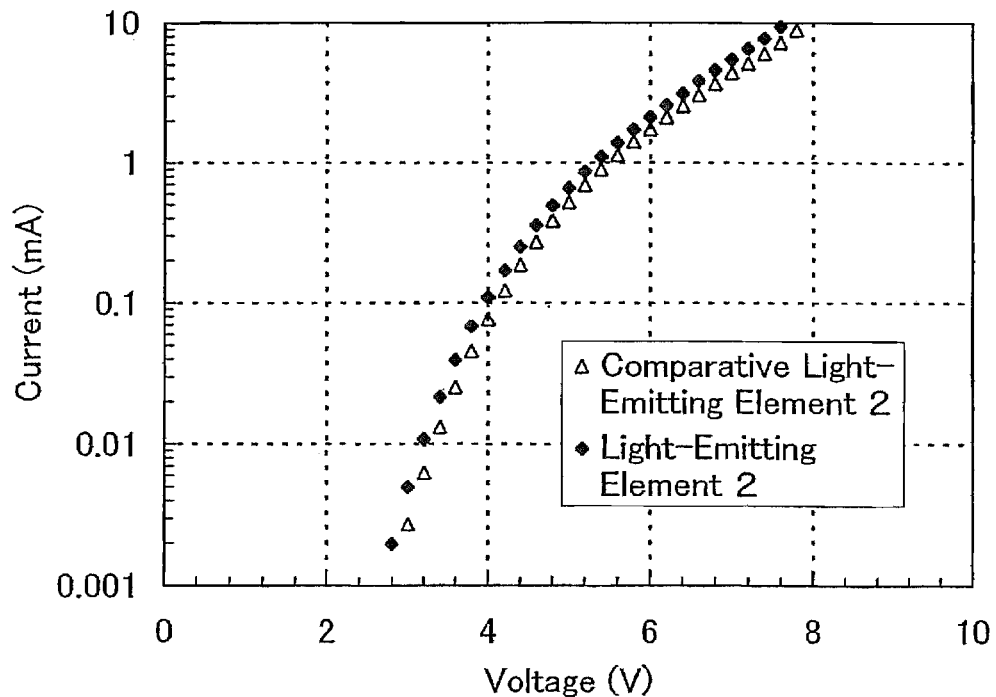
FIG. 9 shows a current-voltage characteristic of a light-emitting element.
Figure 10:
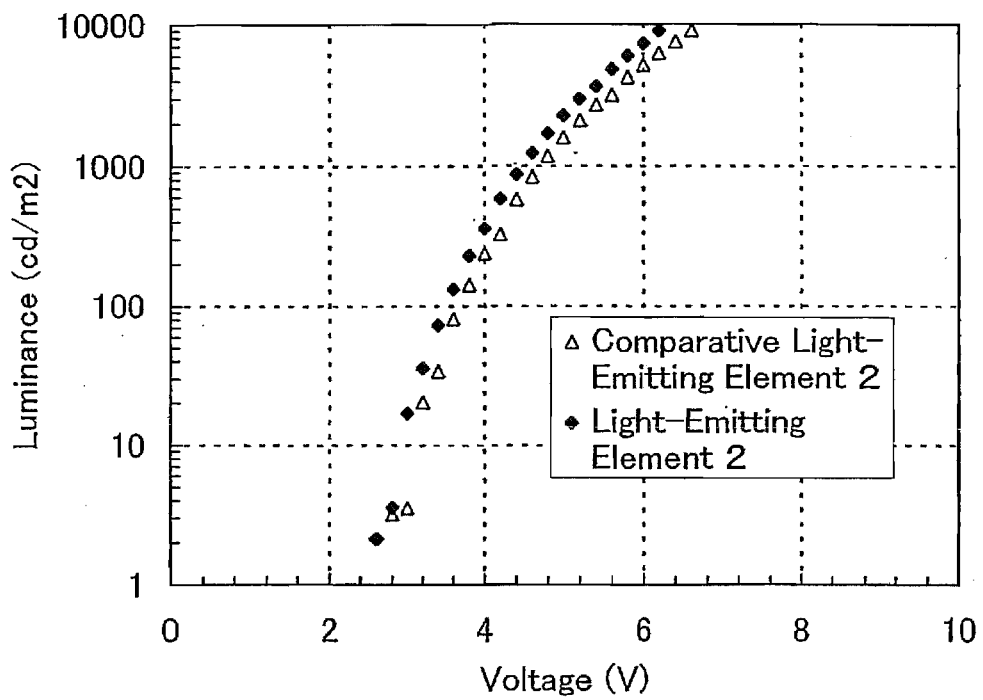
FIG. 10 shows a luminance-voltage characteristic of a light-emitting element.
Figure 11:
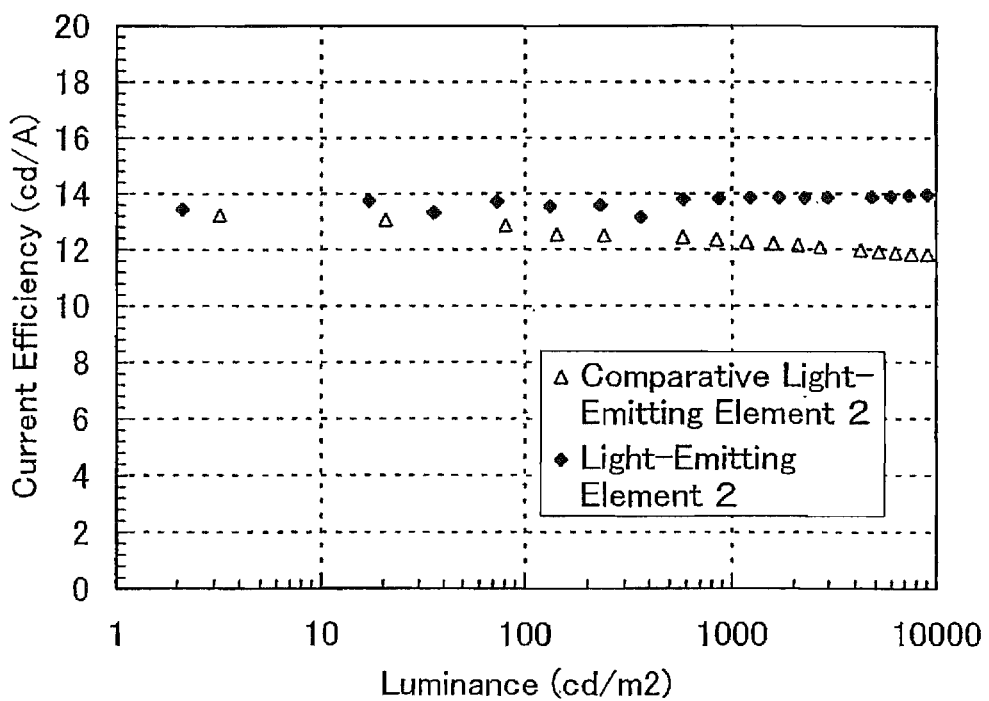
FIG. 11 shows a current efficiency-luminance characteristic of a light-emitting element.

Current-voltage characteristics of the light-emitting element 2 manufactured in Embodiment 4 and the comparative light-emitting element 2 manufactured in Comparative Example 3 are shown in FIG. 9. Moreover, luminance-voltage characteristics thereof are shown in FIG. 10. Further, current efficiency-luminance characteristics thereof are shown in FIG. 11.

In the light-emitting element 2, the voltage required to obtain a luminance of 1233 cd/m² was 4.6 V, at which current flowed for 0.36 mA (with a current density of 8.90 mA/cm²). Moreover, the current efficiency at this time was 13.9 cd/A. Meanwhile, in the comparative light-emitting element 2, the voltage required to obtain a luminance of 1179 cd/m² was 4.8 V, at which current flowed for 0.38 mA (with a current density of 9.59 mA/cm²). The current efficiency at this time was 12.3 cd/A.

The light-emitting element 2 and the comparative light-emitting element 2 have almost the same current-voltage characteristics. However, since the current efficiency-luminance characteristics of the light-emitting element 2 have improved, it is understood that the luminance-voltage characteristics have also improved. In other words, it is understood that the voltage required to obtain a certain luminance has decreased.

From the above results, it has been confirmed that luminous efficiency is improved by applying the present invention.

Embodiment 5

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the volume ratio between t-BuDNA and molybdenum oxide (VI) was adjusted so that molybdenum oxide was contained by 10 vol %. A co-evaporation method is an evaporation method by which evaporation is carried out from a plurality of evaporation sources at the same time within one process chamber.

Next, t-BuDBA was formed in 10 nm thick by an evaporation method using resistance heating so as to be in contact with the layer containing the composite material.

By co-evaporating Alq and DPQd further, a 40-nm-thick light-emitting layer was formed over t-BuDBA. Here, the weight ratio between Alq and DPQd was adjusted so as to be 1:0.005 (=Alq:DPQd). Thus, DPQd exists in such a state that DPQd disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 3 was manufactured.

Comparative Example 4

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the volume ratio between t-BuDNA and molybdenum oxide (VI) was adjusted so that molybdenum oxide was contained by 10 vol %. A co-evaporation method is an evaporation method by which evaporation is carried out from a plurality of evaporation sources at the same time within one process chamber.

Next, NPB was formed in 10 nm thick by an evaporation method using resistance heating.

By co-evaporating Alq and DPQd further, a 40-nm-thick light-emitting layer was formed over NPB. Here, the weight ratio between Alq and DPQd was adjusted so as to be 1:0.005 (=Alq:DPQd). Thus, DPQd exists in such a state that DPQd disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a comparative light-emitting element 3 was manufactured.

Figure 12:
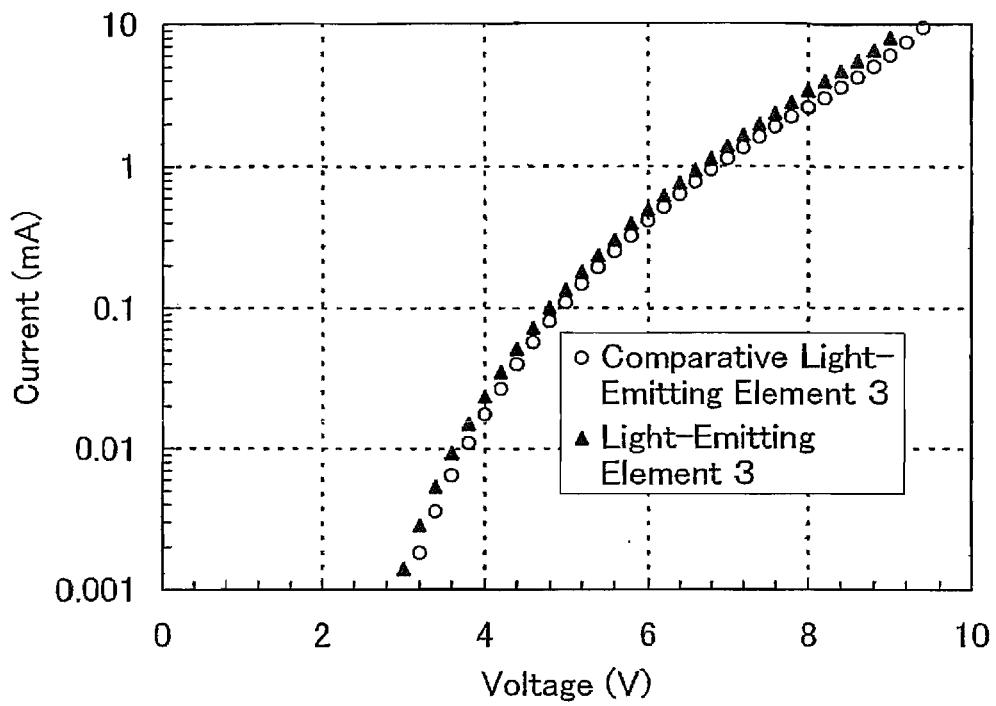
FIG. 12 shows a current-voltage characteristic of a light-emitting element.
Figure 13:
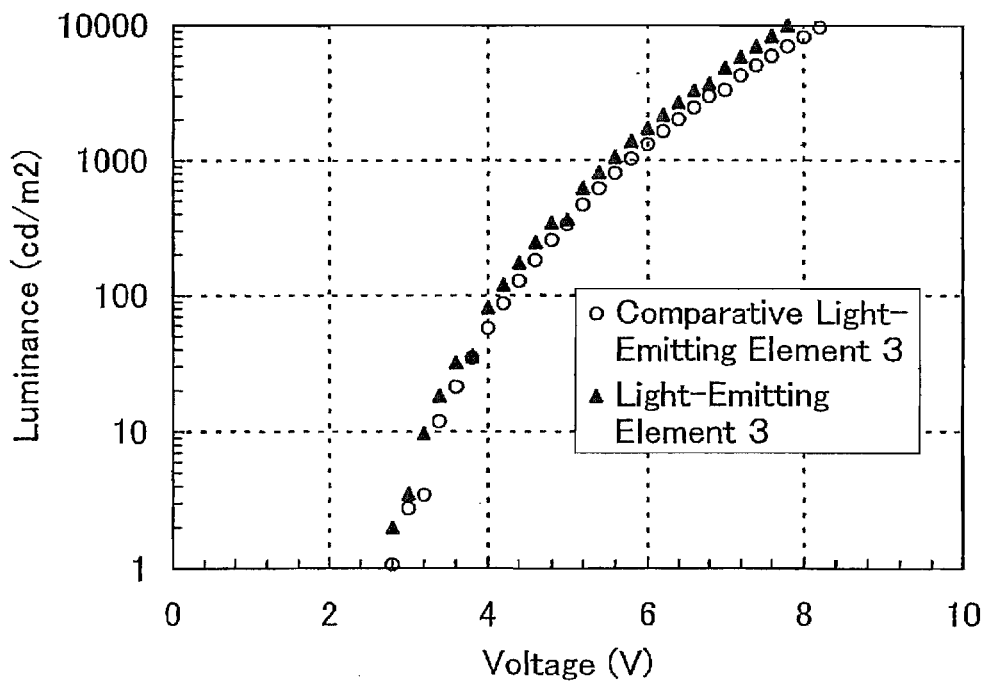
FIG. 13 shows a luminance-voltage characteristic of a light-emitting element.
Figure 14:
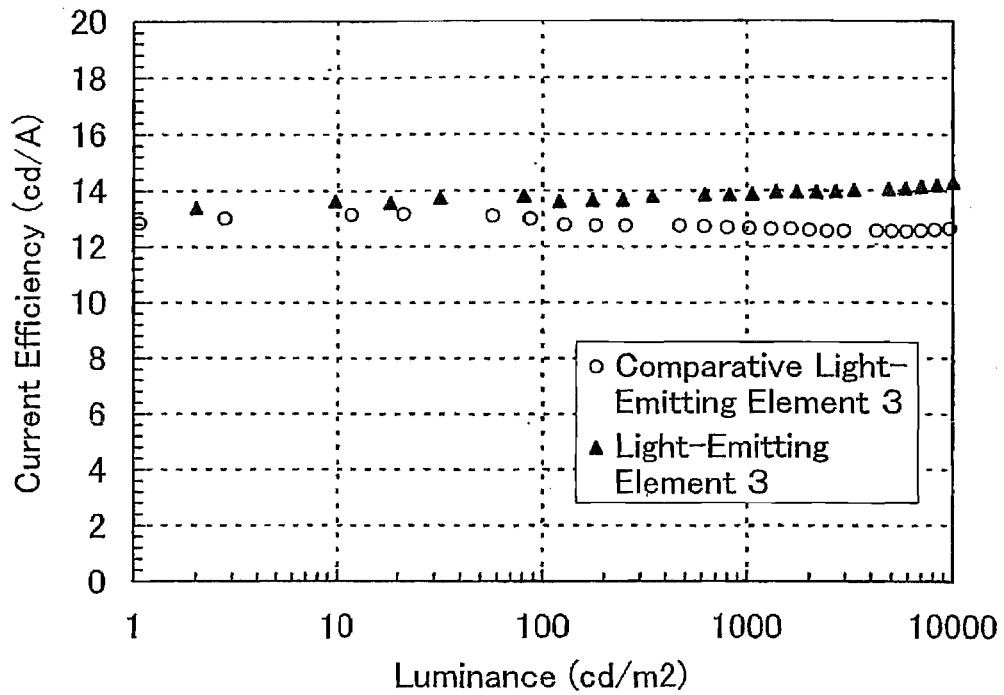
FIG. 14 shows a current efficiency-luminance characteristic of a light-emitting element.

Current-voltage characteristics of the light-emitting element 3 manufactured in Embodiment 5 and the comparative light-emitting element 3 manufactured in Comparative Example 4 are shown in FIG. 12. Moreover, luminance-voltage characteristics thereof are shown in FIG. 13. Further, current efficiency-luminance characteristics thereof are shown in FIG. 14.

In the light-emitting element 3, the voltage required to obtain a luminance of 1063 cd/m$^2$ was 5.6 V, at which current flowed for 0.31 mA (with a current density of 7.65 mA/cm$^2$). Moreover, the current efficiency at this time was 13.9 cd/A. Meanwhile, in the comparative light-emitting element 3, the voltage required to obtain a luminance of 1027 cd/m$^2$ was 5.8 V, at which current flowed for 0.32 mA (with a current density of 8.11 mA/cm$^2$). The current efficiency at this time was 12.7 cd/A.

The light-emitting element 3 and the comparative light-emitting element 3 have almost the same current-voltage characteristics. However, since the current efficiency-luminance characteristics of the light-emitting element 3 have improved, it is understood that the luminance-voltage characteristics have also improved. In other words, it is understood that the voltage required to obtain a certain luminance has decreased.

From the above results, it has been confirmed that luminous efficiency is improved by applying the present invention.

Embodiment 6

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDBA and molybdenum oxide (VI) were co-evaporated over the first electrode, thereby forming a layer containing a composite material. The film thickness was set to 50 nm, and the volume ratio between t-BuDBA and molybdenum oxide (VI) was adjusted so that molybdenum oxide was contained by 10 vol %. A co-evaporation method is an evaporation method by which evaporation is carried out from a plurality of evaporation sources at the same time within one process chamber.

Next, t-BuDBA was formed in 10 nm thick by an evaporation method using resistance heating so as to be in contact with the layer containing the composite material.

By co-evaporating Alq and DPQd, a 40-nm-thick light-emitting layer was formed over t-BuDBA. Here, the weight ratio between Alq and DPQd was adjusted so as to be 1:0.005 (=Alq:DPQd). Thus, DPQd exists in such a state that DPQd disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 4 was manufactured.

Comparative Example 5

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDBA and molybdenum oxide (VI) were co-evaporated over the first electrode, thereby forming a layer containing a composite material. The film thickness was set to 50 nm, and the volume ratio between t-BuDBA and molybdenum oxide (VI) was adjusted so that molybdenum oxide was contained by 10 vol %. A co-evaporation method is an evaporation method by which evaporation is carried out from a plurality of evaporation sources at the same time within one process chamber.

Next, NPB was formed in 10 nm thick by an evaporation method using resistance heating.

By co-evaporating Alq and DPQd, a 40-nm-thick light-emitting layer was formed over NPB. Here, the weight ratio between Alq and DPQd was adjusted so as to be 1:0.005 (=Alq:DPQd). Thus, DPQd exists in such a state that DPQd disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method using resistance heating, thereby forming a second electrode. Thus, a comparative light-emitting element 4 was manufactured.

Figure 15:
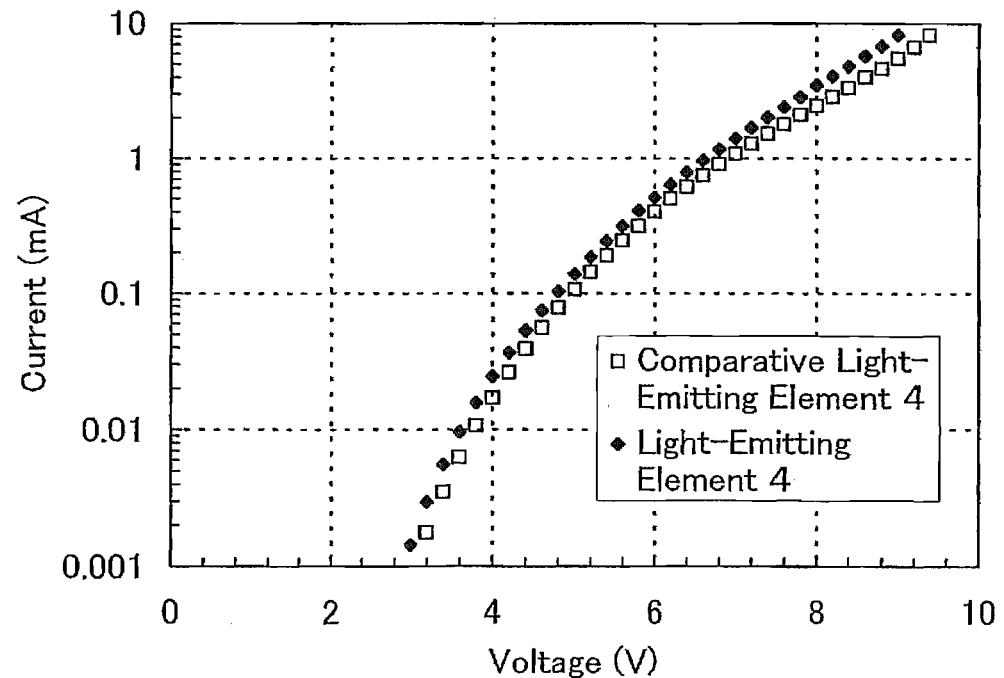
FIG. 15 shows a current-voltage characteristic of a light-emitting element.
Figure 16:
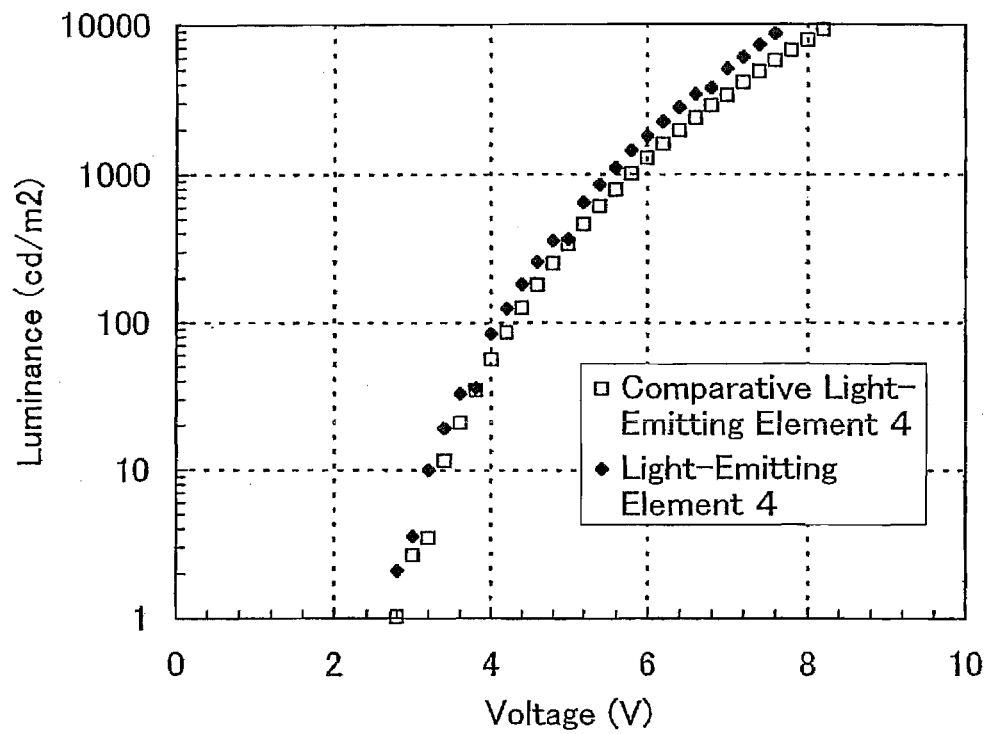
FIG. 16 shows a luminance-voltage characteristic of a light-emitting element.
Figure 17:
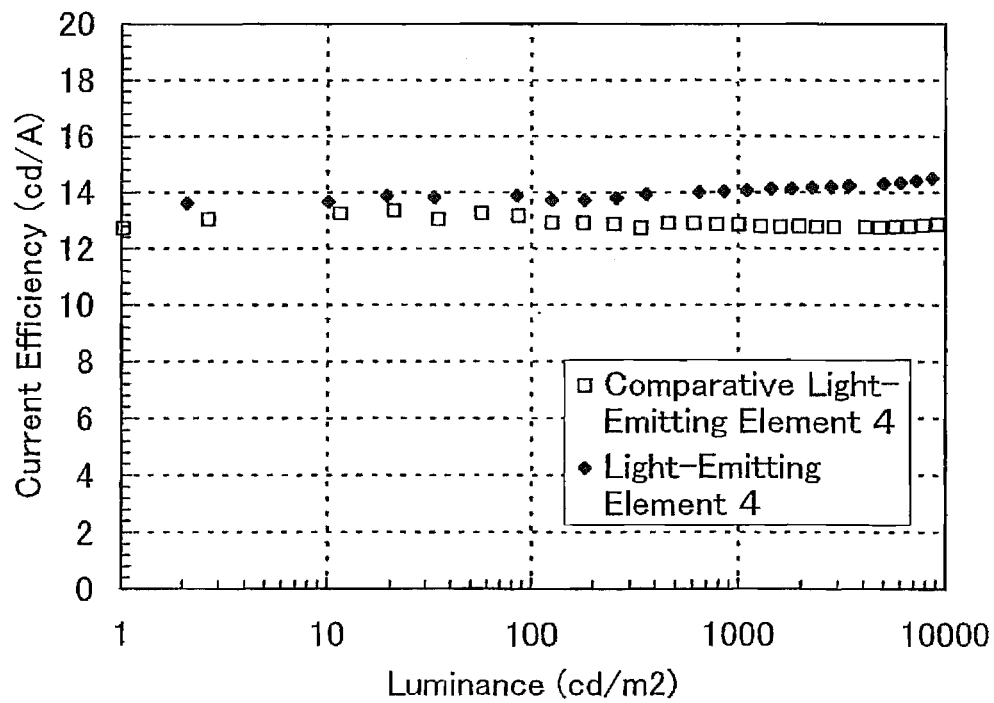
FIG. 17 shows a current efficiency-luminance characteristic of a light-emitting element.

Current-voltage characteristics of the light-emitting element 4 manufactured in Embodiment 6 and the comparative light-emitting element 4 manufactured in Comparative Example 5 are shown in FIG. 15. Moreover, luminance-voltage characteristics thereof are shown in FIG. 16. Further, current efficiency-luminance characteristics thereof are shown in FIG. 17.

In the light-emitting element 4, the voltage required to obtain a luminance of 1105 cd/m² was 5.6 V, at which current flowed for 0.31 mA (with a current density of 7.86 mA/cm²). Moreover, the current efficiency at this time was 14.1 cd/A. Meanwhile, in the comparative light-emitting element 4, the voltage required to obtain a luminance of 1010 cd/m² was 5.8 V, at which current flowed for 0.31 mA (with a current density of 7.87 mA/cm²). The current efficiency at this time was 12.8 cd/A.

The light-emitting element 4 and the comparative light-emitting element 4 have almost the same current-voltage characteristics. However, since the current efficiency-luminance characteristics of the light-emitting element 4 have improved, it is understood that the luminance-voltage characteristics have also improved. In other words, it is understood that the voltage required to obtain a certain luminance has decreased.

From the above results, it has been confirmed that luminous efficiency is improved by applying the present invention.

Embodiment 7

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the weight ratio between t-BuDNA and molybdenum oxide (VI) was adjusted to be 4:1 (=t-BuDNA:molybdenum oxide). A co-evaporation method is an evaporation method by which evaporation is carried out from a plurality of evaporation sources at the same time within one process chamber.

Next, t-BuDNA was formed in 10 nm thick by an evaporation method using resistance heating so as to be in contact with the layer containing the composite material. The ionization potential of t-BuDNA was 5.55 eV.

By co-evaporating Alq and coumarin 6 further, a 40-nm-thick light-emitting layer was formed over t-BuDNA. Here, the weight ratio between Alq and coumarin 6 was adjusted so as to be 4:0.04 (=Alq:coumarin 6). Thus, coumarin 6 exists in such a state that coumarin 6 disperses in a layer including Alq.

After that, Alq was formed in 30 nm thick over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 5 was manufactured.

Embodiment 8

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the weight ratio between t-BuDNA and molybdenum oxide (VI) was adjusted to be 4:1 (=t-BuDNA:molybdenum oxide). A co-evaporation method is an evaporation method by which evaporation is carried out from a plurality of evaporation sources at the same time within one process chamber. The ionization potential of t-BuDNA was 5.55 eV.

Next, DPPA was formed in 10 nm thick by an evaporation method using resistance heating so as to be in contact with the layer containing the composite material. The ionization potential of DPPA was 5.83 eV.

By co-evaporating Alq and coumarin 6, a 40-nm-thick light-emitting layer was formed over DPPA. Here, the weight ratio between Alq and coumarin 6 was adjusted so as to be 4:0.04 (=Alq:coumarin 6). Thus, coumarin 6 exists in such a state that coumarin 6 disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 6 was manufactured.

Comparative Example 6

First, indium tin oxide containing silicon oxide was formed over a glass substrate by a sputtering method, thereby forming a first electrode. The film thickness thereof was set to 110 nm with an electrode area of 2 mm×2 nm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the weight ratio between t-BuDNA and molybdenum oxide (VI) was adjusted to be 4:1 (=t-BuDNA:molybdenum oxide). A co-evaporation method is an evaporation method by which evaporation is carried out from a plurality of evaporation sources at the same time within one process chamber.

Next, NPB was formed in 10 nm thick by an evaporation method using resistance heating.

By co-evaporating Alq and coumarin 6 further, a 40-nm-thick light-emitting layer was formed over NPB. Here, the weight ratio between Alq and coumarin 6 was adjusted so as to be 4:0.04 (=Alq:coumarin 6). Thus, coumarin 6 exists in such a state that coumarin 6 disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a comparative light-emitting element 5 was manufactured.

Comparative Example 7

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the weight ratio between t-BuDNA and molybdenum oxide (VI) was adjusted to be 4:1 (=t-BuDNA:molybdenum oxide). A co-evaporation method is an evaporation method by which evaporation is carried out from a plurality of evaporation sources at the same time within one process chamber.

Next, 4,4'-bis[N-phenyl-N-(spirofluorene-2-yl)]biphenyl (abbreviation: BSPB) was formed in 10 nm thick by an evaporation method using resistance heating.

By co-evaporating Alq and coumarin 6, a 40-nm-thick light-emitting layer was formed over BSPB. Here, the weight ratio between Alq and coumarin 6 was adjusted so as to be 4:0.04 (=Alq:coumarin 6). Thus, coumarin 6 exists in such a state that coumarin 6 disperses in a layer including Alq.

After that, Alq was formed in 30 nm thick over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a comparative light-emitting element 6 was manufactured.

Figure 18:
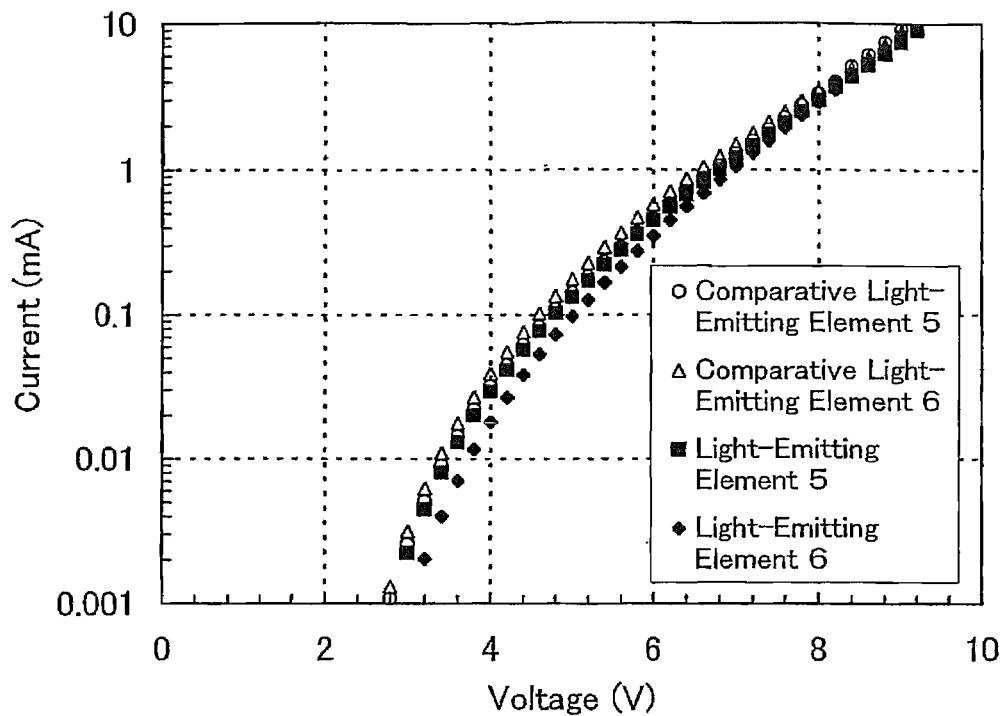
FIG. 18 shows a current-voltage characteristic of a light-emitting element.
Figure 19:
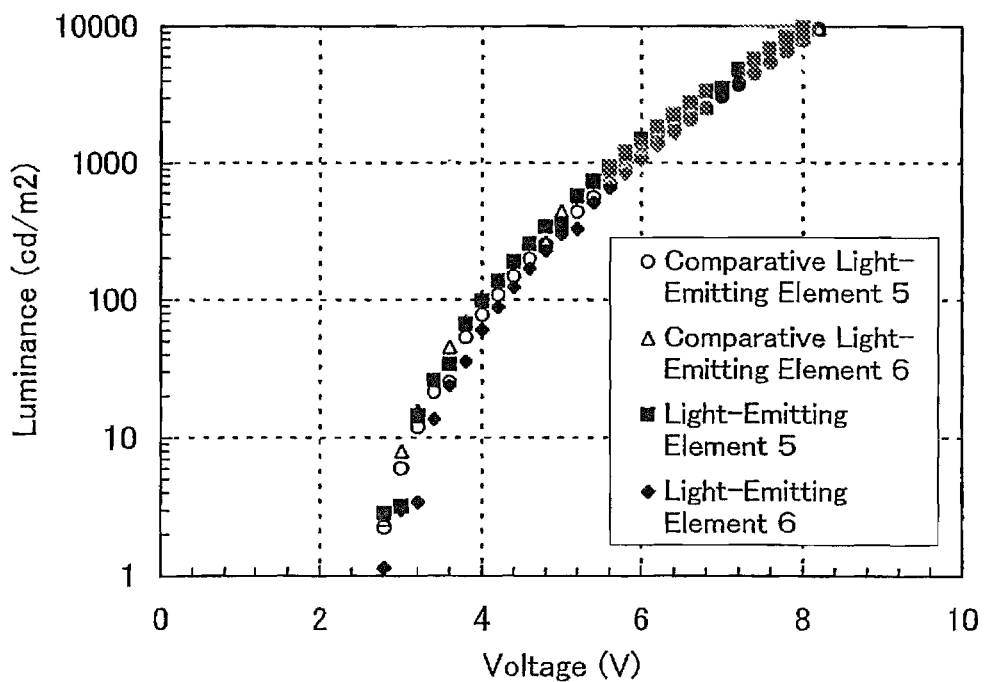
FIG. 19 shows a luminance-voltage characteristic of a light-emitting element.
Figure 20:
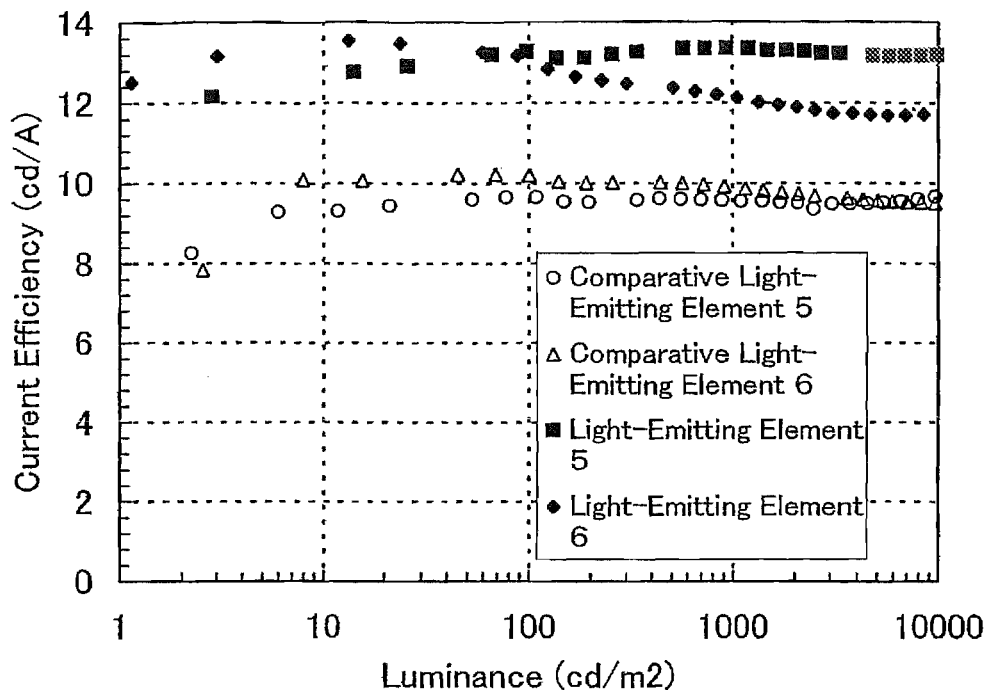
FIG. 20 shows a current efficiency-luminance characteristic of a light-emitting element.

Current-voltage characteristics of the light-emitting element 5 manufactured in Embodiment 7, the light-emitting element 6 manufactured in Embodiment 8, the comparative light-emitting element 5 manufactured in Comparative Example 6, and the comparative light-emitting element 6 manufactured in Comparative Example 7 are shown in FIG. 18. Moreover, luminance-voltage characteristics thereof are shown in FIG. 19. Further, current efficiency-luminance characteristics thereof are shown in FIG. 20.

In the light-emitting element 5, the voltage required to obtain a luminance of 1202 cd/m$^2$ was 5.8 V, at which current flowed for 0.36 mA (with a current density of 9.00 mA/cm$^2$). Moreover, the current efficiency at this time was 13.4 cd/A. Meanwhile, in the light-emitting element 6, the voltage required to obtain a luminance of 1057 cd/m$^2$ was 6.0 V, at which current flowed for 0.35 mA (with a current density of 8.72 mA/cm$^2$). The current efficiency at this time was 12.1 cd/A. On the other hand, in the comparative light-emitting element 5, the voltage required to obtain a luminance of 1103 cd/m$^2$ was 6.0 V, at which current flowed for 0.46 mA (with a current density of 11.54 mA/cm$^2$). Moreover, the current efficiency at this time was 9.6 cd/A. Meanwhile, in the comparative light-emitting element 6, the voltage required to obtain a luminance of 1159 cd/m$^2$ was 5.8 V, at which current flowed for 0.473 mA (with a current density of 11.74 mA/cm$^2$). The current efficiency at this time was 9.9 cd/A.

The light-emitting elements 5 and 6 have almost the same current-voltage characteristics as the comparative light-emitting elements 5 and 6. However, since the current efficiency-luminance characteristics of the light-emitting elements 5 and 6 have improved as compared with the comparative light-emitting elements 5 and 6, it is understood that the luminance-voltage characteristics have also improved. In other words, it is understood that the voltage required to obtain a certain luminance has decreased.

From the above results, it has been confirmed that luminous efficiency is improved by applying the present invention.

Embodiment 9

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then DNTPD and molybdenum oxide (VI) were co-evaporated over the first electrode, thereby forming a layer containing a composite material. The film thickness was set to 120 nm, and the weight ratio between DNTPD and molybdenum oxide (VI) was adjusted to be 1:0.67 (=DNTP-D:molybdenum oxide). A co-evaporation method is an evaporation method by which evaporation is carried out from a plurality of evaporation sources at the same time within one process chamber.

Next, DNTPD was formed in 5 nm thick by an evaporation method using resistance heating so as to be in contact with the layer containing the composite material.

Further, NPB was formed in 5 nm thick over DNTPD by an evaporation method using resistance heating.

Subsequently, by co-evaporating Alq and coumarin 6, a 40-nm-thick light-emitting layer was formed over NPB. Here, the weight ratio between Alq and coumarin 6 was adjusted so as to be 1:0.005 (=Alq:coumarin 6). Thus, coumarin 6 exists in such a state that coumarin 6 disperses in a layer including Alq.

After that, Alq was formed in 30 nm thick over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 7 was manufactured.

Comparative Example 8

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then DNTPD and molybdenum oxide (VI) were co-evaporated over the first electrode, thereby forming a layer containing a composite material. The film thickness was set to 120 nm, and the weight ratio between DNTPD and molybdenum oxide (VI) was adjusted to be 1:0.67 (=DNTP-D:molybdenum oxide). A co-evaporation method is an evaporation method by which evaporation is carried out from a plurality of evaporation sources at the same time within one process chamber.

Next, NPB was formed in 10 inn thick by an evaporation method using resistance heating.

By co-evaporating Alq and coumarin 6, a 40-nm-thick light-emitting layer was formed over NPB. Here, the weight ratio between Alq and coumarin 6 was adjusted so as to be 1:0.005 (=Alq:coumarin 6). Thus, coumarin 6 exists in such a state that coumarin 6 disperses in a layer including Alq.

After that, Alq was formed in 30 nm thick over the light-emitting layer by an evaporation method by resistance heating, thereby forming an electron-transporting layer.

Further, lithium fluoride was formed in 1 nm thick over the electron-transporting layer by an evaporation method using resistance heating, thereby forming an electron-injecting layer.

Finally, aluminum was formed in 200 nm thick over the electron-injecting layer by an evaporation method by resistance heating, thereby forming a second electrode. Thus, a comparative light-emitting element 7 was manufactured.

Figure 21:
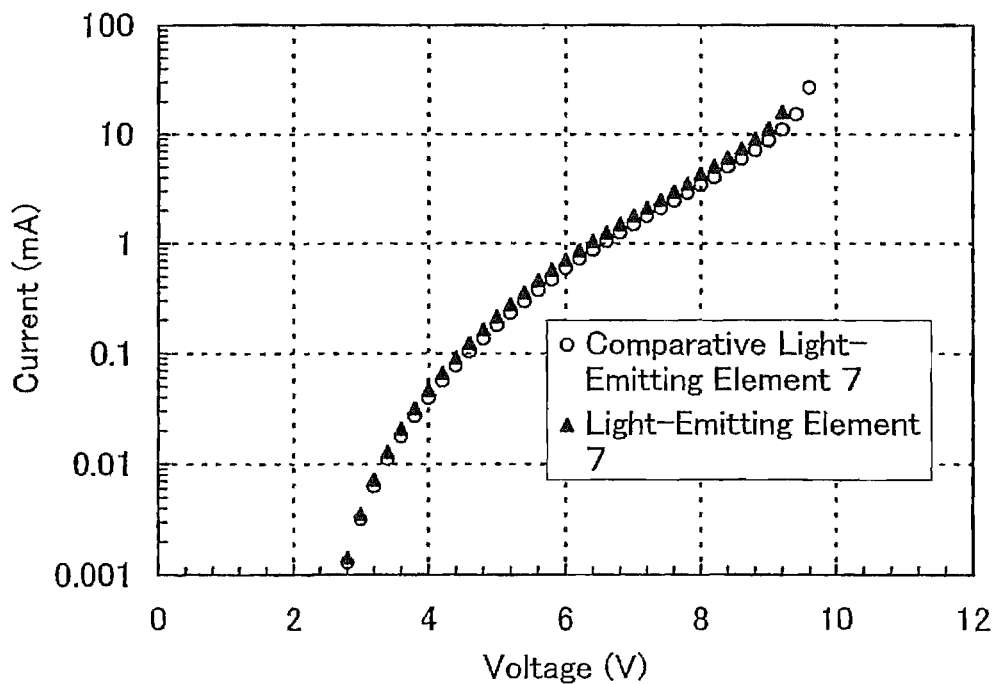
FIG. 21 shows a current-voltage characteristic of a light-emitting element.
Figure 22:
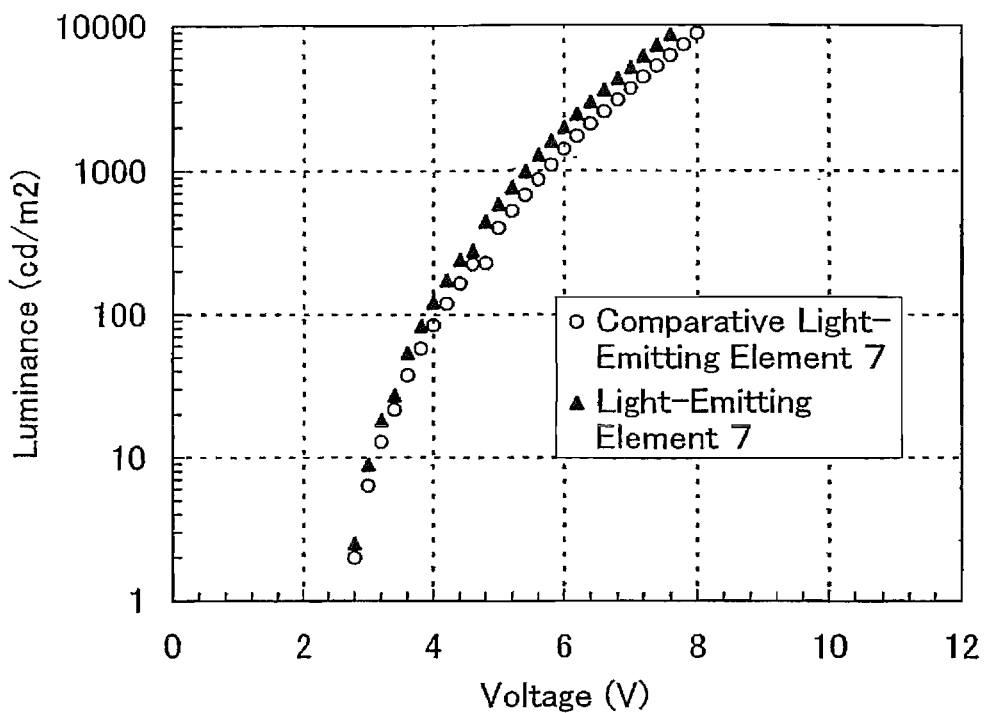
FIG. 22 shows a luminance-voltage characteristic of a light-emitting element.
Figure 23:
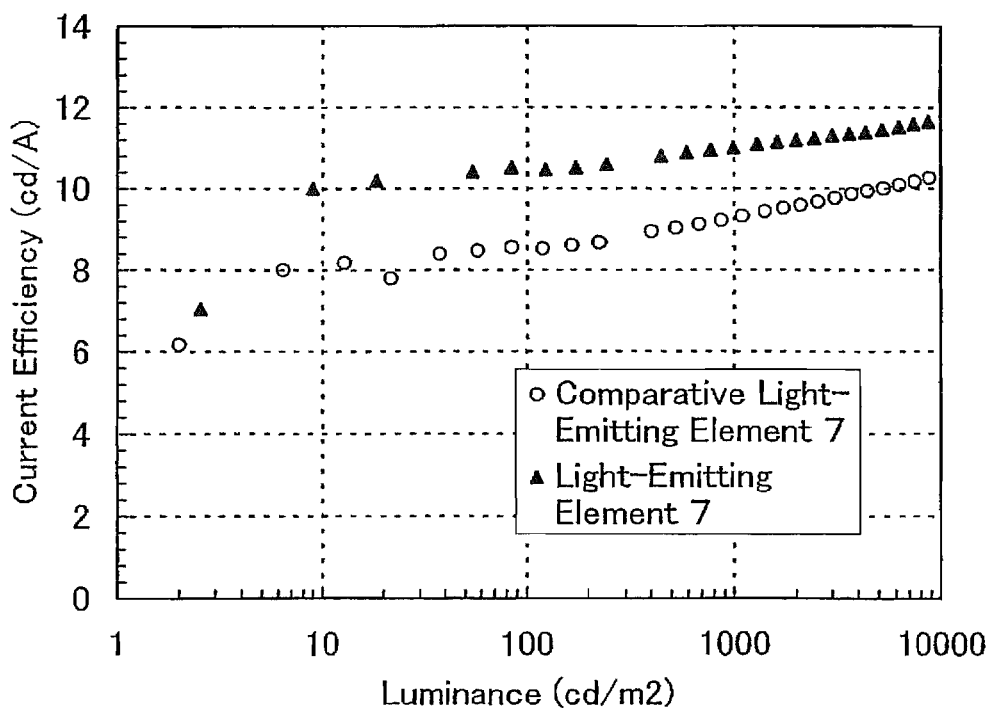
FIG. 23 shows a current efficiency-luminance characteristic of a light-emitting element.

Current-voltage characteristics of the light-emitting element 7 manufactured in Embodiment 9 and the comparative light-emitting element 7 manufactured in Comparative Example 8 are shown in FIG. 21. Moreover, luminance-voltage characteristics thereof are shown in FIG. 22. Further, current efficiency-luminance characteristics thereof are shown in FIG. 23.

In the light-emitting element 7, the voltage required to obtain a luminance of 1287 cd/m$^2$ was 5.6 V, at which current flowed for 0.46 mA (with a current density of 11.59 mA/cm$^2$). Moreover, the current efficiency at this time was 11.1 cd/A. Meanwhile, in the comparative light-emitting element 7, the voltage required to obtain a luminance of 1094 cd/m$^2$ was 5.8 V, at which current flowed for 0.47 mA (with a current density of 11.74 mA/cm$^2$). Moreover, the current efficiency at this time was 9.3 cd/A.

The light-emitting element 7 has almost the same current-voltage characteristics as the comparative light-emitting element 7. However, since the current efficiency-luminance characteristics of the light-emitting element 7 have improved, it is understood that the luminance-voltage characteristics have also improved. In other words, it is understood that the voltage required to obtain a certain luminance has decreased.

From the above results, it has been confirmed that luminous efficiency is improved by applying the present invention.

Embodiment 10

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 20 nm, and the volume ratio between t-BuDNA and molybdenum oxide (VI) was adjusted so that molybdenum oxide is contained by 10 vol %. A co-evaporation method is an evaporation method by which evaporation is carried out from a plurality of evaporation sources at the same time within one process chamber.

Next, t-BuDNA was formed in 10 nm thick by an evaporation method using resistance heating so as to be in contact with the layer containing the composite material.

Subsequently, by co-evaporating Alq and DPQd, a 40-nm-thick light-emitting layer was formed over t-BuDNA. Here, the weight ratio between Alq and DPQd was adjusted so as to be 1:0.005 (=Alq DPQd). Thus, DPQd exists in such a state that DPQd disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 8 was manufactured.

Comparative Example 9

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then NPB and molybdenum oxide (VI) were co-evaporated over the first electrode, thereby forming a layer containing a composite material. The film thickness was set to 20 nm, and the volume ratio between NPB and molybdenum oxide (VI) was adjusted so that molybdenum oxide is contained by 10 vol %. A co-evaporation method is an evaporation method by which evaporation is carried out from a plurality of evaporation sources at the same time within one process chamber.

Next, t-BuDNA was formed in 10 nm thick by an evaporation method using resistance heating.

By co-evaporating Alq and DPQd, a 40-nm-thick light-emitting layer was formed over t-BuDNA. Here, the weight ratio between Alq and DPQd was adjusted so as to be 1:0.005 (=Alq:DPQd). Thus, DPQd exists in such a state that DPQd disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a comparative light-emitting element 8 was manufactured.

Figure 24:
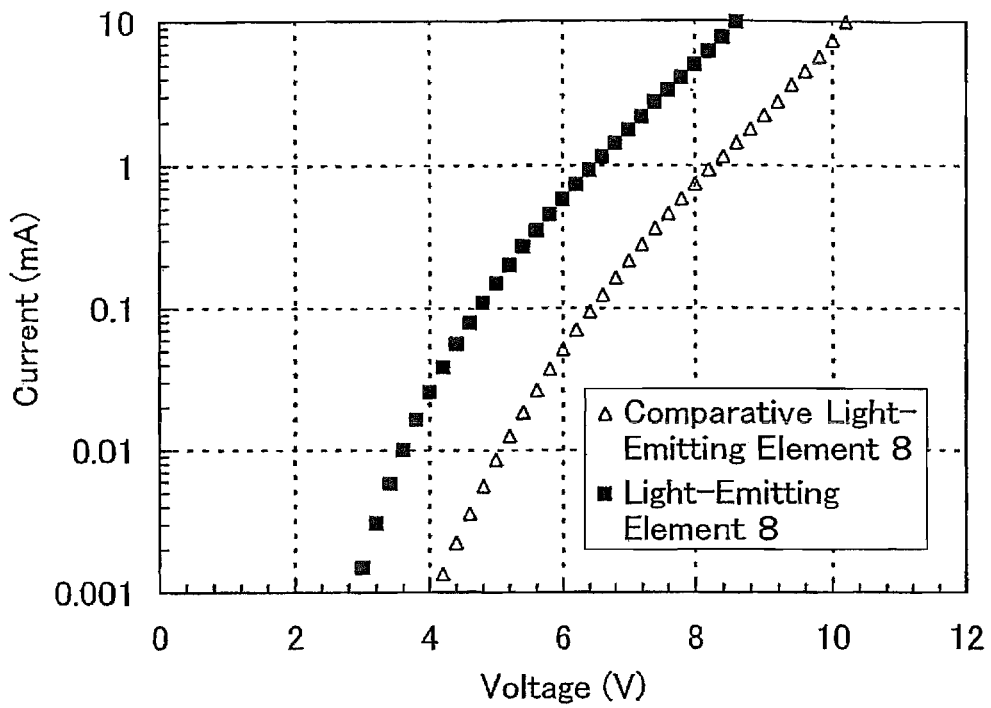
FIG. 24 shows a current-voltage characteristic of a light-emitting element.
Figure 25:
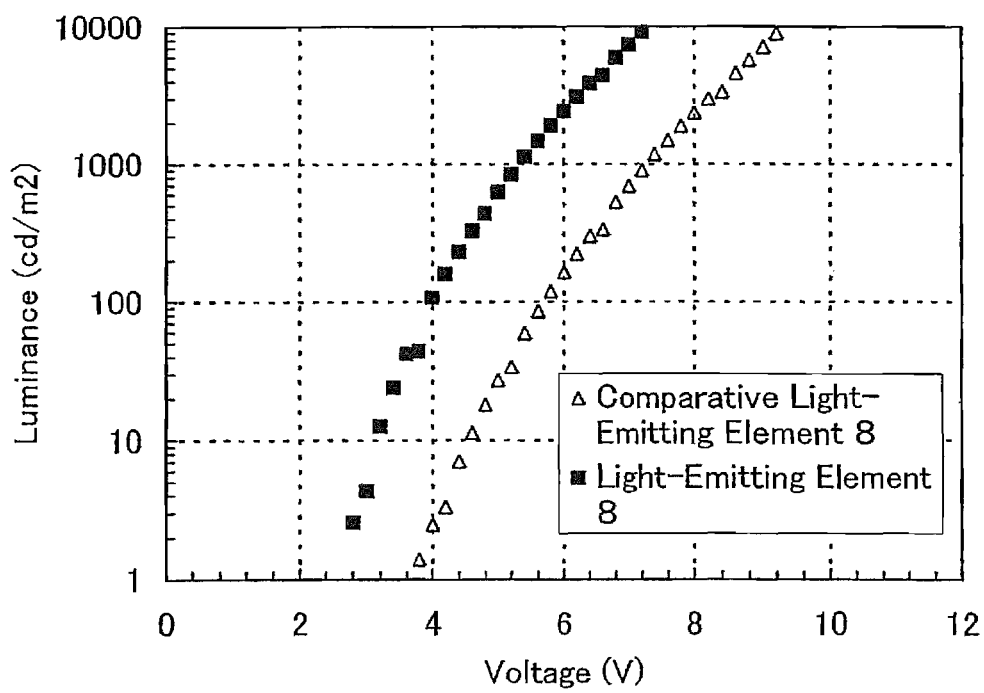
FIG. 25 shows a luminance-voltage characteristic of a light-emitting element.
Figure 26:
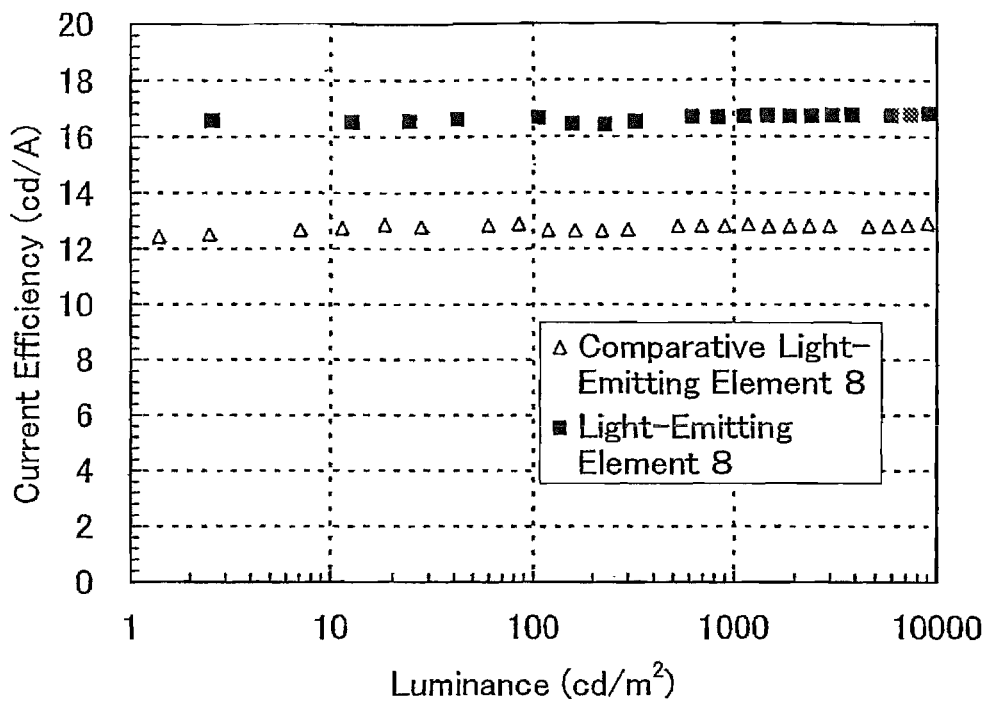
FIG. 26 shows a current efficiency-luminance characteristic of a light-emitting element.

Current-voltage characteristics of the light-emitting element 8 manufactured in Embodiment 10 and the comparative light-emitting element 8 manufactured in Comparative Example 9 are shown in FIG. 24. Moreover, luminance-voltage characteristics thereof are shown in FIG. 25. Further, current efficiency-luminance characteristics thereof are shown in FIG. 26.

In the light-emitting element 8, the voltage required to obtain a luminance of 1130 cd/m$^2$ was 5.4 V, at which current flowed for 0.27 mA (with a current density of 6.76 mA/cm$^2$). Moreover, the current efficiency at this time was 16.7 cd/A. Meanwhile, in the comparative light-emitting element 8, the voltage required to obtain a luminance of 1180 cd/m$^2$ was 7.4 V, at which current flowed for 0.37 mA (with a current density of 9.16 mA/cm$^2$). Moreover, the current efficiency at this time was 12.9 cd/A.

It is understood that the current-voltage characteristics of the light-emitting element 8 has improved as compared with the comparative light-emitting element 8, i.e., current easily flows. Moreover, the current efficiency-luminance characteristics of the light-emitting element 8 have improved as compared with the comparative light-emitting element 8, and it is understood that the luminance-voltage characteristics have also improved. In other words, it is understood that the voltage required to obtain a certain luminance has decreased.

The comparative light-emitting element 8 uses NPB as the organic compound contained in the layer containing the composite material, and uses t-BuDNA, which is aromatic hydrocarbon having high ionization potential, for the layer containing the organic compound provided so as to be in contact with the layer containing the composite material. In the comparative light-emitting element 8, since a carrier injection barrier between the layer containing the composite material and the layer containing the organic compound provided so as to be in contact with the layer containing the composite material is high, drive voltage is high. Moreover, since the layer containing the composite material in the comparative light-emitting element 8 has an absorption peak in a wavelength region of 450 to 800 nm, light emitted from a light-emitting region is partially absorbed in the layer containing the composite material.

Meanwhile, the light-emitting element 8 uses t-BuDNA, which is aromatic hydrocarbon having high ionization potential, as the first organic compound contained in the composite material. Therefore, it becomes possible to use t-BuDNA, which is aromatic hydrocarbon having high ionization potential, for the layer containing the second organic compound provided so as to be in contact with the layer containing the composite material. Moreover, since the layer containing the composite material uses the same organic compound as the layer provided so as to be in contact with the layer containing the composite material, the carrier injection barrier is low. Thus, the drive voltage of the light-emitting element can be decreased. Moreover, since the layer containing the composite material in the light-emitting element 8 does not have an absorption peak in a wavelength region of 450 to 800 nm, light emitted from the light-emitting region can be extracted to the outside effectively. Thus, luminous efficiency can be improved.

From the above results, it has been confirmed that the drive voltage of the light-emitting element can be decreased and luminous efficiency can be improved by applying the present invention.

Embodiment 11

This embodiment mode will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the volume ratio between t-BuDNA and molybdenum oxide (VI) was adjusted so that molybdenum oxide is contained by 10 vol %. A co-evaporation method is an evaporation method by which evaporation is carried out from a plurality of evaporation sources at the same time within one process chamber.

Next, t-BuDNA was formed in 10 nm thick by an evaporation method using resistance heating so as to be in contact with the layer containing the composite material.

Subsequently, by co-evaporating Alq and DPQd, a 40-nm-thick light-emitting layer was formed over t-BuDNA. Here, the weight ratio between Alq and DPQd was adjusted so as to be 1:0.005 (=Alq:DPQd). Thus, DPQd exists in such a state that DPQd disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 9 was manufactured.

Comparative Example 10

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then NPB and molybdenum oxide (VI) were co-evaporated over the first electrode, thereby forming a layer containing a composite material. The film thickness was set to 50 nm, and the volume ratio between NPB and molybdenum oxide (VI) was adjusted so that molybdenum oxide is contained by 10 vol %. A co-evaporation method is an evaporation method by which evaporation is carried out from a plurality of evaporation sources at the same time within one process chamber.

Next, t-BuDNA was formed in 10 nm thick by an evaporation method using resistance heating.

By co-evaporating Alq and DPQd, a 40-nm-thick light-emitting layer was formed over t-BuDNA. Here, the weight ratio between Alq and DPQd was adjusted so as to be 1:0.005 Alq:DPQd). Thus, DPQd exists in such a state that DPQd disperses in a layer including Alq.

After that, Alq was formed in 30 nm thick over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a comparative light-emitting element 9 was manufactured.

Figure 27:
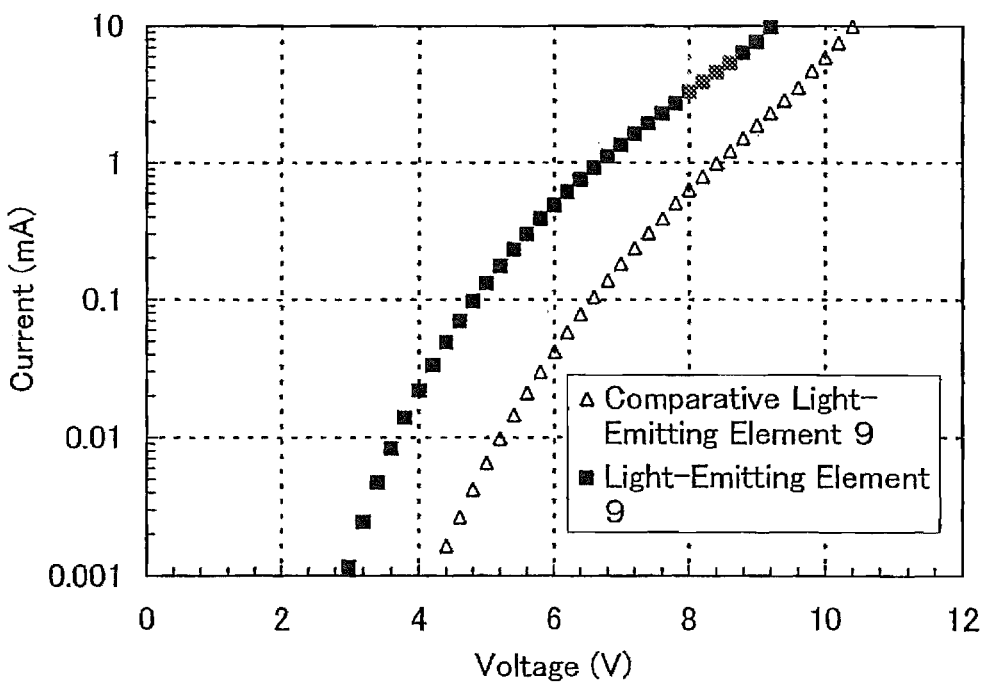
FIG. 27 shows a current-voltage characteristic of a light-emitting element.
Figure 28:
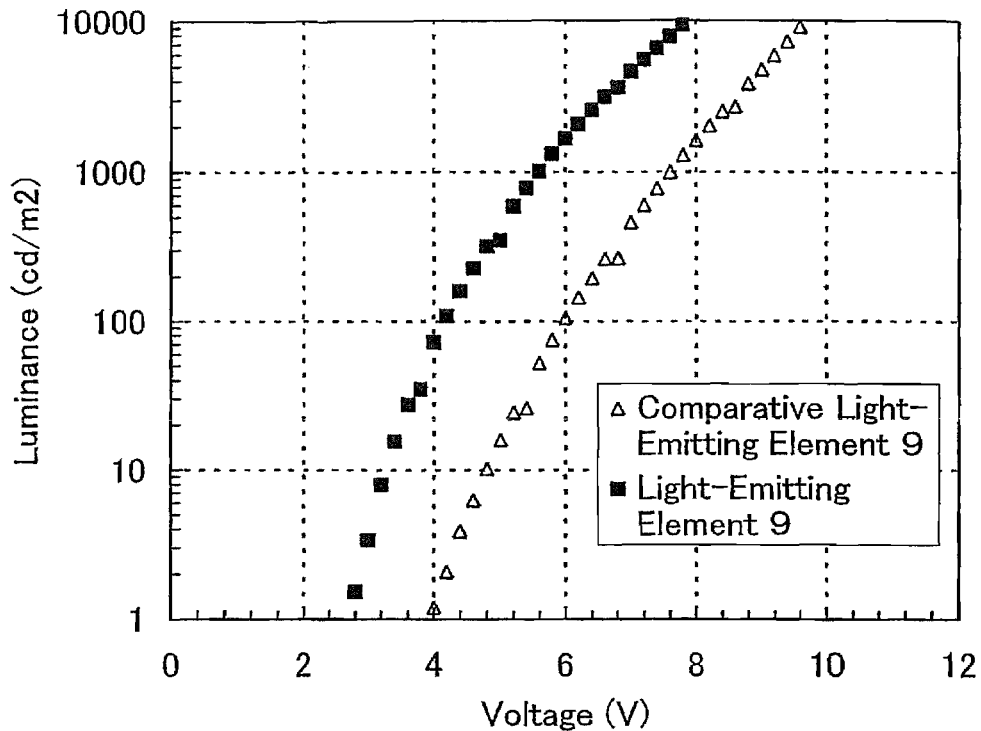
FIG. 28 shows a luminance-voltage characteristic of a light-emitting element.
Figure 29:
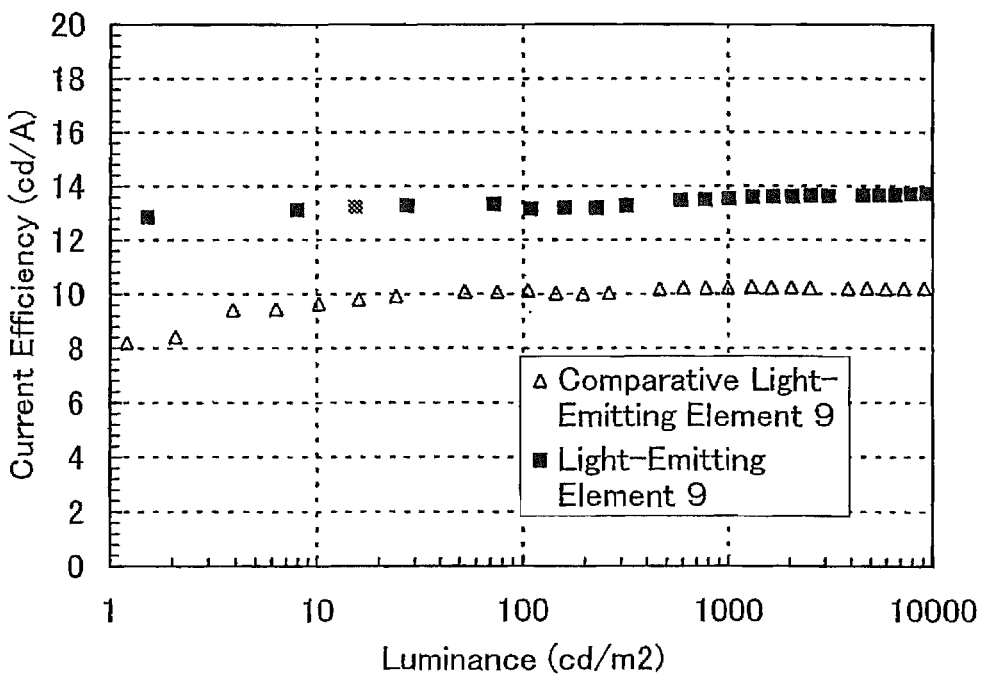
FIG. 29 shows a current efficiency-luminance characteristic of a light-emitting element.

Current-voltage characteristics of the light-emitting element 9 manufactured in Embodiment 11 and the comparative light-emitting element 9 manufactured in Comparative Example 10 are shown in FIG. 27. Moreover, luminance-voltage characteristics thereof are shown in FIG. 28. Further, current efficiency-luminance characteristics thereof are shown in FIG. 29.

In the light-emitting element 9, the voltage required to obtain a luminance of 1009 cd/m$^2$ was 5.6 V, at which current flowed for 0.30 mA (with a current density of 7.46 mA/cm$^2$). Moreover, the current efficiency at this time was 13.5 cd/A. Meanwhile, in the comparative light-emitting element 9, the voltage required to obtain a luminance of 1295 cd/m$^2$ was 7.8 V, at which current flowed for 0.50 mA (with a current density of 12.62 mA/cm$^2$). Moreover, the current efficiency at this time was 10.3 cd/A.

It is understood that the current-voltage characteristics of the light-emitting element 9 has improved as compared with the comparative light-emitting element 9, i.e., current easily flows. Moreover, the current efficiency-luminance characteristics of the light-emitting element 9 have improved as compared with the comparative light-emitting element 9, and it is understood that the luminance-voltage characteristics have also improved. In other words, it is understood that the voltage required to obtain a certain luminance has decreased.

The comparative light-emitting element 9 uses NPB as the organic compound contained in the layer containing the composite material, and uses t-BuDNA, which is aromatic hydrocarbon having high ionization potential, for the layer containing the organic compound provided so as to be in contact with the layer containing the composite material. In the comparative light-emitting element 9, since a carrier injection barrier between the layer containing the composite material and the layer containing the organic compound provided so as to be in contact with the layer containing the composite material is high, drive voltage is high. Moreover, since the layer containing the composite material in the comparative light-emitting element 9 has an absorption peak in a wavelength region of 450 to 800 nm, light emitted from a light-emitting region is partially absorbed in the layer containing the composite material.

Meanwhile, the light-emitting element 9 uses t-BuDNA, which is aromatic hydrocarbon having high ionization potential, as the first organic compound contained in the composite material. Therefore, it becomes possible to use t-BuDNA, which is aromatic hydrocarbon having high ionization potential, for the layer containing the second organic compound provided so as to be in contact with the layer containing the composite material. Moreover, since the layer containing the composite material uses the same organic compound as the layer provided so as to be in contact with the layer containing the composite material, the carrier injection barrier is low. Thus, the drive voltage of the light-emitting element can be decreased. Moreover, since the layer containing the composite material in the light-emitting element 9 does not have an absorption peak in a wavelength region of 450 to 800 nm, light emitted from the light-emitting region can be extracted to the outside effectively. Thus, luminous efficiency can be improved.

From the above results, it has been confirmed that the drive voltage of the light-emitting element can be decreased and luminous efficiency can be improved by applying the present invention.

Embodiment 12

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 150 nm, and the volume ratio between t-BuDNA and molybdenum oxide (VI) was adjusted so that molybdenum oxide is contained by 10 vol %. A co-evaporation method is an evaporation method by which evaporation is carried out from a plurality of evaporation sources at the same time within one process chamber.

Next, t-BuDNA was formed in 10 nm thick by an evaporation method using resistance heating so as to be in contact with the layer containing a composite material.

Subsequently, by co-evaporating Alq and DPQd, a 40-nm-thick light-emitting layer was formed over t-BuDNA. Here, the weight ratio between Alq and DPQd was adjusted so as to be 1:0.005 (=Alq:DPQd). Thus, DPQd exists in such a state that DPQd disperses in a layer including Alq.

After that, Alq was formed to have a thickness of 30 nm over the light-emitting layer by an evaporation method by resistance heating, thereby forming an electron-transporting layer.

Further, lithium fluoride was formed in 1 nm thick over the electron-transporting layer by an evaporation method by resistance heating, thereby forming an electron-injecting layer.

Finally, aluminum was formed in 200 nm thick over the electron-injecting layer by an evaporation method by resistance heating, thereby forming a second electrode. Thus, a light-emitting element 10 was manufactured.

Comparative Example 11

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then NPB and molybdenum oxide (VI) were co-evaporated over the first electrode, thereby forming a layer containing a composite material. The film thickness was set to 150 nm, and the volume ratio between NPB and molybdenum oxide (VI) was adjusted so that molybdenum oxide is contained by 10 vol %. A co-evaporation method is an evaporation method by which evaporation is carried out from a plurality of evaporation sources at the same time within one process chamber.

Next, t-BuDNA was formed in 10 nm thick by an evaporation method using resistance heating.

By co-evaporating Alq and DPQd, a 40-nm-thick light-emitting layer was formed over t-BuDNA. Here, the weight ratio between Alq and DPQd was adjusted so as to be 1:0.005 (=Alq:DPQd). Thus, DPQd exists in such a state that DPQd disperses in a layer including Alq.

After that, Alq was formed in 30 nm thick over the light-emitting layer by an evaporation method by resistance heating, thereby forming an electron-transporting layer.

Further, lithium fluoride was formed in 1 nm thick over the electron-transporting layer by an evaporation method using resistance heating, thereby forming an electron-injecting layer.

Finally, aluminum was formed in 200 nm thick over the electron-injecting layer by an evaporation method by resistance heating, thereby forming a second electrode. Thus, a comparative light-emitting element 10 was manufactured.

Figure 30:
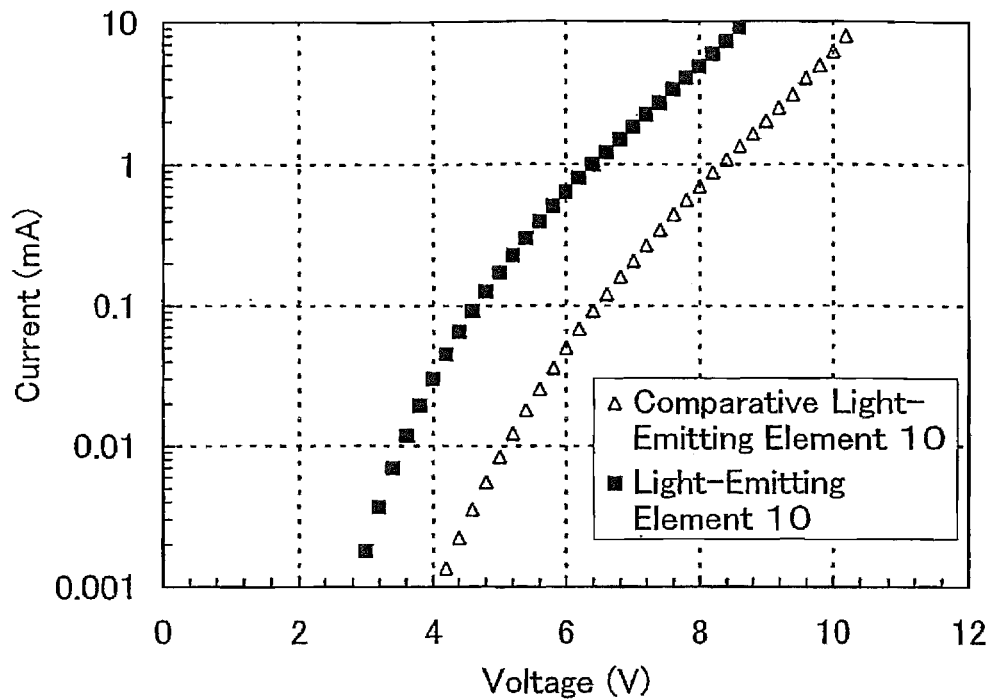
FIG. 30 shows a current-voltage characteristic of a light-emitting element.
Figure 31:
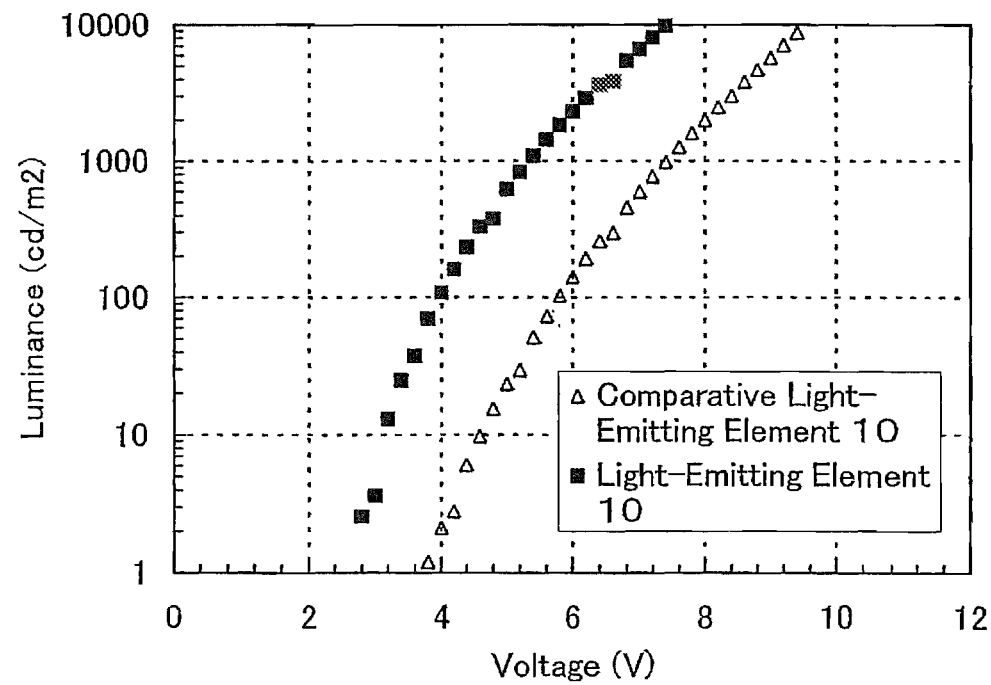
FIG. 31 shows a luminance-voltage characteristic of a light-emitting element.
Figure 32:
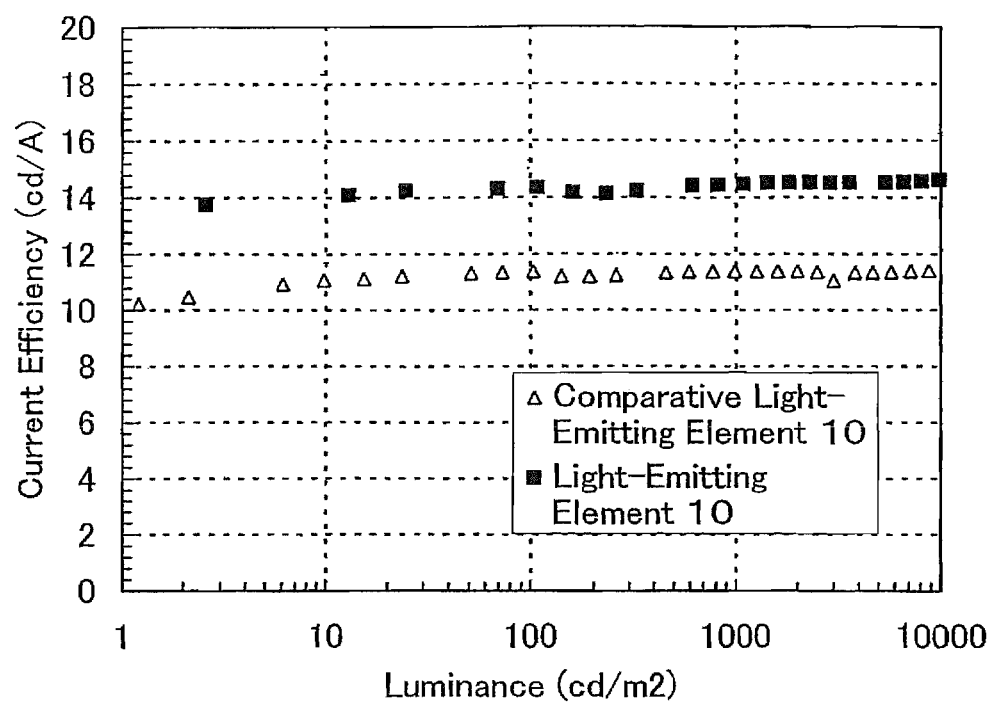
FIG. 32 shows a current efficiency-luminance characteristic of a light-emitting element.

Current-voltage characteristics of the light-emitting element 10 manufactured in Embodiment 12 and the comparative light-emitting element 10 manufactured in Comparative Example 11 are shown in FIG. 30. Moreover, luminance-voltage characteristics thereof are shown in FIG. 31. Further, current efficiency-luminance characteristics thereof are shown in FIG. 32.

In the light-emitting element 10, the voltage required to obtain a luminance of 1087 cd/m$^2$ was 5.4 V, at which current flowed for 0.30 mA (with a current density of 7.51 mA/cm$^2$). Moreover, the current efficiency at this time was 14.5 cd/A. Meanwhile, in the comparative light-emitting element 10, the voltage required to obtain a luminance of 1272 cd/m$^2$ was 7.6 V, at which current flowed for 0.45 mA (with a current density of 11.17 mA/cm$^2$). Moreover, the current efficiency at this time was 11.4 cd/A.

It is understood that the current-voltage characteristics of the light-emitting element 10 has improved as compared with the comparative light-emitting element 10, i.e., current easily flows. Moreover, the current efficiency-luminance characteristics of the light-emitting element 10 have improved as compared with the comparative light-emitting element 10, and it is understood that the luminance-voltage characteristics have also improved. In other words, it is understood that the voltage required to obtain a certain luminance has decreased.

The comparative light-emitting element 10 uses NPB as the organic compound contained in the layer containing the composite material, and uses t-BuDNA, which is aromatic hydrocarbon having high ionization potential, for the layer containing the organic compound provided so as to be in contact with the layer containing the composite material. In the comparative light-emitting element 10, since a carrier injection barrier between the layer containing the composite material and the layer containing the organic compound provided so as to be in contact with the layer containing the composite material is high, drive voltage is high. Moreover, since the layer containing the composite material in the comparative light-emitting element 10 has an absorption peak in a wavelength region of 450 to 800 nm, light emitted from a light-emitting region is partially absorbed in the layer containing the composite material.

Meanwhile, the light-emitting element 10 uses t-BuDNA, which is aromatic hydrocarbon having high ionization potential, as the first organic compound contained in the composite material. Therefore, it becomes possible to use t-BuDNA, which is aromatic hydrocarbon having high ionization potential, for the layer containing the second organic compound provided so as to be in contact with the layer containing the composite material. Moreover, since the layer containing the composite material uses the same organic compound as the layer provided so as to be in contact with the layer containing the composite material, the carrier injection barrier is low. Thus, the drive voltage of the light-emitting element can be decreased. Moreover, since the layer containing the composite material in the light-emitting element 10 does not have an absorption peak in a wavelength region of 450 to 800 nm, light emitted from the light-emitting region can be extracted to the outside effectively. Thus, luminous efficiency can be improved.

From the above results, it has been confirmed that the drive voltage of the light-emitting element can be decreased and luminous efficiency can be improved by applying the present invention.

Embodiment 13

This embodiment will describe a light-emitting element of the present invention more specifically.

First, indium tin oxide containing silicon oxide was formed over a glass substrate by a sputtering method, thereby forming a first electrode. The film thickness thereof was set to 110 nm with an electrode area of 2 mm×2 mm.

Next, the substrate where the first electrode was formed was fixed at a substrate holder provided in a vacuum evaporation apparatus so that a surface of the substrate at which the first electrode was formed faces downward. After that, the vacuum apparatus was evacuated to reduce pressure to be about $10^{-4}$ Pa, and then t-BuDNA and molybdenum oxide (VI) were co-evaporated over the first electrode, thereby forming a layer containing a composite material. The film thickness was set to 50 nm, and the weight ratio between t-BuDNA and molybdenum oxide (VI) was adjusted to be 4:1 (=t-BuDNA:molybdenum oxide). A co-evaporation method is an evaporation method by which evaporation is carried out from a plurality of evaporation sources at the same time within one process chamber.

Next, t-BuDNA was formed in 10 nm thick by an evaporation method using resistance heating so as to be in contact with the layer containing the composite material.

Subsequently, by co-evaporating 9-[4-(N-carbazolyl)]phenyl-10-phenylanthracene (abbreviation: CzPA) and 9-(4-{N-[4-(9-carbazolyl)phenyl]-N-phenylamino}phenyl)-10-phenylanthracene (abbreviation: YGAPA), a 30-nm-thick light-emitting layer was formed over t-BuDNA. Here, the weight ratio between CzPA and YGAPA was adjusted so as to be 4:0.16 (=CzPA:YGAPA).

After that, BPhen was formed in 5 nm thick and Alq was formed in 30 nm thick, over the light-emitting layer by an evaporation method by resistance heating, thereby forming an electron-transporting layer.

Further, lithium fluoride was formed in 1 nm thick over the electron-transporting layer by an evaporation method using resistance heating, thereby forming an electron-injecting layer.

Finally, aluminum was formed in 200 nm thick over the electron-injecting layer by an evaporation method by resistance heating, thereby forming a second electrode. Thus, a light-emitting element 11 was manufactured.

Figure 39:
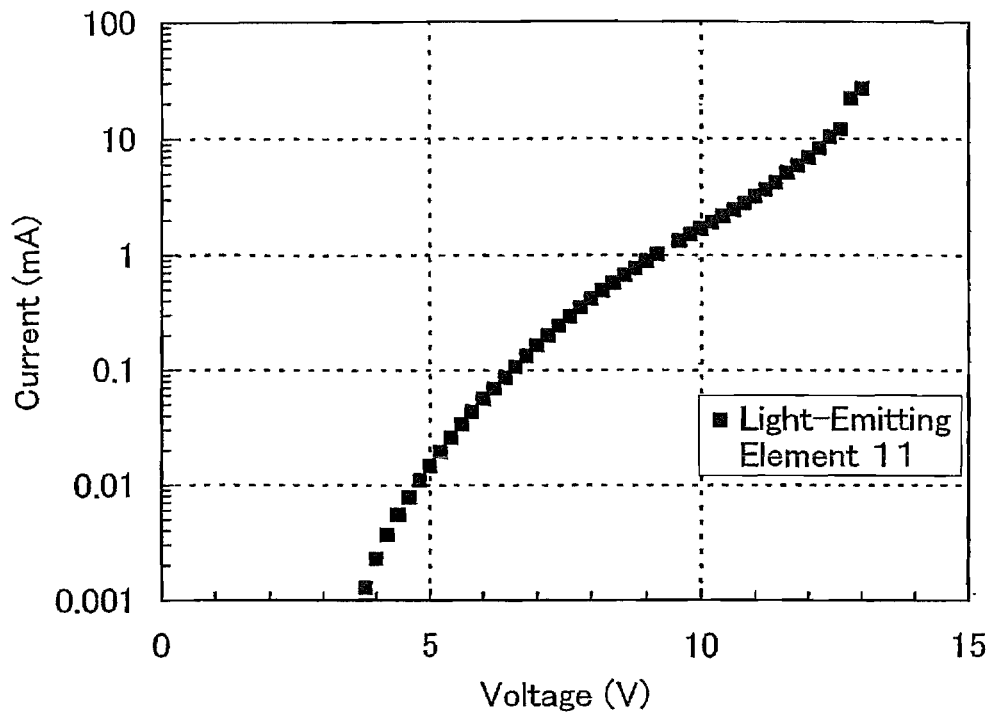
FIG. 39 shows a current-voltage characteristic of a light-emitting element.
Figure 40:
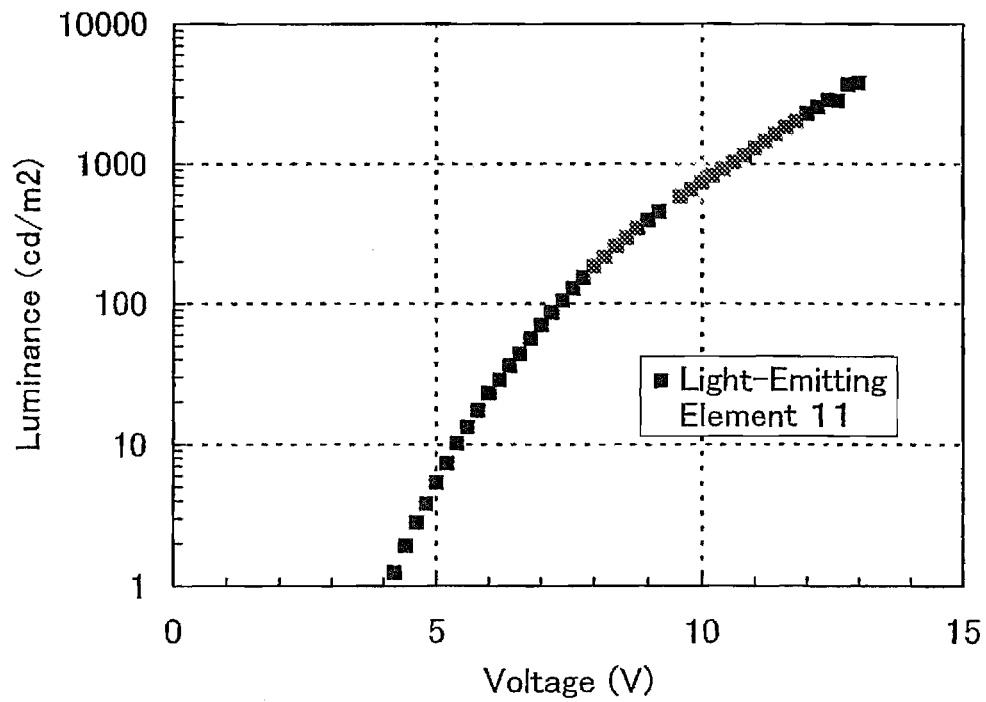
FIG. 40 shows a luminance-voltage characteristic of a light-emitting element.
Figure 41:
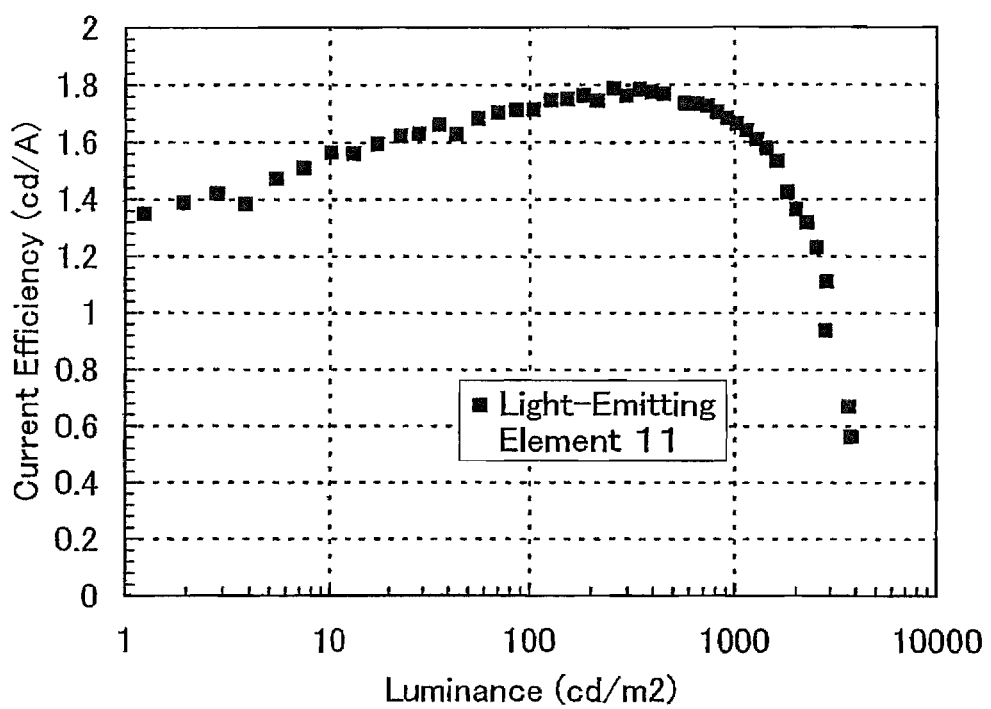
FIG. 41 shows a current efficiency-luminance characteristic of a light-emitting element.

Current-voltage characteristics of the light-emitting element 11 manufactured in Embodiment 13 are shown in FIG. 39. Moreover, luminance-voltage characteristics thereof are shown in FIG. 40. Further, current efficiency-luminance characteristics thereof are shown in FIG. 41.

In the light-emitting element 11, the voltage required to obtain a luminance of 1023 cd/m² was 10.6 V, at which current flowed for 2.46 mA (with a current density of 61.5 mA/cm²). Moreover, at this time, the current efficiency was 1.66 cd/A and the CIE chromaticity was (x, y=0.16, 0.13), and blue light emission was obtained.

The light-emitting element 11 uses t-BuDNA, which is aromatic hydrocarbon having high ionization potential, as the first organic compound contained in the composite material. Therefore, it becomes possible to use t-BuDNA, which is aromatic hydrocarbon having high ionization potential, for the layer containing the second organic compound provided so as to be in contact with the layer containing the composite material. Moreover, since the layer containing the composite material uses the same organic compound as the layer provided so as to be in contact with the layer containing the composite material, the carrier injection barrier is low. Thus, the drive voltage of the light-emitting element can be decreased. Moreover, since the layer containing the composite material in the light-emitting element 11 does not have an absorption peak in a wavelength region of 450 to 800 nm, light emitted from the light-emitting, region can be extracted to the outside effectively. Thus, luminous efficiency can be improved.

From the above results, it has been confirmed that the drive voltage of the light-emitting element can be decreased and luminous efficiency can be improved by applying the present invention.

This application is based on Japanese Patent Application serial no. 2005-213759 filed in Japan Patent Office on Jul. 25, 2005 and Japanese Patent Application serial no. 2005-230272 filed in Japan Patent Office on Aug. 9, 2005, the entire contents of which are hereby incorporated by reference.

What is claimed is:

1. A light-emitting device comprising a light-emitting element, the light-emitting element comprising:
    a first electrode;
    a first layer comprising a first organic compound and an inorganic compound over the first electrode, wherein the first organic compound is aromatic hydrocarbon not containing nitrogen;
    a second layer comprising a second organic compound over the first layer; and
    a second electrode over the second layer,
    wherein the first layer has a transmittance of 80% or higher per 100 nm in thickness in a wavelength region of 450 to 800 nm.

2. The light-emitting device according to claim 1, wherein the inorganic compound is any of vanadium oxide, niobium oxide, tantalum oxide, chromium oxide, molybdenum oxide, tungsten oxide, manganese oxide, and rhenium oxide.

3. The light-emitting device according to claim 1, wherein the second organic compound is same as the first organic compound.

4. The light-emitting device according to claim 1, wherein an ionizing potential Ip (1) of the first organic compound and an ionizing potential Ip (2) of the second organic compound satisfy:

$$Ip(2) \leq Ip(1) + 0.5 \text{ eV}.$$

5. The light-emitting device according to claim 1, wherein the second organic compound is selected from aromatic hydrocarbon, an anthracene derivative, and a carbazole derivative.

6. The light-emitting device according to claim 1, further comprising at least one module selected from a Flexible Printed Circuit, a Tape Automated Bonding tape, a Tape Carrier Package, an Integrated Circuit, a speaker portion, a video input terminal, a keyboard, an external connection port, a pointing mouse, an audio input portion, an audio output portion, an operation key, an antenna, a remote control receiving portion, an image receiving portion, a battery, and an eyepiece portion.

7. An electronic appliance comprising the light-emitting device according to claim 1.

8. An illumination device comprising the light-emitting device according to claim 1.

9. A light-emitting device comprising a light-emitting element, the light-emitting element comprising:
   a first electrode;
   a first layer comprising a first organic compound and an inorganic compound over the first electrode, wherein the first organic compound is aromatic hydrocarbon not containing nitrogen;
   a second layer comprising a second organic compound over and in contact with the first layer; and
   a second electrode over the second layer,
   wherein a composite material is formed at an interface between the first layer and the second layer,
   wherein the composite material comprises the second organic compound and the inorganic compound,
   wherein the composite material has a transmittance of 80% or higher per 100 nm in thickness in a wavelength region of 450 to 800 nm.

10. The light-emitting device according to claim 9, wherein the inorganic compound is any of vanadium oxide, niobium oxide, tantalum oxide, chromium oxide, molybdenum oxide, tungsten oxide, manganese oxide, and rhenium oxide.

11. The light-emitting device according to claim 9, wherein the second organic compound is same as the first organic compound.

12. The light-emitting device according to claim 9, wherein an ionizing potential Ip (1) of the first organic compound and an ionizing potential Ip (2) of the second organic compound satisfy:

$Ip(2) \leq Ip(1)+0.5$ eV.

13. The light-emitting device according to claim 9, wherein the second organic compound is selected from aromatic hydrocarbon, an anthracene derivative, and a carbazole derivative.

14. The light-emitting device according to claim 9, further comprising at least one module selected from a Flexible Printed Circuit, a Tape Automated Bonding tape, a Tape Carrier Package, an Integrated Circuit, a speaker portion, a video input terminal, a keyboard, an external connection port, a pointing mouse, an audio input portion, an audio output portion, an operation key, an antenna, a remote control receiving portion, an image receiving portion, a battery, and an eyepiece portion.

15. An electronic appliance comprising the light-emitting device according to claim 9.

16. An illumination device comprising the light-emitting device according to claim 9.

* * * * *